(12) United States Patent
Nishi

(10) Patent No.: US 6,765,647 B1
(45) Date of Patent: Jul. 20, 2004

(54) EXPOSURE METHOD AND DEVICE

(75) Inventor: Kenji Nishi, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/856,051

(22) PCT Filed: Nov. 12, 1999

(86) PCT No.: PCT/JP99/06319

§ 371 (c)(1),
(2), (4) Date: May 17, 2001

(87) PCT Pub. No.: WO00/30163

PCT Pub. Date: May 25, 2000

(30) Foreign Application Priority Data

Nov. 18, 1998 (JP) .......................... 10-327651
Dec. 24, 1998 (JP) .......................... 10-366513

(51) Int. Cl.⁷ .................. G03B 27/52; G03B 27/42; G03B 27/32; A61N 5/00
(52) U.S. Cl. .................. 355/55; 355/53; 355/67; 355/71; 355/75; 355/77; 359/513; 250/492.2; 250/492.22
(58) Field of Search .............. 355/55, 53, 67, 355/71, 75, 77; 359/513; 250/492.2, 492.22

(56) References Cited

U.S. PATENT DOCUMENTS

| | | | |
|---|---|---|---|
| 5,137,349 A | * | 8/1992 | Taniguchi et al. |
| 5,204,711 A | * | 4/1993 | Takubo et al. |
| 5,448,332 A | | 9/1995 | Sakakibara et al. |
| 5,483,056 A | * | 1/1996 | Imai |
| 5,541,776 A | | 7/1996 | Kobayashi et al. |
| 5,559,584 A | | 9/1996 | Miyaji et al. |
| 5,574,537 A | * | 11/1996 | Ozawa |
| 5,661,546 A | | 8/1997 | Taniguchi |
| 5,693,439 A | | 12/1997 | Tanaka et al. |
| 5,696,623 A | | 12/1997 | Fujie et al. |
| 5,717,483 A | | 2/1998 | Kikuchi |
| 5,861,944 A | | 1/1999 | Nishi |
| 5,985,495 A | | 11/1999 | Okumura et al. |
| 6,008,885 A | * | 12/1999 | Takahashi et al. |
| 6,219,368 B1 | | 4/2001 | Govorkov |
| 6,235,438 B1 | | 5/2001 | Suzuki et al. |
| 6,333,775 B1 | | 12/2001 | Haney et al. |
| 6,388,733 B1 | | 5/2002 | Hayashi |
| 6,441,884 B1 | | 8/2002 | Takahashi et al. |
| 6,522,384 B2 | | 2/2003 | Miwa |

FOREIGN PATENT DOCUMENTS

| | | |
|---|---|---|
| EP | 1 075 017 A1 | 2/2001 |
| JP | A 64-37837 | 2/1989 |
| JP | A 2-210813 | 8/1990 |
| JP | A 6-283403 | 10/1994 |
| JP | A 7-153660 | 6/1995 |
| JP | A 7-201702 | 8/1995 |
| JP | A 8-279459 | 10/1996 |
| JP | A 9-260252 | 10/1997 |
| JP | A 9-283421 | 10/1997 |
| JP | A 10-256143 | 9/1998 |
| WO | WO00/25352 | 5/2000 |

* cited by examiner

Primary Examiner—Frank G. Font
Assistant Examiner—Khaled Brown
(74) Attorney, Agent, or Firm—Oliff & Berridge PLC

(57) ABSTRACT

An exposure method, wherein a defocus quantity on the surface of a substrate to be exposed with respect to an image plane of a projection optical system is detected highly accurately even during exposing without lowering throughput much and focusing is made with an automatic focusing method. A first oblique-incident AF sensor including an illumination slit unit (54a) through an optical member (63a) and a second oblique-incident AF sensor including an illumination slit unit (54b) through an optical member (63b) are used to apply slit images (F1f, F2f) onto common measuring points and focus positions are measured respectively. One half of the difference between the two measured values is regarded as a drift and the drift is corrected for values measured by the AF sensors; the first or second AF sensor is then used to perform a focusing by the automatic focusing method.

30 Claims, 23 Drawing Sheets

Fig.12
(a) 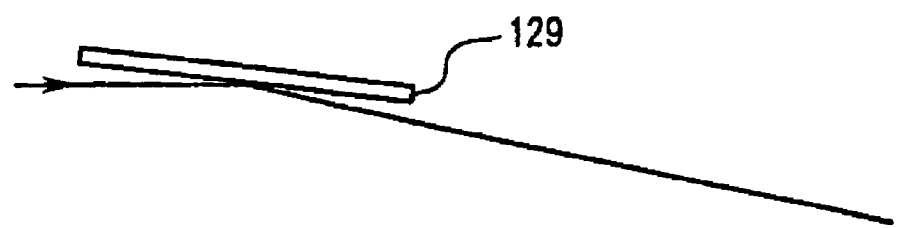
(b) 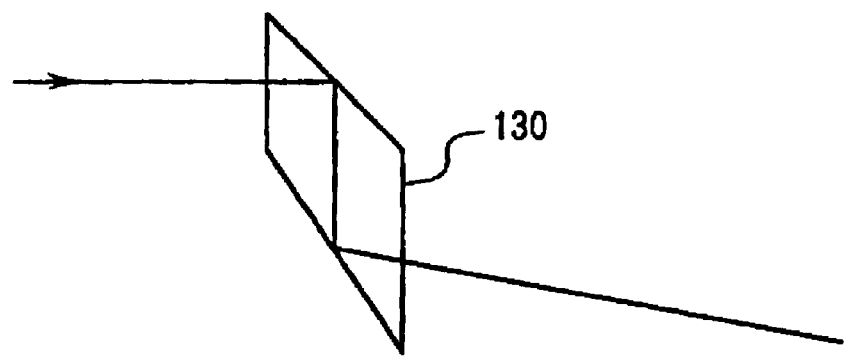
(c) 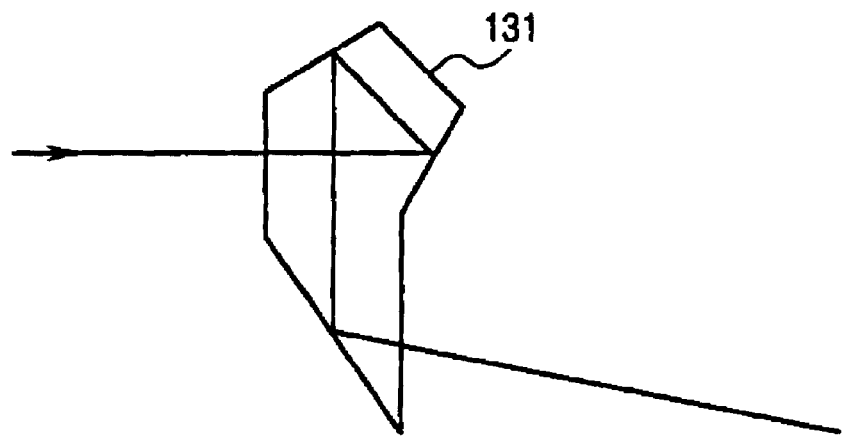

Fig.14
(a)
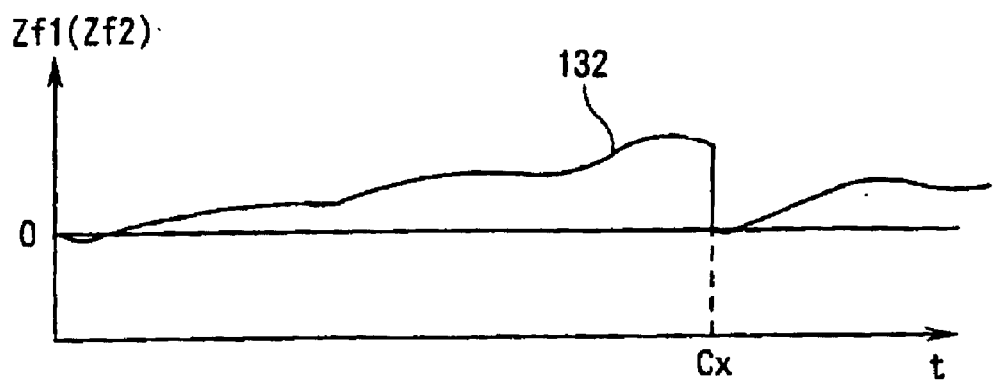
(b)
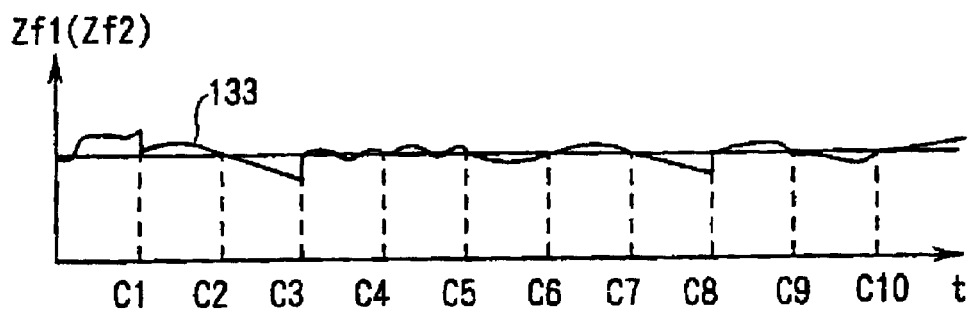
(c)
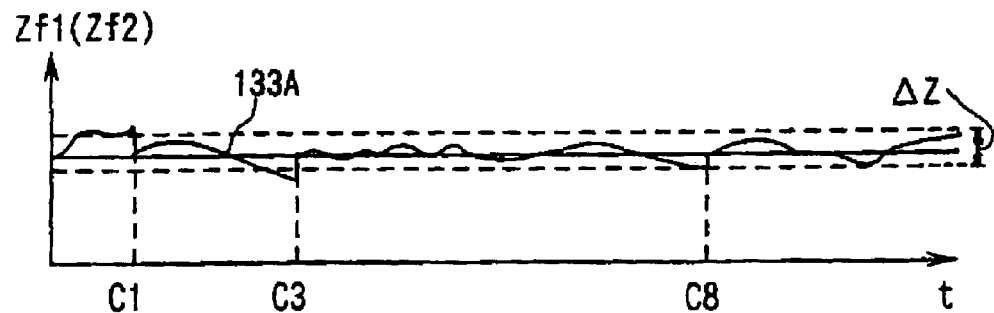

Fig.15
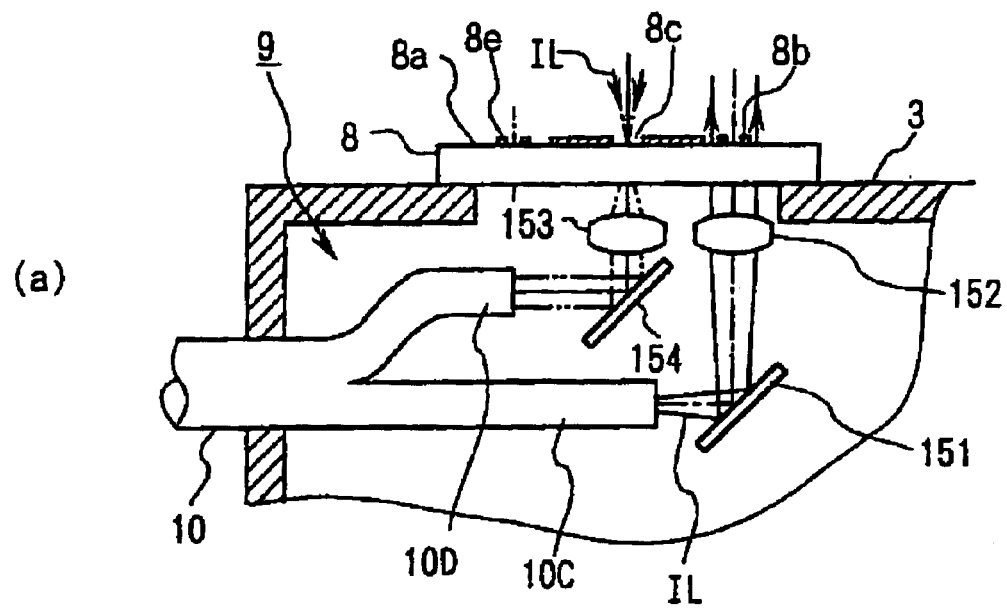
(a)
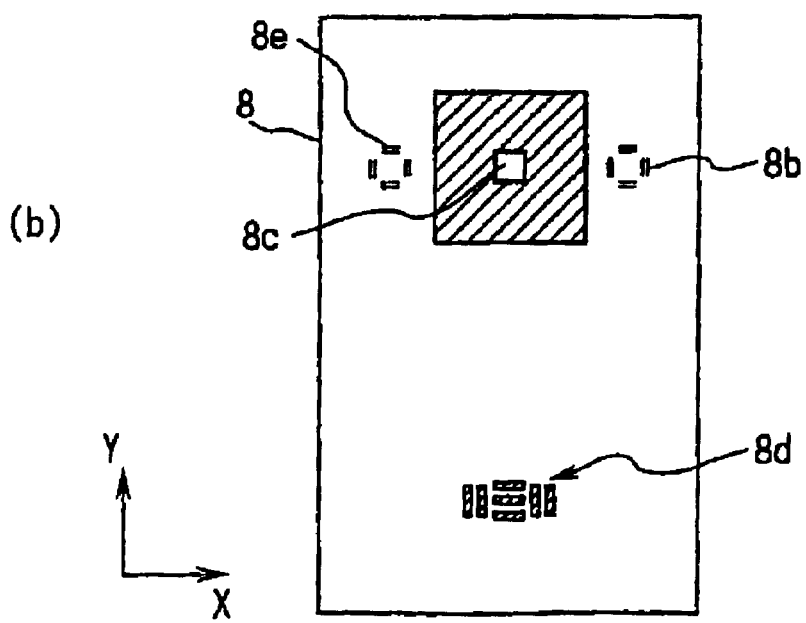
(b)

Fig.16
(a)
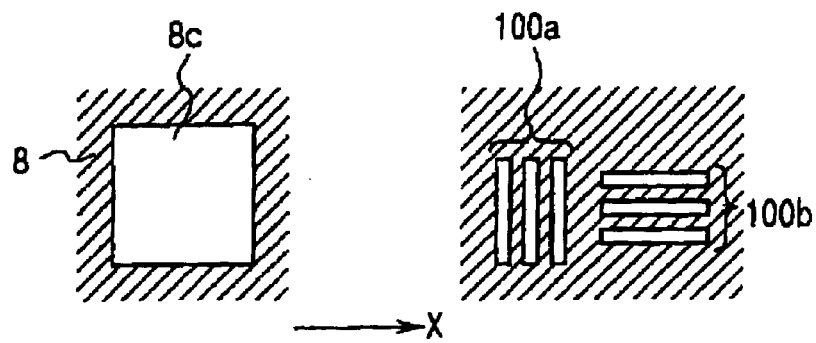
(b)
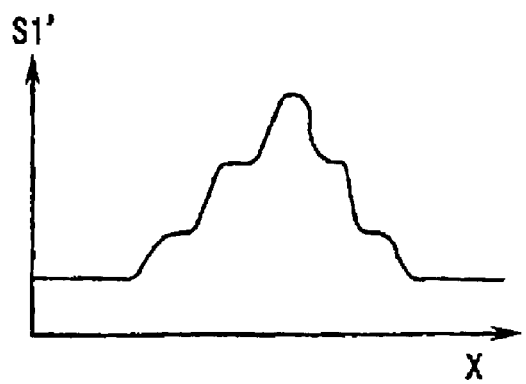
(c)
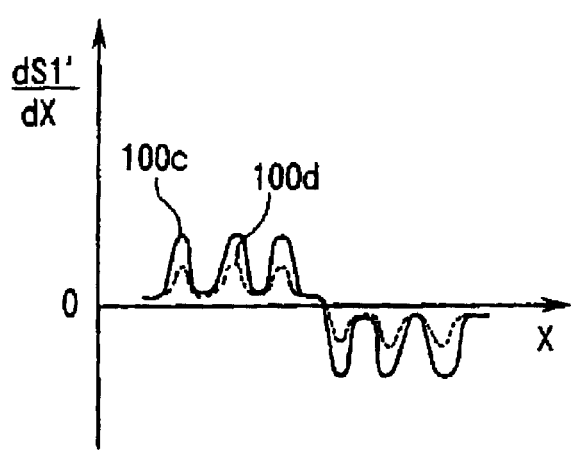
(d)
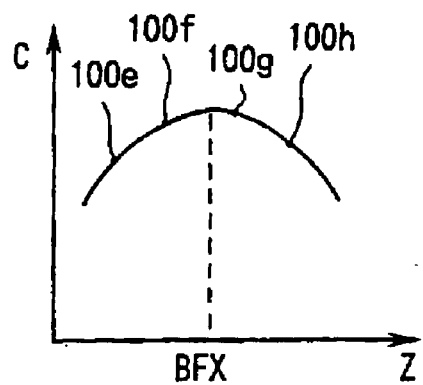

Fig.21
(a)
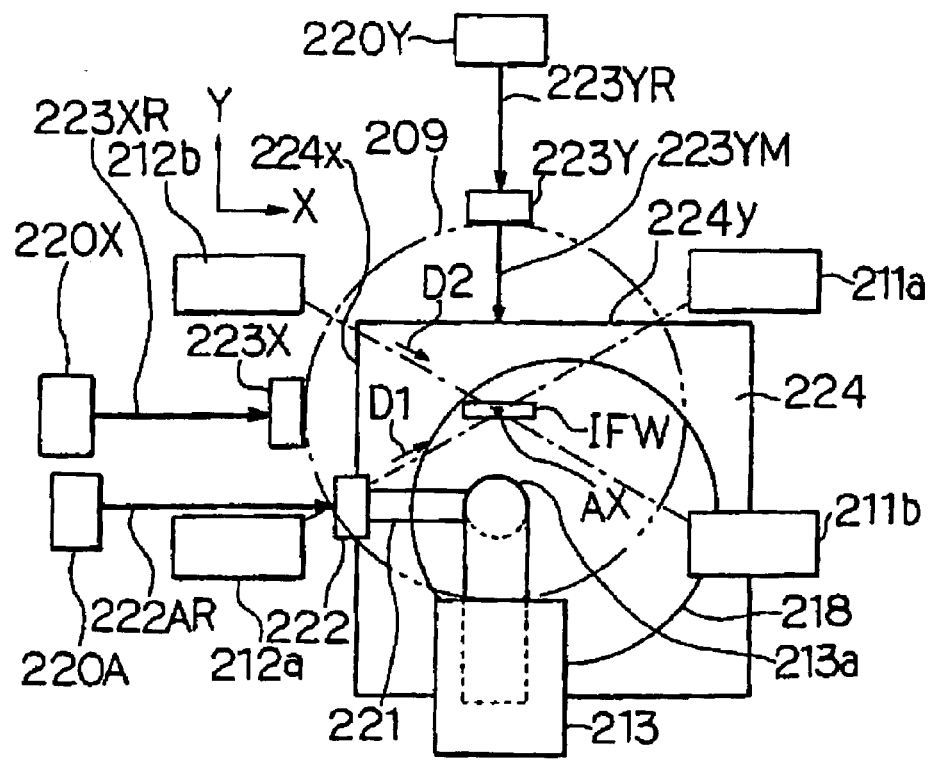
(b)
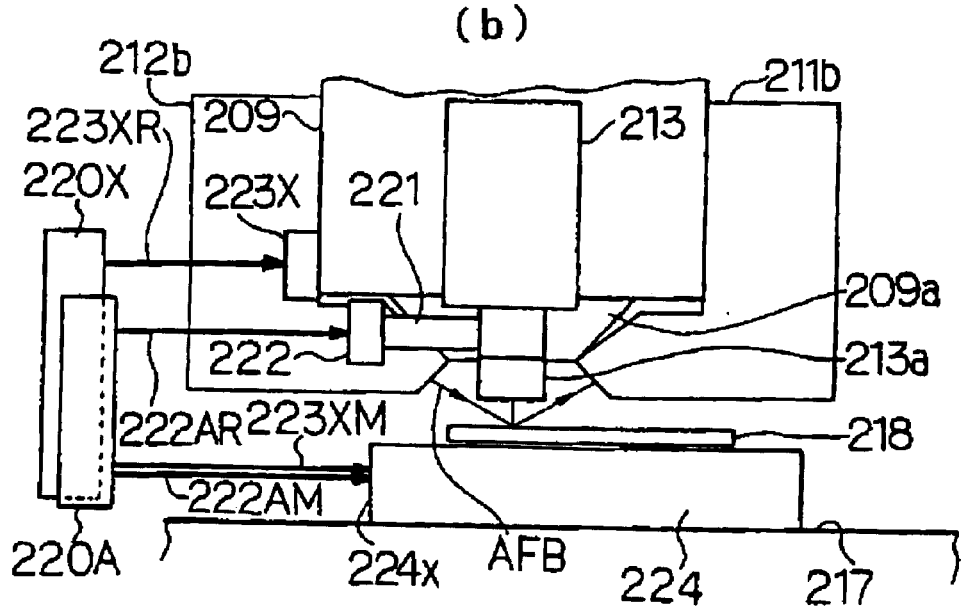

ion of the focal depth of
the projection optical system. Thus the need arises to
increase the focusing accuracy of the automatic focusing
EXPOSURE METHOD AND DEVICE

TECHNICAL FIELD

This invention relates to an exposure method and an exposure apparatus used to transfer a mask pattern onto a substrate in a lithography process to manufacture microdevices, such as semiconductor elements, image-capture elements (CCDs and similar), liquid crystal display elements, and thin film magnetic heads, and in particular a method and an apparatus suitable for use in an exposure apparatus comprising a mechanism to focus the image plane of a projection optical system on the substrate surface by an automatic focusing method. More specifically, this invention concerns an exposure apparatus comprising a mechanism to control the temperature of prescribed members.

BACKGROUND ART

With the advanced integration of semiconductor devices in recent years, steppers and other projection exposure apparatuses are required to project images of circuit patterns with fine line widths, with high resolution, onto a wafer (or glass plate or similar) covered with resist as the substrate in each shot area. To this end, the numerical aperture of the projection optical system must be increased, and the exposure wavelength must be shortened; however, this is accompanied by a tendency toward reduction of the focal depth of the projection optical system. Thus the need arises to increase the focusing accuracy of the automatic focusing mechanism comprised by a projection exposure apparatus, in order to perform exposure in which the wafer surface is accurately adjusted within the range of the reduced focal depth, with respect to the image plane of the projection optical system (the best focus position of the projected image of the mask or reticle pattern).

This automatic focusing mechanism comprises an auto-focus sensor (hereafter "AF sensor") which detects the focus position on the wafer surface (the position in the optical axis direction of the projection optical system), and a stage system which controls the height of the wafer or reticle based on the measurement results of this AF sensor. As this AF sensor, conventionally an oblique-incidence AF sensor is used in which a slit image or similar is projected obliquely onto the surface for detection, without passing through the projection optical system, and light reflected from this surface for detection is detected, as disclosed for example in Japanese Patent Application Laid-open No.6-283403. While this oblique-incidence AF sensor has the advantage of enabling measurement of fluctuations in the focus position of the surface for detection even during exposure, measurement light does not pass through the projection optical system, so that if for example the position of the image plane of the projection optical system fluctuates due to the heat of irradiation of the illumination light (exposure light) used in exposure, it is difficult to directly measure the change in defocusing of the surface for detection.

In order to measure the defocusing amount of the surface for detection with respect to the actual image plane of the projection optical system, a TTR (through-the-reticle) AF sensor has been proposed which projects on the in wafer stage the image of a mark on the reticle through the projection optical system and measures the position of the image plane based on the contrast of this image, as disclosed for example in Japanese Patent Application Laid-open No. 9-283421. This TTR type AF sensor has the advantage of enabling direct measurement of the image plane of the projection optical system; but in order to perform this measurement, exposure of the wafer must be interrupted, and if the AF sensor is used too frequently, the throughput of the exposure process is lowered. Hence as one example of a conventional method, a TTR type AF sensor and an oblique-incidence AF sensor are combined; the oblique-incidence AF sensor is used for focusing during normal exposure, and the TTR type AF sensor is used to measure the position of the actual image plane for each lot, once every half-day, once a day, or with similar frequency; based on the measurement results, the values measured by the oblique-incidence AF sensor are calibrated.

In a conventional exposure method like that described above, by performing calibration of the oblique-incidence AP sensor at prescribed time intervals, for example, the focusing accuracy can be maintained within a prescribed tolerance without greatly lowering throughput. However, because an oblique-incidence AF sensor is positioned on one side of the projection optical system in the vicinity of the wafer, if the illumination heat of the exposure light causes the temperature of the wafer to gradually rise, the temperature of members comprised by the oblique-incidence AF sensor also rises, and gradual drifting of the measured focus position may occur. Further, slight irregular shifts in position of prescribed optical members comprised by the AF sensor may cause irregular drifting of measured values. Such drift amounts are minute; but if the exposure wavelength is made still shorter and the focal depth is further decreased in response to the still higher integration levels of future semiconductor devices, drift in the values measured by the oblique-incidence AF sensor may cause the wafer surface to deviate outside the range of the focal depth for the image plane.

In order to lessen the drift in values measured by such an AF sensor, the above-described TTR type AF sensor may be used to perform frequent calibration (for example, each time the wafer is changed); but if exposure is interrupted and the TTR type AF sensor is used with such high frequency, there is the problem that throughput is greatly reduced.

In order to transfer, at a prescribed magnification and with high fidelity, a reticle pattern for use as a mask onto a wafer (or glass plate or similar) covered with resist as a substrate, conventionally the principal parts of the exposure apparatus are housed on a box-shape chamber; dust removal from within this chamber is performed extensively, and air regulated at a nearly constant temperature is supplied.

In recent years, high-precision temperature control not only of the reticle and wafer, but of various optical systems in the exposure apparatus has been sought in order to accommodate the ever-finer details in semiconductor elements and similar. In order to improve the resolution of an exposure apparatus, the wavelength of the illumination light used in exposure (exposure light) has been shortened, from primarily the i-line of mercury lamps (wavelength 365 nm) to KrF excimer laser light (wavelength 248 nm), and then to ArF excimer laser light (wavelength 193 nm); hereafter the use of $F_2$ laser light (wavelength 157 nm) and similar is also being studied. When the exposure wavelength is thus shortened, the transmissivity in ordinary air of the illumination light for exposure (exposure light) declines, and so recent an exposure apparatus comprises a gas supply mechanism to supply a gas having comparatively good transmissivity for the exposure light in part of the optical path of the exposure light.

FIG. 24 shows an exposure apparatus comprising such a gas supply mechanism; in this FIG. 24, exposure light emitted from the exposure light source 250 incorporating an excimer laser light source passes through the light transmission unit 268 including a relay optical system and through the optical path correction unit 252, and is incident on the exposure main unit. Exposure light incident on the exposure main unit passes through the illumination system 253 and illuminates the reticle 259, and a projected image passes through the projection optical system 264 and is projected onto the wafer 262. The wafer 262 is held on the wafer stage 261, and the wafer stage 261 is mounted in freely movable fashion on the wafer base 260; the projection optical system 264 is supported by the support member 263 of a column 257 embedded in the wafer base 260, and the reticle 259 is mounted on a reticle stage, not shown, on a reticle base 258 fixed in place on the column 257. A support member 255 supporting the illumination system 253 is fixed in place on the reticle base 258 via the column 256.

In order to control the overall temperature of the exposure apparatus at close to the target temperature, air controlled at a prescribed temperature is blown by a blower unit 266 for overall air conditioning within the chamber into the part 269, enclosed by the dotted line and containing the upper part of the projection optical system 264 and the reticle 259. At this time, far-ultraviolet light such as KrF excimer laser light (wavelength 248 nm) causes a chemical reaction with prescribed dust in the air to generate material which makes lenses cloud; because this dust is readily absorbed by ozone, it is desirable that the parts of the optical path in which illumination is high be filled either with dry air passed through a chemical filter, or with air from which ozone has been removed. Light in the vacuum ultraviolet range such as ArF excimer laser light (wavelength 193 nm), or light at wavelengths close to this, has high absorbance by oxygen, and so it is necessary that the principal parts of the optical path be supplied with nitrogen gas or similar in which the oxygen content has been reduced. In the exposure apparatus of FIG. 24, when for example ArF excimer laser light is used, the optical path within the part 268 enclosed by the dotted line from the blower unit 251 to the illumination system 253 is purged with nitrogen gas from the gas supply mechanism 267.

In the part 254 in particular, enclosed by the dotted line and containing the lower part of the projection optical system 264 and the wafer stage 261, highly accurate position measurements must be performed using a laser interferometer. In order to reduce fluctuations in the measurement beam in the optical path, air controlled at a prescribed temperature is supplied by the blower unit 265 of a partial air conditioning mechanism.

As described above, in conventional devices the exposure light source 250 containing the excimer laser light source is often supported separately from the exposure main unit and outside the chamber in which the exposure main unit (in FIG. 24, the members above the waver base 260, excluding the illumination system 253) is installed, from the standpoint of operational safety and of separating and positioning the exposure main unit away from sources of vibrations and heat insofar as possible. When the exposure main unit and exposure light source 250 are thus supported independently, corrections must be made for shifts in the optical axis of the exposure light caused by vibrations of the exposure light source 250 or other factors. Hence in the conventional device of FIG. 24, the optical system is separated before the illumination system 253 containing an attenuator unit or similar to attenuate the exposure light, and the optical axis correction unit 252 is used to correct for shifts in the optical axis between the light transmission unit 268 and the illumination system 253.

However, if the optical system is separated before the illumination system 253 in this way, nitrogen gas or some other gas easily leaks from the boundary between this illumination system 253 and the optical axis correction unit 252, so that the amount of gas supplied from the gas supply mechanism 267 is increased, and there is the problem that the operating costs of the exposure apparatus are increased. Also, because this gas leaks readily, air or other gases from outside may become intermixed within the illumination system 253 at or near the boundary, so that the transmissivity of the exposure light may be reduced.

The air blown from the blower unit 266 for overall air conditioning into the part 269 enclosing the reticle 259 is obstructed by the illumination system support member 255, reticle base 258, projection optical system support member 263, and the columns 256, 257 linked to these, so that the environs of the reticle 259 and the upper part of the projection optical system 264 may not be adequately air-conditioned. In particular, when there is inadequate air-conditioning in the environs of the reticle 259, the reticle temperature rises and the reticle expands, causing a problem in which a magnification error occurs in the pattern transferred onto the wafer.

In actuality, in the lower part of the projection optical system 264 are installed members of complex shapes such as alignment sensors and auto-focus sensors (hereafter "AF sensors") which generate heat, albeit in very small amounts; and in addition, the wafer stage 261 comprises a driving motor, tilt mechanism, and other heat-generating members. Further, the two-dimensional position of the wafer stage 261 is continuously measured with high accuracy by a laser interferometer, not shown. Consequently, if supplying temperature-adjusted air from only a single blower unit 265 (blower outlet) as in conventional devices, fluctuations occur in the air due to temperature irregularities occurring in the lower part of the projection optical system 264 and in the upper part of the wafer 262, so that errors occur in the measurement values of alignment sensors and AF sensors, and errors may also occur in the position of the wafer stage 261 measured by the laser interferometer. And, as a result of these air fluctuations the precision of control of the wafer temperature may be reduced, and expansion or contraction of the wafer may cause magnification errors in the transferred image.

In order to reduce such temperature irregularities, an exposure apparatus has been proposed in which a partial air-conditioning mechanism is mounted to perform partial air conditioning for alignment sensors and AF sensors; but in this case, the temperature differences between the plurality of partial air-conditioning mechanisms may cause further errors.

In recent projection optical systems, numerical apertures are larger and working distances are shorter in order to raise the resolution, so that it is becoming difficult to accurately control the temperature in the vicinity of the exposed area on the wafer.

In view of these points, a first object of this invention is to provide an exposure method capable of detecting with high accuracy defocusing amounts on the surface of a substrate for exposure with respect to the image plane of a projection optical system, even during exposure, and without greatly lowering throughput.

A second object of this invention is to provide an exposure method capable of exposing the image of a mask pattern on a substrate, with the surface of the substrate in for exposure aligned with high accuracy with the image plane of a projection optical system (with the image focused on the substrate), without greatly lowering throughput.

A third object of this invention is to provide an exposure method which, when performing exposure while focusing by an auto-focus method using an oblique-incidence type focus position detection system (AF sensor) which detects the focus position of a surface for detection without passing through the projection optical system, is capable of correcting the drift amount in measured values of the focus position detection system itself, without greatly lowering throughput.

A fourth object of this invention is to provide an exposure method which can separate midway the optical system from the exposure light source to the exposure main unit, and in addition can improve the overall airtightness of the optical path of the exposure beam (exposure light) in the optical system.

A fifth object of this invention is to provide an exposure method which can improve the airtightness of the optical path of the exposure beam in the optical system from the exposure light source to the exposure main unit, and in addition can accurately control the mask temperature.

A sixth object of this invention is to provide an exposure method which, when using an interferometer to measure the position of the substrate stage, can control with high precision the temperature of both the optical path of the interferometer measurement beam, and of the substrate for exposure.

A seventh object of this invention is to provide an exposure method which can control with high precision the temperature of the substrate for exposure, even when using a projection optical system with a short working distance.

A further object of this invention is to provide an exposure apparatus capable of implementing such exposure methods; a method for manufacturing such exposure apparatus; and a device manufacturing method which uses such exposure methods to manufacture devices with high precision.

DISCLOSURE OF THE INVENTION

The first exposure method of this invention is an exposure method in which the image of the pattern of a mask 12 is projected onto a substrate 7 on a substrate stage 2 via a projection optical system 11; which uses a first focus position detection system 117a, 118a which, by irradiating with a detection beam which is oblique to the optical axis of the projection optical system a first set of a plurality of measurement points F1a to F1k on the surface for detection of the object plane side or of the image plane side of the projection optical system, individually detects the focus positions which are the positions in the optical axis direction of this plurality of measurement points; which uses a second focus position detection system 117b, 118b which, by irradiating with a detection beam which is oblique to the optical axis of the projection optical system a second set of a plurality of measurement points F2a to F2k on the surface for detection, individually detects the focus positions at the second set of the plurality of measurement points; in which the first set of a plurality of measurement points and the second set of a plurality of measurement points substantially have at least some measurement points (F1d, F1f, F1i) in common; in which the first and second focus position detection systems are used to detect the focus positions of the measurement points which both have in common, and based on the detection results calibration of the detection results of the first and second focus position detection systems is performed; and in which the detection results of at least one of the first or the second focus position detection systems are used to perform focusing of the image plane of the projection optical system on the surface of the substrate.

By means of this invention, the oblique-incidence type first or second focus position detection systems can be used to measure the focus position of the substrate 7 continuously even during exposure of the substrate or of the fluctuations in the focus position of the mask 12; and based on this measurement value, an auto-focus method (which may include an auto-leveling method) can for example be used to align (focus) the surface of the substrate with the image plane of the projection optical system. Further, by effectively mounting almost all the parts of the first focus position detection system and almost all the parts of the second focus position detection system on different support bases, it is expected that drift and other detection errors in the measurement values of these focus position detection systems themselves will occur independently of each other.

When for example the substrate (wafer or similar) is being changed, and a member holding the prescribed reference plane in the exposure area of the projection optical system is moved, by measuring the focus positions at measurement points which are common and comparing the measurement results, the measurement error of the first and second focus position detection systems themselves can be determined, with hardly any decrease in throughput; and this measurement error can be used to perform calibration of the detection results of the focus position detection systems. After this, the defocusing amount at the substrate surface can be detected with high precision. Even if the support base is the same, the mounting of the optical members is different, so that a similar effect is obtained with respect to fluctuations of these parts.

Here it is desirable that the first and second focus position detection systems irradiate the vicinity of the common measurement points with detection beams which vibrate in mutually different directions, and detect the reflected light of these detection beams. By thus vibrating detection beams in mutually different directions, and by for example synchronously rectifying the photoelectric converted signals of the light reflected from the surface for detection, if the defocusing amounts detected by the first and second focus position detection systems are respectively $\Delta fd1$ and $\Delta fd2$, then $(\Delta fd1+\Delta fd2)/2$ approximately corresponds to the amount of change from the actual focus position (the defocusing amount) of the surface for detection, and $(\Delta fd1-66 fd2)/2$ approximately corresponds to the detection error (or its absolute value) of the first and second focus position detection systems themselves. That is, the defocusing amount of the surface for detection, and the detection errors (for example, drift amounts accompanying thermal deformation in the optical system) of the focus position detection systems themselves, can be accurately separated.

In this case, it is desirable that a third focus position detection system 8, 9, 17 also be used which detects the focus state of the mask and the substrate by detecting at least one among the first mark 100 on the mask 12 or the second mark on the substrate stage 2, 3 through the projection optical system 11. When the first and second focus position detection systems are used to detect the focus positions at the measurement points common to both, if the difference in the detection results is in a prescribed state (for example, larger than a prescribed value), this third focus position detection system is used to detect the focus state of the mask and substrate, and based on the detection results, calibration of the detection results of the first and second focus position detection systems is performed.

This third focus position detection system can use the TTR (through-the-reticle) method to directly detect with high precision the focus state of the projection optical system, and for example the defocusing amount of the substrate surface with respect to the image plane of the projection optical system; but if it is used frequently, throughput declines. However, in this invention this third focus position detection system is used to perform calibration when, for example, the difference in the detection results of the first and second focus position detection systems is large, so that there is not so great a decline in throughput.

The first exposure apparatus of this invention is an exposure apparatus having a projection optical system 11 which projects the image of the pattern of a mask 12 onto a substrate 7, and a substrate stage 2 which positions the substrate in a plane substantially perpendicular to the optical axis of the projection optical system, and provided with a focusing stage 3, which drives at least one of the mask or the substrate along the optical axis of the projection optical system; a first focus position detection system 117a, 118a which, by irradiating with a detection beam which is oblique to the optical axis of the projection optical system a first set of a plurality of measurement points F1a to F1k on the surface for detection of the object plane side or of the image plane side of the projection optical system, individually detects the focus positions which are the positions in the optical axis direction of this plurality of measurement points; and, a second focus position detection system 117b, 118b which, by irradiating with a detection beam which is oblique to the optical axis a second set of a plurality of measurement points F2a to F2k on the surface for detection, at least part of which are in common with the first set of plurality of measurement points, individually detects the focus positions at this plurality of measurement points; and in which focusing of the image plane of the projection optical system is performed on the surface of the substrate by driving the focusing stage based on the detection results of at least one of the first or the second focus position detection systems. By means of this invention, the first exposure in method of this invention can be used.

In this case, it is desirable that there be provided a third focus position detection system 8–10, 17, which detects the focus state of the mask and its substrate by detecting, via the projection optical system, at least one of a first mark on the mask, or a second mark on the substrate stage; and, a control system 110 to perform calibration of the detection results of the first and second focus position detection systems, based on the detection results of this third focus position detection system.

It is desirable that the first and second focus position detection systems have a light transmission unit to irradiate the vicinity of measurements points each have in common with detection beams vibrated in mutually different directions; light receiving systems to detect the reflected light of this detection light; and detection systems to synchronously detect the detection signals from the light receiving systems, in sync with the vibrations of the detection beams. It is desirable that these two focus position detection systems are manufactured fixed in place on mutually independent support bases, such that measurement value drift does not occur simultaneously.

However, in cases when for structural reasons it is not easy to fix these systems on mutually independent support bases, they can be manufactured such that they are fixed in place on a common support base, and, as one example, a vibrating mirror 57 in the light transmission systems 117a, 117b of the first and second focus position detector systems can be used in common, providing one set of inverting optical systems (61a, 61b), and a set of inverting optical systems 66a, 66b in these light receiving systems, so that the sign of the drift in the two measurement values which occur is reversed, and the drift can be accurately separated.

A second exposure method of this invention is an exposure method in which an exposure light source 250 which generates an exposure beam and an exposure main unit 300 which holds the mask 208 and the substrate 218 are used to transfer the mask pattern onto the substrate by means of the exposure beam; in which a first illumination system 203, which transmits the exposure beam from the exposure light source, is supported independently of the exposure main unit 300, a second illumination system 204 which guides the exposure beam from the first illumination system to the exposure main unit is fixed to the exposure main unit 300, and in which the optical paths of the exposure beams in the first illumination system and in the second illumination system are substantially sealed.

By means of this invention, the first illumination system and second illumination system, which are provided in the optical system from the exposure light source to the exposure main unit, are each substantially sealed, so that if for example a transmissive gas is supplied in the optical path of the exposure beam in these illumination systems, to supply leaked amounts, the leakage of gas from the boundary (junction) of these illumination systems is extremely small, and the purge efficiency is improved. That is, the effective airtightness of the optical path of the exposure beam in the optical system can be increased, the amount of gas used can be reduced, and operating costs during exposure can be lowered.

One example of a transmissive gas, when the exposure beam is light with a wavelength of 200 nm or longer (KrF excimer laser light or similar), is dry air with the ozone removed. When the exposure beam is light with a wavelength of 200 nm or shorter (ArF excimer laser light, $F_2$ laser light (wavelength 157 nm) or similar), nitrogen gas, helium gas, or any inert gas, broadly defined, can be used; and when the exposure beam is light with a wavelength of 150 nm or shorter, helium gas or another rare gas (inert gas as strictly defined) can be used.

In this case, it is desirable that the incidence plane of the second illumination system be conjugate with the plane of formation of the mask pattern, and that a field stop be placed in this incidence plane. By this means, even if for example there is a slight shift in the optical axes of the first illumination system and the second illumination system due to vibration of the exposure main unit, the position of the illuminated area on the mask, and the illumination distribution therein, do not effectively change, so that the entire image of the mask pattern can be transferred with high precision onto the substrate.

In this case, it is desirable that gas which is transmissive for the exposure beam be supplied independently to the two sealed optical paths, and that temperature-controlled gas be supplied in the vicinity of the mask, substantially in parallel to the surface of pattern formation of the mask. By this means, the precision of temperature control of the mask is improved. Hence even if the mask is illuminated continuously by the exposure beam, temperature increases in the mask are eliminated, and no magnification errors occur.

The second exposure apparatus of this invention is an exposure apparatus having an exposure light source 250 which generates an exposure beam, and an exposure main unit 300 which holds the mask 208 and substrate 218, and in which the mask pattern is transferred onto the substrate by means of the exposure beam; and which is provided with a first illumination system 203, supported independently from the exposure main unit, and which transmits the exposure beam from the exposure light source, and with a second illumination system 204, fixed onto the exposure main unit, and which guides the exposure beam emitted from the first illumination system to the exposure main unit. By means of this exposure apparatus, the second exposure method of this invention can be implemented.

In this case, it is desirable that the plane of incidence of the exposure beam, emitted from the first illumination system, on the second illumination system be conjugate with the plane of pattern formation of the mask, and that a field stop 243 be placed in this incidence plane. If this exposure apparatus is the scanning exposure type, it is desirable that a movable field stop 242 be placed in the emission plane of the first illumination system, in order to prevent exposure of unnecessary parts upon starting and stopping scanning exposure of each shot area on the substrate. Even if this movable field stop is driven, any vibrations occurring at that time are not transmitted to the exposure main unit, and overlap precision and other precision can be kept high.

The third exposure apparatus of this invention is an exposure apparatus comprising a projection optical system 209 which projects an image of the pattern of the mask 208 onto the substrate 218, and a substrate stage 224 which holds and positions the substrate in each of a first and a second direction, mutually orthogonal; and provided with a first interferometer 220X and second interferometer 220Y which detect the positions of the substrate stage in the first and in the second direction, respectively, and with temperature control devices 215, 216 having first, second and third blower outlets 287x, 287y, 287a, which supply temperature-controlled gas to the optical path of the measurement beam of the first interferometer, to the optical path of the measurement beam of the second interferometer, and to the substrate, respectively.

By means of this third exposure apparatus, blower outlets are comprised for the measurement beams and for the substrate, so that even if the members of an auto-focus sensor, alignment sensor or similar are installed, temperature-controlled gas is obstructed by these members hardly at all, and both the optical paths of measurement beams and the exposure area of the substrate can be temperature-controlled with high precision.

Here it is desirable that the first interferometer and the second interferometer be installed on their projection optical systems, have reference mirrors 223X, 223Y which are illuminated by a reference beam, and that the third blower outlet 287a of the temperature control device have a cover member 287b to supply temperature-controlled gas to the reference beam, formed into an extended end part. By this means, the substrate is efficiently cooled.

The fourth exposure apparatus of this invention is an exposure apparatus which transfers the image of the pattern of the mask 208 onto the substrate 218 via a projection optical system 209, and which is provided with a cylindrical retaining member 228 covering the sides of the projection optical system, and temperature-control devices 232A, 232B which supply temperature-controlled gas onto the substrate through the space between the sides of the projection optical system and the retaining member from an aperture 228b provided in part of the retaining member.

By means of this fourth exposure apparatus, temperature-controlled gas is efficiently supplied onto the substrate from the space between the sides of the projection optical system and its retaining member. Hence even when the working distance of the projection optical system is short, and even when alignment sensors or similar are positioned close to the projection optical system, the temperature of the substrate can be controlled with high precision.

Here it is desirable that a coolant to cool the projection optical system be supplied to the inner side of the retaining member. By this means, the temperature of the projection optical system can be controlled with still higher precision.

A first method for manufacturing an exposure apparatus of this invention combines, in a prescribed positional relationship, a projection optical system which projects the image of the pattern of a mask onto a substrate; a substrate stage which positions the substrate within a plane substantially perpendicular to the optical axis of the projection optical system; a focusing stage which drives at least one of the mask or the substrate in the direction of the optical axis of the projection optical system; a first focus position detection system which, by irradiating with a detection beam oblique to the optical axis of the projection optical system a first set of a plurality of measurement points on the surface for detection on the object plane side or on the image plane side of the projection optical system, individually detects the focus positions which are the positions in the optical axis direction of the plurality of measurement points; and a second focus position detection system which, by irradiating with a detection beam oblique to the optical axis a second set of a plurality of measurement points on the surface for detection, at least part of which are substantially common to the first set of plurality of measurement points, individually detects the focus positions at the plurality of measurement points.

A second method for manufacturing an exposure apparatus of this invention combines, in a prescribed positional relationship, an exposure light source which generates an exposure beam; an exposure main unit which holds the mask and substrate; a first illumination system, supported independently from the exposure main unit, which transports the exposure beam from the exposure light source; and a second illumination system, fixed onto the exposure main unit, which guides the exposure beam emitted from the first illumination system to the exposure main unit.

A third method for manufacturing an exposure apparatus of this invention combines, in a prescribed positional relationship, a projection optical system which projects the image of a mask pattern onto a substrate; a substrate stage which holds and positions the substrate in a first and a second direction, mutually intersecting; a first and a second interferometer, which detect the positions in the first and the second directions respectively of the substrate stage; and a temperature control device, having first, second and third blower outlets to supply temperature-controlled gas to the optical path of the measurement beam of the first interferometer, the optical path of the measurement beam of the second interferometer, and onto the substrate, respectively.

A fourth method for manufacturing an exposure apparatus of this invention is a method for manufacturing an exposure apparatus to transfer the image of a mask pattern onto a substrate via a projection optical system, and which combines, in a prescribed positional relationship, a cylindrical retaining member covering the sides of the projection optical system, and a temperature control device which supplies temperature-controlled gas onto the substrate from an aperture provided in part of the retaining member, through the space between the sides of the projection optical system and the retaining member.

A first device manufacturing method of this invention employs the first or the second exposure method of this invention, and includes a process to transfer the mask pattern onto the substrate. By means of this invention, devices can be manufactured with high precision.

The third exposure method of this invention is an exposure method in which the mask is illuminated by an exposure beam, and the substrate is exposed to the above exposure beam via a projection optical system; in which a plurality of measurement points on a surface for detection, either on the object plane side or on the image plane side of the projection optical system, or on both sides, are illuminated by a first beam; a plurality of measurement points on the surface for detection, set in substantially the same positions as at least one of the above plurality of measurement points, are illuminated by a second beam; and, the first and the second beam are used to detect position information for the substrate concerning a prescribed direction along the optical axis of the projection optical system at least one measurement point.

By means of this invention, substrate position information concerning prescribed directions at least one measurement point is detected by the first and second beams, and by comparing the measurement results, the error in the substrate position information can be determined with almost no decline in throughput, the surface of the substrate can be aligned with respect to the image plane of the projection optical system (focused), and the substrate can be exposed to an image of the mask pattern.

The fifth exposure apparatus of this invention is an exposure apparatus in which a mask is illuminated by an exposure beam, and a substrate is exposed to the exposure beam via a projection optical system; and provided with a position detection system in which a first beam illuminates a plurality of measurement points on a surface for detection on at least one of the object plane side or the image plane side of the projection optical system, a second beam illuminates measurement points on the surface for detection, set in substantially the same position as at least one of the above plurality of measurement points, and the first and second beams are used to detect substrate position information concerning prescribed directions along the optical axis of the projection optical system at least one measurement point. By means of this invention, the third exposure method of this invention can be used.

It is desirable that this position detection system be such that the first and second beams be illuminated obliquely to the optical axis of the projection optical system and to the surface for detection, and in mutually different directions.

It is desirable that this position detection system be such that all or at least part of at least one set of plurality of measurement points be set within a prescribed area on the surface for detection to be illuminated by beams.

It is desirable that this position detection system further comprise an adjustment device in which a plurality of measurement points including at least one of the above measurement points be illuminated by the second beam, and based on the substrate position information detected by illumination by at least one of the first or the second beam, the image plane of the projection optical system and the substrate be moved relative to each other.

A second device manufacturing method of this invention employs the fifth exposure apparatus of this invention, and includes a process to transfer the mask pattern onto the substrate. By means of this invention, devices can be manufactured with high precision.

BRIEF DESCRIPTION OF THE DRAWINGS

FIG. 12 is a drawing showing examples of a single-face reflecting member, a two-face reflecting member, and a three-face reflecting member;

FIG. 14 is a drawing showing one example of the change with time in the focus position measurement error for the case of performing calibration of an oblique-incidence AF sensor, when performing an interval baseline check, and showing comparison examples;

FIG. 15($a$) is a partial cutout expanded view showing the configuration of the light-receiving emission system 9 in FIG. 1;

FIG. 15($b$) is a plane view showing the reference mark member 8 of FIG. 15($a$);

FIG. 16 is a drawing explaining the case of determining the image plane (best-focus position) of a projection optical system using a TTR type AF sensor;

FIG. 17($b$) is a drawing showing the light-receiving sensor 68$b$ of FIG. 3;

FIG. 20(b) is a drawing explaining the effect of position shifts of the first illumination system unit 203 and second illumination system unit 204 of FIG. 20(a);

FIG. 21(a) is a plane view showing the laser interferometers, sensors and other components on the wafer stage side;

FIG. 21(b) is a front view showing the state in which the blower system 212a is excluded from FIG. 21(a);

BEST MODE FOR CARRYING OUT THE INVENTION

Figure 1:
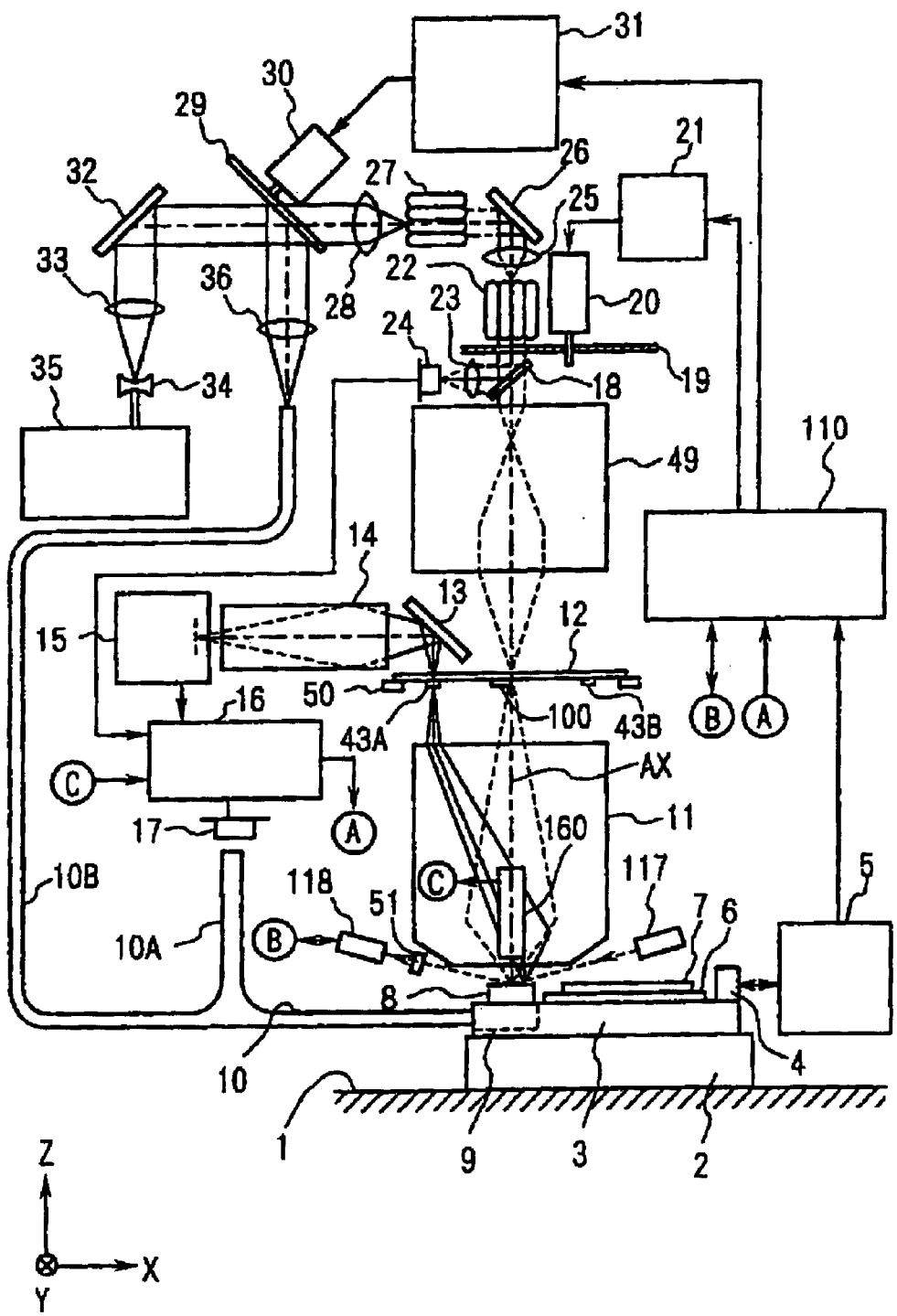
FIG. 1 is a schematic view showing a projection exposure apparatus used in one example of an aspect of this invention.

Below, preferred aspects of this invention are explained, referring to the drawings.

FIG. 1 shows the schematic configuration of the projection exposure apparatus of this example; in FIG. 1, illumination light for exposure emitted from a KrF excimer laser (wavelength 248 nm), ArF excimer laser (wavelength 193 nm), $F_2$ laser (wavelength 157 nm), or other laser light source 35 is shaped into a beam with a prescribed cross-sectional shape by a beam expander system consisting of two lenses 34, 33, before being deflected by a mirror 32 and reaching the shutter 29. As the exposure light source, in addition to a laser light source 35, a mercury lamp or other bright-line light source or similar may be used. The shutter 29 has a reflective face positioned obliquely to the optical path of the illumination light; by opening and closing the shutter 29 via a shutter control device 31 and motor 30, the control device 110, which exercises general control over the entire apparatus, can cause the illumination light to pass unmodified or to be reflected.

When the shutter 29 is open, illuminating light passing through the sides of the shutter 29 passes through the lens 28 and is incident on the first fly-eye lens 27. The illuminating light from numerous light-source images formed in the vicinity of the exit face of the first fly-eye lens 27 passes through the vibrating mirror 26 for speckle removal and the lens 25, and is incident on the second fly-eye lens 22. In the vicinity of the exit face of the second fly-eye lens 22, in the optically Fourier-transformed plane (pupil plane) of the pattern plane of the reticle 12 for exposure, is positioned an aperture stop plate 19 consisting of a freely-rotating turret plate. In this aperture stop plate 19 are positioned various illumination system aperture stops (σ stops) such as an ordinary circular aperture for illumination, a ring-shape aperture for ring-shape illumination, and an aperture for modified illumination consisting of a plurality of eccentrically placed small apertures (see for example Japanese Patent Application Laid-open No.4-225357). The control device 110 can position the illumination system aperture stop corresponding to prescribed illumination conditions in the optical path of the illumination light by rotating the aperture stop plate 19 by means of a motor 20, via an illumination condition switch 21. By this means, the intensity distribution (distribution of quantity of light) of illumination light on the Fourier-transform plane (pupil plane) in the illumination optical system, that is, the size and shape of a planar light source (two-dimensional light source) consisting of numerous light source images formed by the second fly-eye lens 22, can be modified according to the pattern of the reticle 12 to be transferred onto the wafer 7. The shutter 29 is here the rotational type, but may for example be the slide type or some other type. Also, a double fly-eye lens consisting of a first and a second fly-eye lens 27, 22 was adopted as an optical integrator (homogenizer), but a single fly-eye lens, or three or more fly-eye lenses, may be used. Instead of fly-eye lenses, rod lenses (internal-reflection type integrators), or DOEs (diffraction optical elements) which cause diffraction of the illumination light to superpose diffracted light on a prescribed surface, may be used; or, a combination of two or more among fly-eye lenses, internal-reflection integrators, and DOEs may be used.

The illumination light, having exited the second fly-eye lens 22 and passed through an illumination system aperture stop, passes through a beam splitter 18 having a low reflectivity of 1% or less, and then passes through the illumination optical system 49 having a relay lens, reticle blind (variable field stop), condenser lens and similar, to illuminate the illumination area with the prescribed shape of the pattern face (lower face) of the reticle 12. During exposure, the image of the pattern within the illumination area of the reticle 12 is projected with magnification p (where β is for example ¼, ⅕, or similar) via the projection optical system 11 onto the surface of the wafer 7, of silicon or similar and coated with resist, as the substrate. FIG. 1 shows the state in which the reference mark member 8 (described in detail below) is in motion in the exposure area of the projection optical system 11. In the following explanation, the Z axis is taken parallel to the optical axis AX of the projection optical system 11, and in the plane perpendicular to the Z axis, the X axis is parallel to the plane of the paper in FIG. 1, and the Y axis is taken perpendicular to the plane of the paper in FIG. 1.

The reticle 12 is placed on the reticle stage 50, which moves freely in two dimensions, in the X and Y directions and in rotation about the Z axis. The two-dimensional position and the rotation amounts (yawing, pitching, rolling) of the reticle stage 50 are measured by a laser interferometer (reticle interferometer), not shown, and based on the reticle interferometer measurement values, the control device 110 controls the position of the reticle stage 50 via the driving unit, not shown, and also the motion velocity as necessary. On the pattern face of the reticle 12 are, in addition to circuit patterns for exposure, alignment marks 43A, 43B for reticle alignment, and a mark 100 for focus position measurement. The mark 100 comprises a plurality of L/S (line-and-space) patterns; the alignment marks 43A, 43B and the mark 100 are positioned at positions within the field on the object plane side of the projection optical system 11.

The wafer 7 is held by suction onto the wafer holder 6, and the wafer holder 6 is fixed on a Z-tilt stage 3 which can move in the direction of the optical axis (the Z direction) of the projection optical system 11 and can be inclined (tilt-driving) within a prescribed range. The Z-tilt stage 3 is fixed onto the XY stage 2, which is freely movable in the X and Y directions on a fixed plate 1 by means of air guides and linear motors. The wafer stage (substrate stage) comprises the Z-tilt stage 3 and XY stage 2. The two-dimensional position and the rotation amounts (yawing, pitching, rolling amounts) of the Z-tilt stage 3 (wafer 7) are measured by a movable mirror 4 fixed on the Z-tilt stage 3 and by a wafer interferometer 5 constituted by a laser interferometer; based on these measurement values, the control device 110 control the position, and if necessary the velocity of motion of the Z-tilt stage 3 (wafer 7) by driving the XY stage 2 via driving parts, not shown.

During exposure, in cases where scanning exposure is performed by the step-and-scan method, after step-movement of the XY stage 2, the reticle stage 50 and XY stage 2 are moved synchronously in the X direction (scanning direction) with the projection magnification p as the velocity ratio, and by this means the pattern image of the reticle 12 is scan-exposed over each shot area of the wafer 7. This is also possible when performing step-and-repeat scanning; in this case, each shot area of the wafer 7 is exposed to an image of the pattern of the reticle 12 in succession while step-moving the XY stage 2.

In order to perform such exposure mount control during exposure, illumination light reflected by the beam splitter 18 is received by the integrator sensor 24 consisting of a photodetector, and the detection signal of the integrator sensor 24 is supplied to the alignment control device 16. In the alignment control device 16, the brightness of the illumination light on the wafer stage is determined from the detection signal, and during exposure cumulative exposure does is calculated as necessary, and the calculation results supplied to the control device 110. Based on the illumination light brightness and the cumulative exposure mount, the control device 110 controls the cumulative exposure mount of the wafer 7 to an appropriate exposure mount.

Next, the mechanism for alignment of the reticle 12 is explained. In this example, when performing alignment of the reticle 12, the control device 110 in FIG. 1 closes the shutter 29 and sets the reticle in the optical path of the illumination light. By this means, illumination light which has been emitted from the laser light source 35 and deflected by the shutter 29 passes through the lens 36 and is incident on the first branch part 10B of the optical fiber bundle 10. The exit face of the second branch part 10A of the optical fiber bundle 10 is positioned immediately before the light-receiving face of the photodetector 17 connected to the alignment control device 16, and the other branch part of the optical fiber bundle 10 leads into the light-receiving/light-emitting system 9 positioned in the Z-tilt stage 3. As the photodetector 17, a photomultiplier, a photodiode or similar can be used. On the light-receiving/light-emitting system 9 is fixed a reference mark member 8 consisting of glass substrate which is transmissive with respect to the illumination light; the surface of the reference mark member 8 is set so as to be positioned in the same plane as the surface of, for example, a reference wafer of good planarity, held on the wafer holder 6.

FIG. 15(*a*) shows the configuration of the light-receiving/light-emitting system 9 within the Z-tilt stage 3; FIG. 15(*b*) is a plane view of the reference mark member 8 in FIG. 15(*a*). In this FIG. 15, there are formed, on the surface 8*a* of the reference mark member 8, an approximately square-shape aperture pattern 8*c* positioned in the shield film; a pair of frame-shaped reference marks 8*b*, 8*e*, positioned so as to surround the aperture pattern 8*c* in the X-direction; and a two-dimensional reference mark 8*d* for use by the wafer alignment sensor, described below.

In the light-receiving/light-emitting system 9 of FIG. 15(*a*), illumination light IL for exposure emitted from the third branch part 10C of the optical fiber bundle 10 passes through the mirror 151 and condenser lens 152 to illuminate the reference mark 8*b* of the reference mark member 8 from the bottom side. Similarly, illumination light from another branch part (not shown) of the optical fiber bundle 10 illuminates the other reference mark 8*e*. In this example, illumination light is from the bottom side; of course light may be incident from the reticle side instead. The illumination light IL passing through the vicinity of the reference marks 8*b*, 8*e* passes through the projection optical system 11 of FIG. 1, and illuminates an area including, for example, cross-shaped alignment marks 43A, 43B on the reticle 12. In FIG. 1, illumination light passing through the vicinity of the alignment mark 43A from the side of the projection optical system 11 passes through the mirror 13 and alignment light-receiving system 14 to form images of the reference mark 8*b* and alignment mark 43A on a CCD or other two-dimensional image-capture element 15. A reticle alignment microscope (hereafter "RA microscope") is formed from the mirror 13, alignment light-receiving system 14 and image-capture element 15; image-capture signals from the image-capture element 15 are supplied to the alignment control device 16, and at the alignment control device 16, these image-capture signals are processed, positional shifts in the X and Y directions of the alignment mark 43A from the image of the reference mark 8*b* are computed, and the computed positional shifts are supplied to the control device 110.

By means of the RA microscope, not shown, the positional shift of the alignment mark 43B with respect to the image of the reference mark 8*e* of FIG. 15(*b*) is measured, and this measurement value is also supplied to the control device 110. By positioning the reticle stage 50 such that the positional shifts of this pair of alignment marks 43A, 43B is symmetrically minimized, or by associating and storing each of the positions of the reticle stage 50 and wafer stage such that the positional shifts are minimized, alignment of the reticle 12 with respect to the coordinate system of the Z-tilt stage 3, and thus the wafer stage, is performed. Optical elements which reduce the coherence of the illumination light, such as for example rotatable diffusion plates or vibrating mirrors, may be provided within the RA microscope (for example, in the light transmission system), to suppress the occurrence of speckle patterns on the light-receiving surface of the image-capture element 15.

An off-axis image-processing wafer alignment sensor 160 is positioned on the side of the projection optical system 11 to detect the position of the alignment mark (wafer mark) on the wafer 7; the image-capture signals of the wafer alignment sensor 160 are also supplied to the alignment control device 16. When the above reticle alignment is completed, the wafer alignment sensor 160 is used to detect the amount of positional shift from the detection center of the reference mark 8*d* of FIG. 15(*b*), and by adding this positional shift to the interval between the centers of the reference marks 8*b*, 8*e* determined in advance and the center of the reference mark 8*d*, the baseline amount, which is the interval between the detection center of the wafer alignment sensor 160 and the center of the pattern image (exposure center) of the reticle 12, is calculated; and this baseline amount is stored in the storage unit of the control device 110. During exposure of the wafer, the wafer alignment sensor 160 is used to detect the positions of wafer marks provided in the prescribed shot area of the wafer; and high overlap precision is obtained by driving the XY stage 2 based on the coordinates obtained by correcting, by the baseline amount, the array coordinates for all shot areas on the wafer calculated from the above detection results.

Because this baseline amount may change with time, baseline amounts may be remeasured, for example each time exposure of a single wafer ends, by moving the reference mark member 8 to the exposure area of the projection optical system 11 and executing the above operation. Such an operation to remeasure the baseline amount periodically at prescribed intervals is called an interval baseline check. The wafer alignment sensor 160 may be an on-axis rather than an off-axis device, and may use the TTL (through-the-lens) or TTR (through-the-reticle) methods. The wafer alignment sensor 160 uses broadband light (for example, with wavelengths ranging approximately from 550 to 750 nm); but a single-wavelength laser beam, or multiple-wavelength light, illumination light for exposure, or other light may be used, and photodetectors (such as photodiodes) which detect diffracted light from alignment marks or scattered light may also be used. This is true also of the alignment sensor 213 (FIG. 20) of the second aspect, described below.

When exposing each shot area on the face for exposure (surface) of the wafer 7 to pattern images on the reticle 12, it is necessary to perform auto-focus control such that the surface of the wafer 7 is aligned (the pattern is focused) within the focal depth of the image plane (best-focus position) of the pattern on the reticle 12 via the projection optical system 11. The auto-focus control of this example includes auto-leveling control, which controls the angle of inclination of the surface of the wafer 7. Consequently the projection exposure apparatus of this example comprises an auto-focus mechanism comprising a plurality of AF sensors to measure the amount of defocusing of the image plane with respect to the surface of the wafer 7 and the shift in the angle of inclination, and a Z-tilt stage 3 which aligns the focus position and angle of inclination of the surface of the wafer 7 with the image plane, based on the measurement values of the AF sensors.

The plurality of AF sensors of this example consist of a TTR (through-the-reticle) AF sensor corresponding to the third focus position detection system of this invention, and two-axis oblique-incidence AF sensors corresponding to the first and second focus position detection systems of this invention. First, the TTR type AF sensor is explained. When using a TTR AF sensor, the shutter 29 in FIG. 1 is opened, and illumination light for exposure from the laser light source 35 is used to illuminate, via the illumination optical system 49 and other components, an area which includes a mark 100 for focus position measurement on the reticle 12. The image of this mark 100 is projected onto the reference mark member 8 via the projection optical system 11, and this projected image is scanned in the X or Y directions relative to the aperture pattern 8c (FIG. 15) on the reference mark member 8.

In FIG. 15(a), illumination light IL which has passed the aperture pattern 8c passes through the condenser lens 153 and mirror 154 in the light-emitting/light-receiving system 9 in the Z-tilt stage 3, and is incident on the fourth branch part 10D of the optical fiber bundle 10. The illumination light IL incident on the fourth branch part 10D passes through the second branch part 10A of the optical fiber bundle 10 and is incident on the photodetector 17 in FIG. 1, and the detection signals Si of the photodetector 17 are supplied to the alignment control device 16. The TTR type AF sensor 8–10, 17 of this example consists of the reference mark member 8, light-receiving/light-emitting system 9, optical fiber bundle 10, and photodetector 17. In this case, a scanning type measurement method is employed in the alignment control device 16, and detection signals S1 of the photodetector 17 are sampled in sync with the relative scanning of the aperture pattern 8c by the image of the mark 100. In order to perform this scanning of the mark 100 on the reticle 12 relative to the aperture pattern 8c, either the XY stage 2 or the reticle stage 50 may be driven.

In FIG. 1, when using a KrF excimer laser, ArF excimer laser or other pulsed light source as the laser light source 35, the pulse light is detected by the photodetector 17, and so it is desirable that the input unit of the alignment control device 16 comprise, for example, a peak-hold circuit and analog/digital (A/D) converter. In order to correct for scattering in the energy of the illumination light IL upon each light pulse, in the calculation unit of the alignment control device 16, the detection signals of the photodetector 17 are normalized by sequentially dividing the detection signals of the photodetector 17 by the brightness (pulse energy) of the illumination light IL, detected by the integrator sensor 24. These normalized detection signals S1' are used to determine the contrast of the image of the mark 100.

That is, as shown in FIG. 16(a), the L/S pattern-shape projected image 100a and L/S pattern-shape projected image 100b are projected onto the reference mark member 8 in the X- and Y-directions respectively as the image of the mark 100. Hence the projected image 100a is first scanned in the X direction using the aperture pattern 8c, and the normalized detection signals S1' of the photodetector 17 are plotted against the X coordinate of the XY stage 2, to obtain signals corresponding to the integrated quantity of light (in actuality, plotted as discrete quantities at positions in the X direction), as shown in FIG. 16(b). Next, in the calculation unit of the alignment control device 16, these detection signals S1' are differentiated (in actuality, differences are computed), to obtain the differential signal dS1'/dX as shown by the curve 100c in FIG. 16(c); the amplitude of this curve 100c corresponds to the contrast C of the projected image 100a.

Under the control of the control device 110 of FIG. 1, scanning of the above aperture pattern 8c is repeated to determine the contrast C of the projected image 100a, while driving the Z-tilt stage 3 to vary by prescribed amounts the focus position of the reference mark member 8, and on plotting the contrast C obtained against the focus position z of the reference mark member 8, the data series 100e, 100f, . . . of FIG. 16(d) is obtained. If this data series is approximated by a quadratic curve, for example, using the least-squares method or similar, and the focus position BFX at which this quadratic curve is maximum is determined, this focus position BFX will be the best-focus position of the projected image 100a. In actuality, in order to eliminate the effect of astigmatism of the projection optical system 11, the Y-axis projected image 100b of FIG. 16(a) is scanned in the Y-direction using the aperture pattern 8c to determine the best-focus position BFY for the projected image 100b, and the average value (BFX+BFY)/2 of the two best-focus positions is taken to be the actual best-focus position; the focus position of the Z-tilt stage 3 is set to this best-focus position. By this means, the surface of the reference mark member 8 is in a state of coincidence with the actual image plane of the projection optical system 11. In this state, if for example the focus position of the surface of the reference mark member 8 is measured using an oblique-incidence AF sensor, described below, and calibration is performed such that this measured value is 0, thereafter measured values of the focus position of the surface of the wafer 7 by this oblique-incidence AF sensor accurately represent the defocus amount from the image plane. A more detailed method of relative scanning of a projected image and aperture pattern to determine the projected image contrast is disclosed in Japanese Patent Application Laid-open No.H9-283421.

In order to actually determine the image plane of the projection optical system, including the angle of inclination, the same marks as the mark 100 used for focus position measurement may be formed at three or more places on the pattern surface of the reticle 12, and the best-focus positions of the projected images of the plurality of three or more marks each measured, a plane approximating this plurality of best-focus positions determined, and the Z-tilt stage 3 controlled such that the surface of the reference mark member 8 coincides with this plane. The best-focus positions or image plane determined in this way are determined based on the projected image of the pattern of the reticle 12 via the actual projection optical system 11, so that the measurement values can be regarded as extremely precise values which take into consideration fluctuations in focus positions of the projection optical system 11 itself originating in thermal deformation of optical members and other changes caused by environmental changes such as the atmospheric pressure or temperature, or by absorption of exposure light. Here it is desirable that marks 100 for focus position measurement be positioned in conjugate relations with the measurement points (FIG. 4) of the oblique-incidence AF sensors 117, 118 set within the projection optical system exposure area IU on the wafer 7 to be illuminated by illumination light (that is, the projection area conjugate, with respect to the projection optical system 11, with the illuminated area on the reticle 12), and that the best-focus positions at these measurement points be measured in advance.

By using a TTR type AF sensor 8–10, 17 as described above, the actual image plane (best-focus position) of the projection optical system 11 can be focused on the reference mark member 8 with high precision. However, if this AF sensor 8–10, 17 is used, the throughput of exposure operations is reduced; hence in this example, an oblique-incidence type AF sensor, described below, is used during exposure.

In FIG. 1, on the side of the projection optical system 11 is positioned a two-axis oblique-incidence AF sensor 117, 118 comprising a light transmission system 117 for two axes, and a photodetector system 118 for two axes. A plurality of focus signals detected by the photodetector system 118 is supplied to the control device 110, and the control device 110 controls the operation of the light transmission system 117 and the photodetector system 118, as well as controlling operation of the Z-tilt stage 3 by an auto-focus method (including an auto-leveling method).

Figure 2:
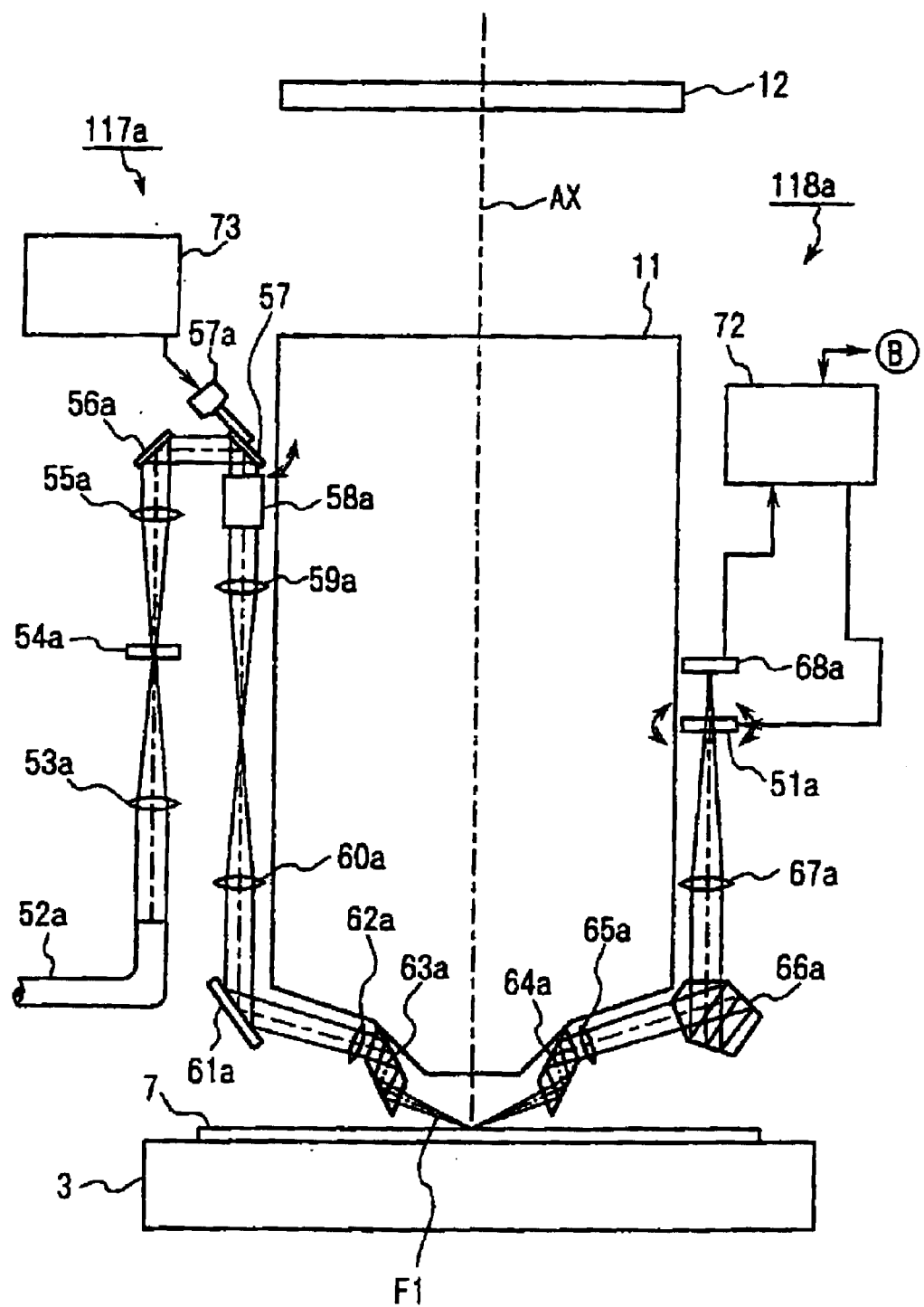
FIG. 2 is a schematic view showing the first oblique-incidence AF sensor in FIG. 1.
Figure 3:
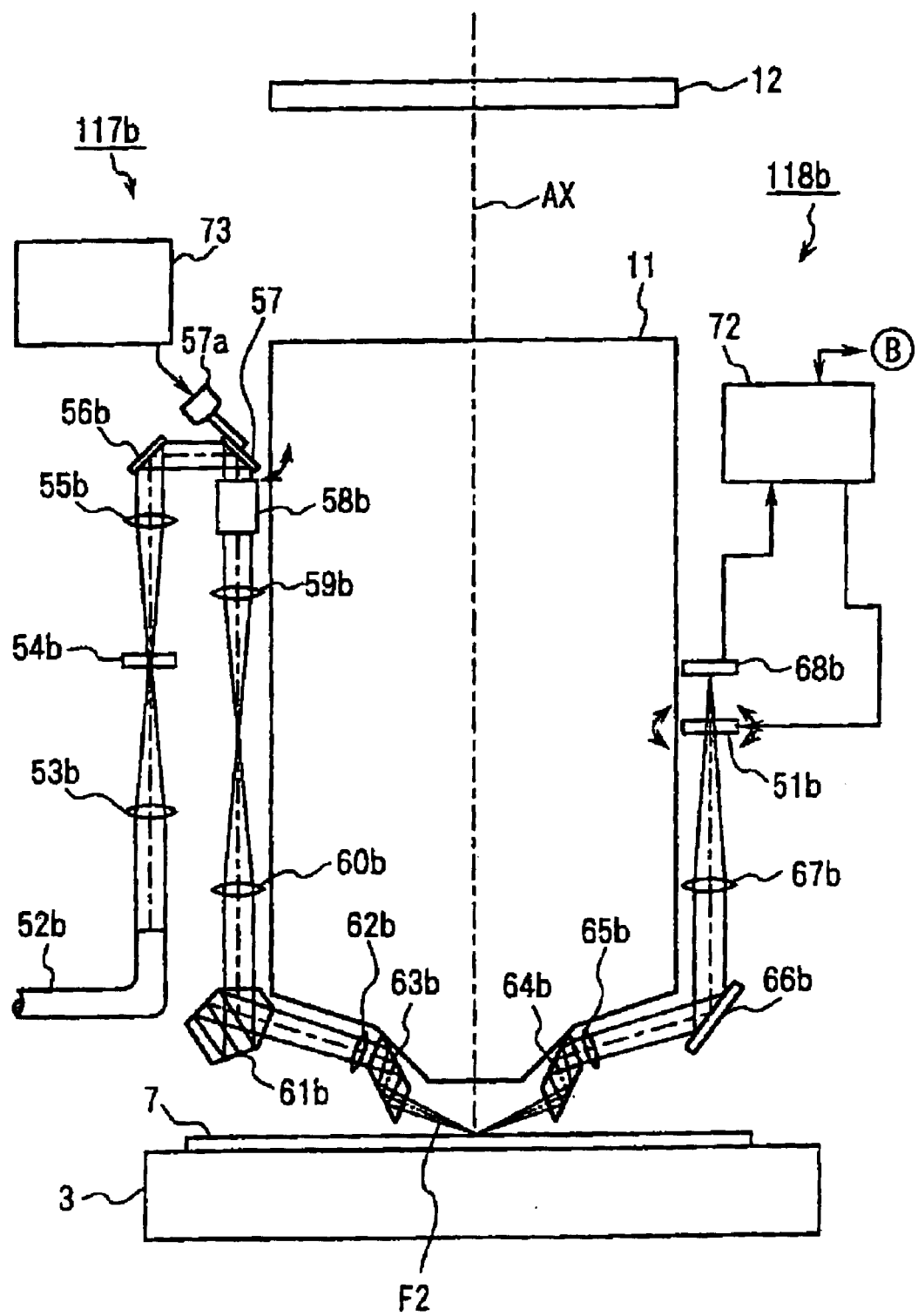
FIG. 3 is a schematic view showing the second oblique-incidence AF sensor in FIG. 1.

FIG. 2 shows the first oblique-incidence AF sensor 117a, 118a within the two-axis AF sensor; in FIG. 2, the surface of the wafer 7 is set in the exposure area of the projection optical system 11. From among comparatively broadband light emitted from a halogen lamp or similar, not shown, light in a wavelength region for which the resist on the wafer 7 has weak photosensitivity is selected by a wavelength filter, not shown, as illumination light for use in focus position detection, and this illumination light is transmitted to the vicinity of the projection optical system 11 via an optical fiber bundle, not shown. This illumination light is extracted from the first and second emission ends 52a, 52b of the optical fiber bundle (FIG. 3).

In FIG. 2, the illumination light F1 emitted from the emission end 52a of the optical fiber bundle passes through the lens 53a, and illuminates an illumination slit 54a positioned in the plane conjugate with the surface of the wafer 7 (surface for detection). The projection exposure apparatus of this example is of the step-and-scan type; if the area for exposure by the projection optical system 11 is the rectangular exposure area IU, long in the Y direction as shown in FIG. 4(c), then FIG. 4(a) shows the state in which the image of the illumination slit 54a (also indicated by 54a) is projected onto the area including the exposure area IU. Just as the image 54a of the illumination slit is shown in FIG. 4(a) as shaded on a dark background, so a plurality (in this example, 11) of bright slit images F1a to F1k are included. Hence an aperture pattern 54P consisting of slit-shape aperture patterns 54Pa to 54Pk, corresponding to the 11 slit images shown in FIG. 5, is formed as the illumination slit 54a.

Having passed through these aperture patterns 54Pa to 54Pk, the illumination light F1 passes through the lens 55a, mirror 56a, vibrating mirror 57, relay system 58a and lens 59a in FIG. 2, to form images (slit images) of these aperture patterns. Illumination light F1 emanating from these aperture pattern images projects slit images F1a to F1k onto the surface of the wafer 7, obliquely with respect to the optical axis AX of the projection optical system 11, via the lens 60a, mirror 61a, lens 62a, and optical member 63a for optical path shifting. As shown in FIG. 4(a), the direction D1 of projection of the slit images F1a to F1k is inclined slightly in the counterclockwise direction with respect to the exposure area IU. The center of the central slit image F1f coincides with the center of the exposure area IU (the optical axis AX of the projection optical system 11).

The reflecting face of the vibrating mirror 57 is positioned nearby the optical Fourier-transformed plane of the surface of the wafer 7 (pupil plane); the driving system 73 drives the actuator 57a via prescribed driving signals, so that the vibrating mirror 57 is caused to vibrate with a prescribed period, passing through the optical axis of the illumination light F1, rotating alternately in the clockwise and counter-clockwise directions about an axis perpendicular to this optical axis. The driving signals of the driving system 73 are also supplied to the signal processing control system 72. The light transmission system consists of the optical fiber bundle emission end 52a to the mirror 56a, the vibrating mirror 57, and the relay system 58a to optical member 63a. The first inverting optical system consists of the mirror 61a (that is, a single-face reflecting member) and the two-face reflecting member 61b within the second AF sensor of FIG. 3, described below.

In FIG. 2, the illumination light F1 illuminating the surface of the wafer 7 passes through the optical member to shift the optical path 64a, lens 65a, two-face reflecting member 66a, lens 67a, and a device for optical axis adjustment consisting of parallel-plate glass(called herein as "harbing"), a plurality of slit images (these are also called F1a to F1k) are refocused on the light-receiving face of the light-receiving sensor 68a. The two-face reflecting member 66a is a member which causes incident light to be reflected twice to deflect the optical path.

Figure 4:
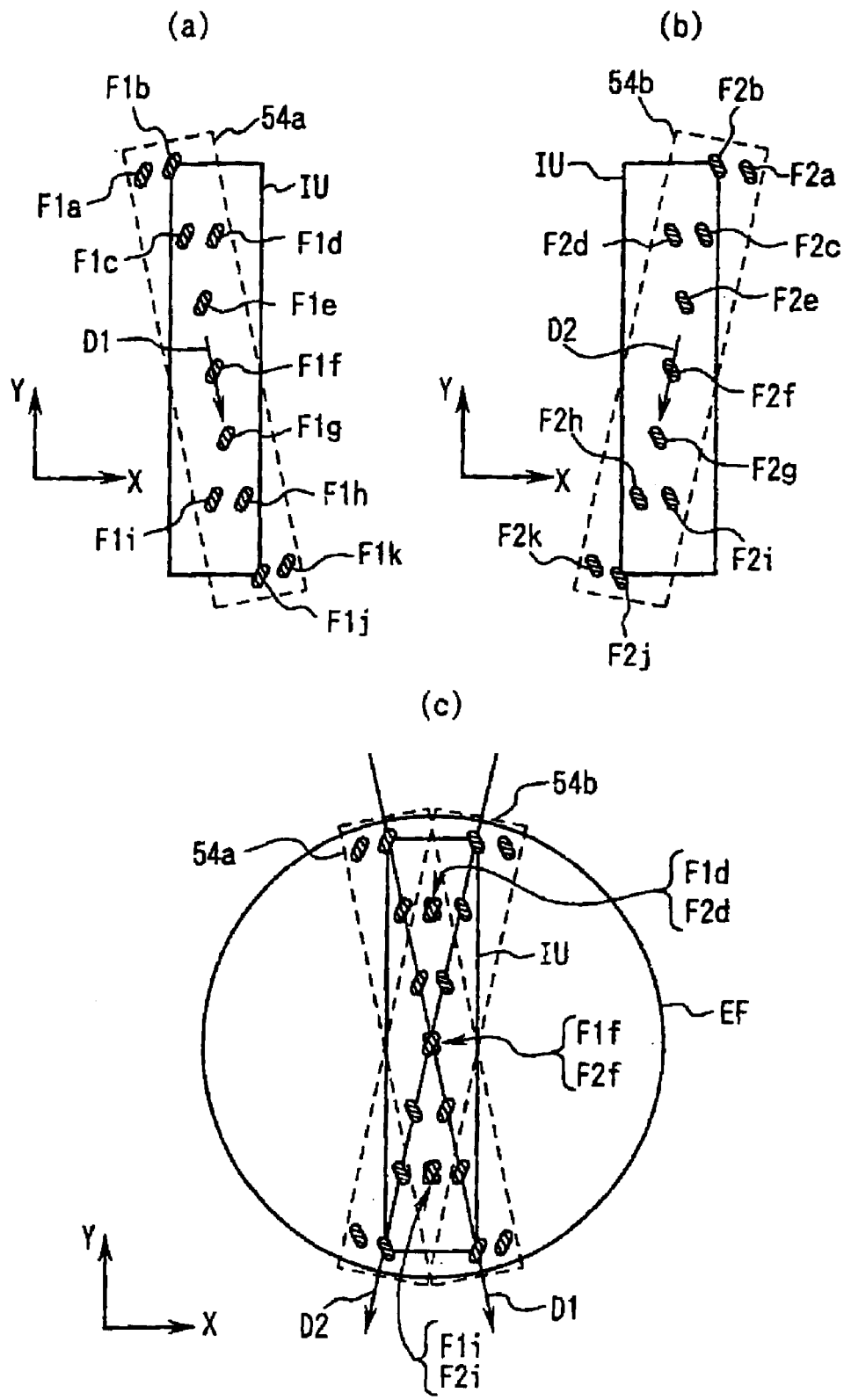
FIG. 4 is a drawing showing the positions of a plurality of slit images projected onto the surface for detection from the first and second oblique-incidence AF sensors.
Figure 5:
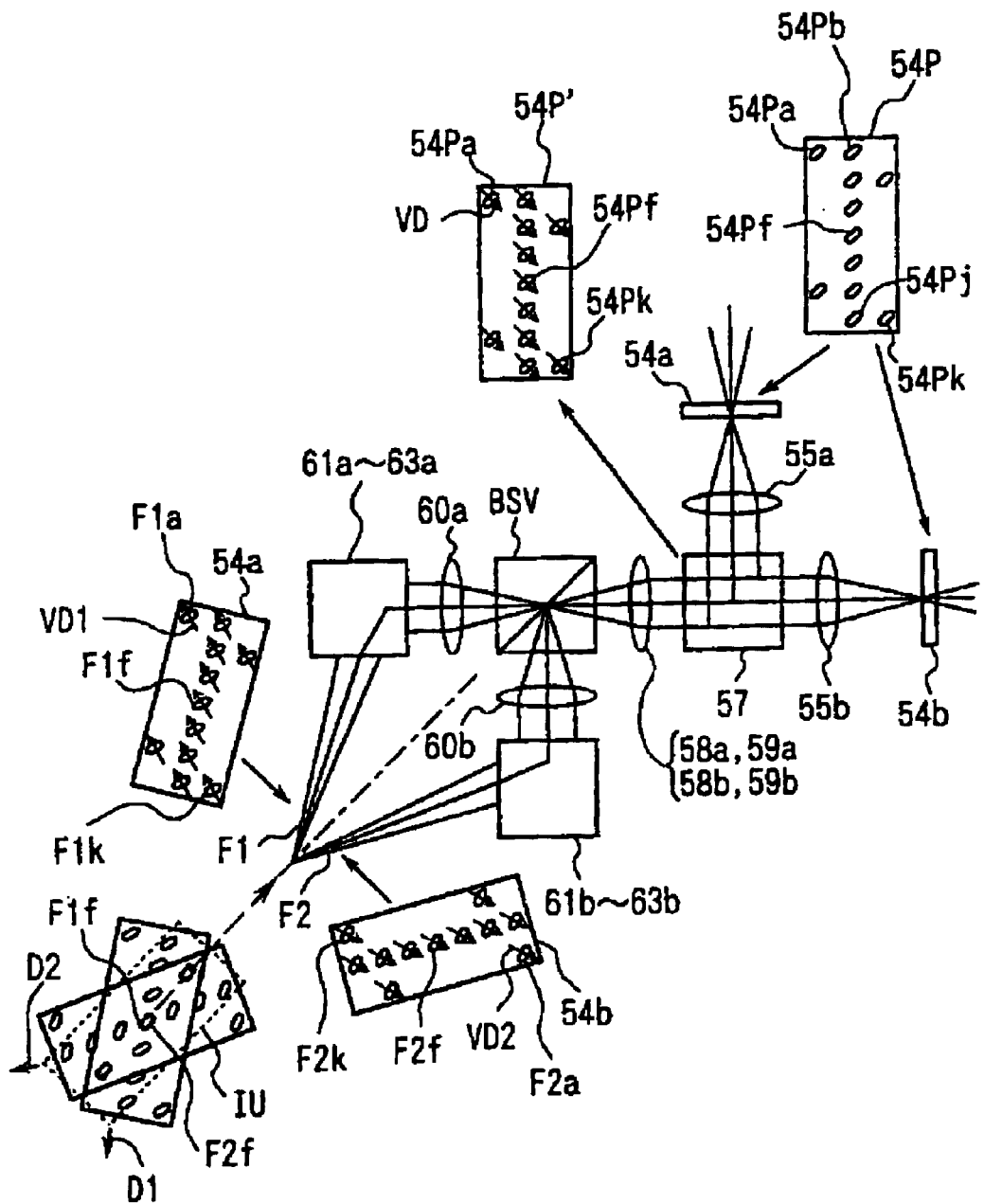
FIG. 5 is a conceptual view showing the overall schematic configuration of the first and second oblique-incidence AF sensors.

FIG. 17(a) shows the light-receiving face of this light-receiving sensor 68a; in FIG. 17(a), an area IUP, conjugate with the exposure area IU of FIG. 4(c), is also shown. On this light-receiving face are formed slit-shaped apertures 70aa to 70ak near the refocused slit images F1a to F1k; at the bottoms of these apertures 70aa to 70ak are fixed mutually independent photodiodes or other photodetectors 68aa to 68ak, and the detection signals of these photodetectors 68aa to 68ak are supplied in parallel to the signal processing control system 72 of FIG. 2. The signal processing control system 72 comprises a plurality of synchronous rectifier circuits which rectify these detection signals independently, in sync with the driving signal of the vibrating mirror 57 supplied from the driving system 73. The plurality of focus signals output from these synchronous rectifier circuits are supplied to the control device 100 of FIG. 1. Here, the above TTR AF sensor 8–10, 17 is used in advance to perform calibration of best-focus positions. That is, the surface of the reference mark member 8 of FIG. 1 is moved to the exposure area of the projection optical system 11, and with the image plane focused on the surface of this reference mark member 8, the signal processing control system 72 of FIG. 2 adjusts the rotation angle of the harbing for optical axis adjustment to perform adjustments such that each of the focus signals is 0. Apart from this, the levels of each of the focus signals on the image plane may be stored as offsets, and the corresponding offsets subtracted when each of the focus signals is actually used. Immediately after performing calibration in this way, the levels of these focus signals are approximately proportional to the center points of the areas onto which each of the slit images F1$a$ to F1$k$ of FIG. 4($a$) are projected, that is, to the defocusing amounts from the image plane for each measurement point (best-focus positions).

However, because measurement errors may gradually occur in measured defocusing amounts due to the effects of the illumination heat of the illumination light for exposure and the effects of drift in the measurement values of the AF sensor itself, it is necessary that the oblique-incidence AF sensor itself be calibrated periodically, in such a way that throughput is lowered as little as possible.

A light-receiving system is formed from the optical member 64$a$ to the light-receiving sensor 68$a$ and the harbing 51$a$ of FIG. 2; and this light-receiving system and the signal processing control system 72 form a light-receiving detection system 118$a$. The two-face reflecting member 66$a$ and the mirror 66$b$ (single face reflecting member) of FIG. 3, described below, form a second inverting optical system.

The calculation unit within the control device 110 of FIG. 1 calculates the average defocusing amount of the image plane on the surface of the wafer 7 in the exposure area IU and the shift angle of the average inclination angle by using, for example, the least-squares method to calculate the above plurality of defocusing amounts, and drives the Z-tilt stage 3 so as to cancel out these defocusing amounts and shifts in inclination angle, thereby focusing the image plane on the surface of the wafer 7 in the exposure area IU by an auto-focus method. During exposure of each shot area of the wafer 7, measurements of defocusing amounts at each measurement point are performed continuously at a prescribed sampling rate, and based on these measurement values the Z-tilt stage 3 is driven by a servo method to continuously perform focusing.

In this example, a second oblique-incidence AF sensor 117$b$, 118$b$ is positioned in parallel with the first oblique-incidence AF sensor 117$a$, 118$a$.

FIG. 3 shows this second oblique-incidence AF sensor 117$b$, 118$b$; in FIG. 3, parts corresponding to parts in FIG. 2 are assigned the same symbols, and a detailed explanation is omitted. In FIG. 3, the illumination light F2 emitted from the second emission end 52$b$ of the optical fiber bundle passes through the lens 53$b$ to illuminate the illumination slit 54$b$. FIG. 4($b$) shows the state of projection of an image (also indicated by 54$b$) of the illumination slit 54$b$ on an area including the exposure area IU; as shown by this projected image, in the illumination slit are formed a plurality of aperture patterns, positioned approximately with axial symmetry with the illumination slit 54$a$ of the first AF sensor.

In FIG. 3, the illumination light F2 which has passed through the illumination slit 54$b$ passes through the lens 55$b$, mirror 56$b$, vibrating mirror 57, relay system 58$b$, and lens 59$b$ to form an image of the aperture patterns (slit image). Illumination light F2 emanating from these aperture pattern images projects slit images F2$a$ to F2$k$ onto the surface of the wafer 7 as shown in FIG. 4($b$), obliquely with respect to the optical axis AX of the projection optical system 11, via the lens 60$b$, twice-reflecting mirror 61$b$, lens 62$b$, and optical member 63$b$ for optical path shifting. The direction D2 of projection of the slit images F2$a$ to F2$k$ is inclined slightly in the clockwise direction with respect to the exposure area IU. The center of the central slit image F2$f$ coincides with the center of the exposure area IU. The vibrating mirror 57 of FIG. 3 is used in common with the first AF sensor of FIG. 2; the optical fiber bundle emission end 52$b$ to mirror 56$b$, vibrating mirror 57, and relay system 58 to optical member 63$b$ form the light transmission system 117$b$.

FIG. 4($c$) shows the state in which the slit images F1$a$ to F1$k$ of FIG. 4($a$) and the slit images F2$a$ to F2$k$ of FIG. 4($b$) are combined. In FIG. 4($c$), the projection direction D1 of the slit images of the first AF sensor and the projection direction D2 of the slit images of the second AF sensor intersect at an angle of from 10° to 40° approximately (in FIG. 4($c$), approximately 25°). In addition, the measurement points at the centers of the slit images F1$d$, F1$f$, F1$i$ of the first AF sensor, and the measurement points at the centers of the slit images F2$d$, F2$f$, F2$i$ of the second AF sensor, coincide; and the straight line passing through measurement points at the centers of the slit images F1$d$, F1$f$, F1$i$ is a straight line, parallel to the Y axis (non-scanning direction), which passes through the center of the exposure area IU. All the slit images F1$a$ to F1$k$ and F2$a$ to F2$k$ are contained within an effective field EF on the image plane side of the projection optical system 11. However, if for example focus positions are read in advance at the time of scanning exposure, some of these slit images may be illuminated outside the effective field EF with respect to the scanning direction. AF sensors for which advance reading of focus positions is possible are for example disclosed in Japanese Patent Application Laid-open No.6-283403 and in the corresponding U.S. Pat. No. 5,448,332; the disclosure of this U.S. Patent is incorporated hereinto by reference, insofar as permitted by the laws of the designated or selected countries selected in this international patent application.

In. FIG. 3, the illumination light F2 reflected at the surface of the wafer 7 passes through the optical member 64$b$ to shift the optical path, the lens 65$b$, mirror 66$b$, lens 67$b$, and the harbing 51$b$ for optical axis adjustment consisting of parallel-plate glass, and a plurality of slit images (also labeled F2$a$ to F2$k$) are refocused on the light-receiving surface of the light-receiving sensor 68$b$. The harbing 51$a$ of FIG. 2 and the harbing 51$b$ of FIG. 3 are represented as the same harbing 51 in FIG. 1.

Figure 17:
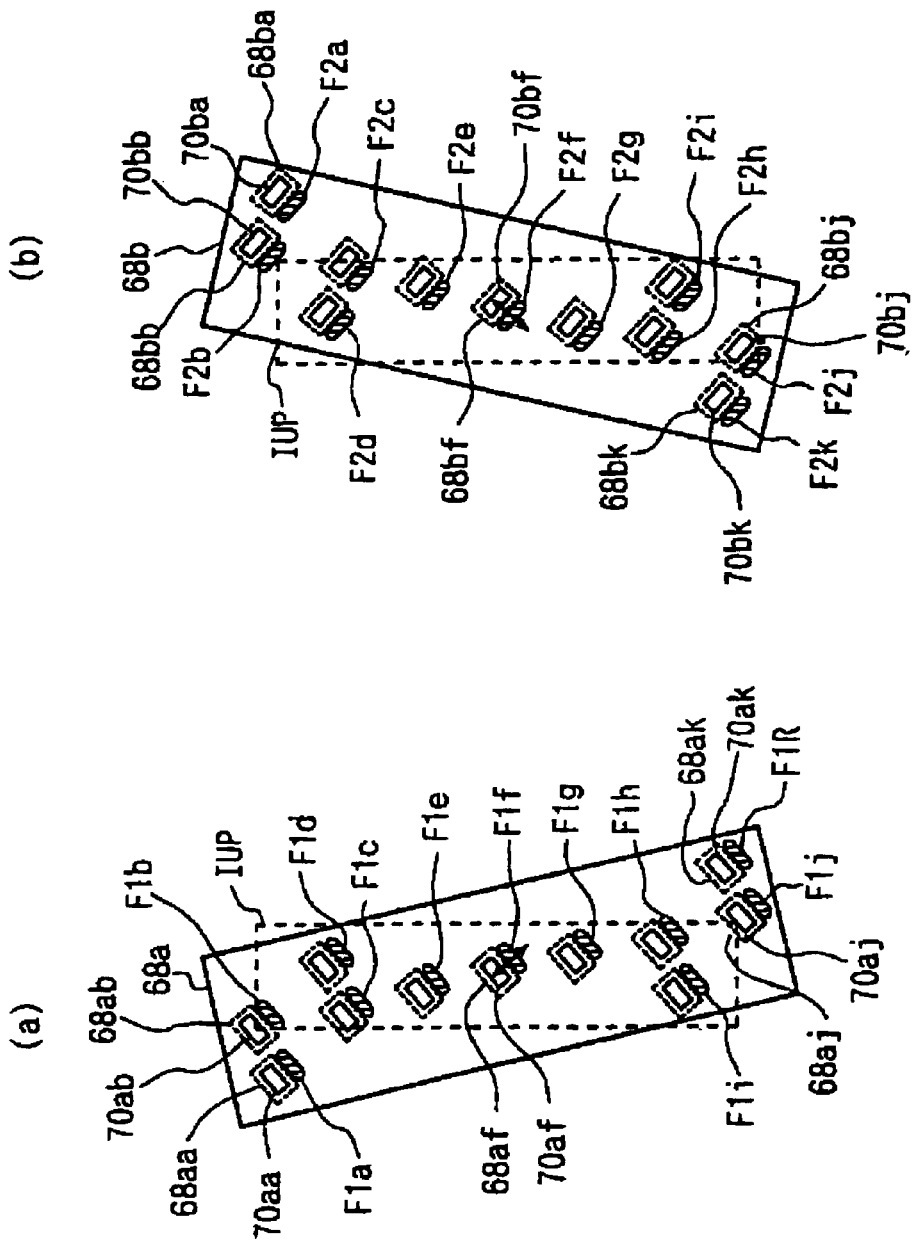
FIG. 17($a$) is a drawing showing the light-receiving sensor 68$a$ of FIG. 2.

As shown in FIG. 17($b$), slit-shaped apertures 70$ba$ to 70$bk$ are formed in the light-receiving surface of the light-receiving sensor 68$b$ also, near the refocused slit images F2$a$ to F2$k$. At the bottoms of these apertures 70$ba$ to 70$bk$ are fixed mutually independent photodetectors 68$ba$ to 68$bk$, and the detection signals of these photodetectors 68$b$ a to 68$bk$ are supplied in parallel to the signal processing control system 72 of FIG. 3. The signal processing control system 72 is used in common with the first AF sensor, and the plurality of focus signals obtained by rectifying these detection signals synchronously with the driving signals of the vibrating mirror 57 are supplied to the control device 110 of FIG. 1. As with the first AF sensor, immediately after performing calibration using the TTR AF sensor 8–10, 17, the levels of these focus signals are approximately proportional to the amount of defocusing of the image plane at each of the center points in the areas in which each of the slit images F2$a$ to F2$k$ in FIG. 4($b$) are projected, that is, the measurement points.

The optical member 64b to the light-receiving sensor 68b and the harbing 51b of FIG. 3 form a light-receiving system, and this light-receiving system and the signal processing control system 72 form a light-receiving detection system 118b. The two-axis light-transmission system 117a, 117b of this example is fixed on a common support base (not shown), and the two-axis light-receiving system in the two light-receiving detection systems 118a, 118b is also fixed to a common support base (not shown). As one example, a frame (column) holding the projection optical system 11, or a member provided integrally with this frame, may be used as the common support base of the light-transmission system, or of the light-receiving system, or of both. The calculation unit within the control device 110 of FIG. 1 can calculate the average defocusing amount of the image plane from the surface of the wafer 7 within the exposure area IU and the average shift in inclination angle by, for example, processing by the least-squares method the plurality of defocusing amounts detected by the second AF sensor 117b, 118b. By driving the Z-tilt stage 3 such that these defocusing amounts and shifts in inclination angle cancel, the image plane can be focused on the surface of the wafer 7 in the exposure area IU.

In this way, by using in this example either the first oblique-incidence AF sensor 117a, 118a or the second AF sensor 117b, 118b, auto-focusing can be employed to focus the image plane of the projection optical system 11 on the surface of the wafer. In this example, these two oblique-incidence AF sensors are used to perform calibration of drift and other measurement errors in measurement values originating in thermal deformation or other causes in the optical systems of the AF sensors themselves. Here, the above first inverting optical system (the mirror 61a and two-face reflecting member 61b), and the second inverting optical system (the two-face reflecting member 66a and the mirror 66b) play the role of separating the drift. Below, the principle of this calibration, and a specific method therefor, are explained.

First, the vibration direction of slit images on the wafer using the first and second oblique-incidence AF sensors is explained, referring to FIG. 5.

FIG. 5 is a schematic view showing part of the light transmission system 117a, 117b of FIG. 2 and FIG. 3. In FIG. 5, a beam splitter BSV is arranged virtually to show that the slit images F1a to F1k and slit images F2a to F2k are projected in different directions. In FIG. 5, an aperture pattern 54P is formed on the illumination slit 54a, and an aperture pattern which is axially symmetric with the aperture pattern 54P is formed on the illumination slit 54b. Illumination light which has passed through these aperture patterns is caused to vibrate in the direction VD of the short edge of the common slit-shaped aperture patterns 54Pa to 54Pk by the vibrating mirror 57, as shown in the aperture pattern 54P'. Illumination light F1 from one of the illumination slits 54a projects slit images F1a to F1k onto the wafer 7 from the projection direction D1, via the optical system from the relay system 58a to the optical member 63a, and illumination light F2 from the other illumination slit 54b projects slit images F2a to F2k onto the wafer 7 from the projection direction D2, via the optical system from the relay system 58b to the optical member 63b.

Here, the illumination light F1 passes through the mirror 61a (FIG. 2) which is part of an inverting optical system, and so the vibration direction VD1 of the slit images F1a to F1k is reversed from the vibration direction VD of the aperture pattern 54P'. However, because the illumination light F2 passes through the two-face reflecting member 61b (FIG. 3) which is part of the first inverting optical system, the vibration direction VD2 of the slit images F2a to F2k is the same as the vibration direction VD of the aperture pattern 54P'. The effect of this operation is explained, referring to FIG. 6, for the example of slit images F1f, F2f illuminating the same measurement point.

FIG. 6(a) is an expanded view showing the slit images F1f, F2f of FIG. 5 on the wafer 7. In FIG. 6(a), conjugate images of the slit-shaped apertures 70af and 70bf (also called apertures 70af, 70bf) corresponding to the light-receiving sensors 68a, 68b of FIG. 17 are also shown. As indicated in FIG. 6(a), the slit images F1f, F2f vibrate in sync on the corresponding apertures 70af, 70bf respectively, and signals obtained by photoconversion of the quantities of light on these apertures 70af, 70bf are synchronously rectified by the driving signals of the vibrating mirror 57 of FIG. 5 to obtain the focus signals corresponding to the slit images F1f, F2f. However, because the vibration direction VD1 of slit F1f (illumination light F1) and the vibration direction VD2 of slit F2f (illumination light F2) are inverted, as shown in FIG. 6(b) and (c), if the image plane is essentially focused on the surface of the wafer 7, the signs of the two focus signals obtained by synchronous rectification are opposite.

In FIG. 6(a), the slit images F1f, F2f are represented as intersecting orthogonally; but in actuality the two intersect at a small angle of intersection. The vibration directions of the two are essentially opposite. This is also true in FIG. 7 and FIG. 8, described below. The curves dF1 and dF2 in FIG. 6(c) represent vibration with phase inverted from that of the illumination light F1 and F2 (opposite phase); the horizontal axis in FIG. 6(c) is time t, and the vertical axis is the displacement Fd on the wafer 7.

Figure 6:
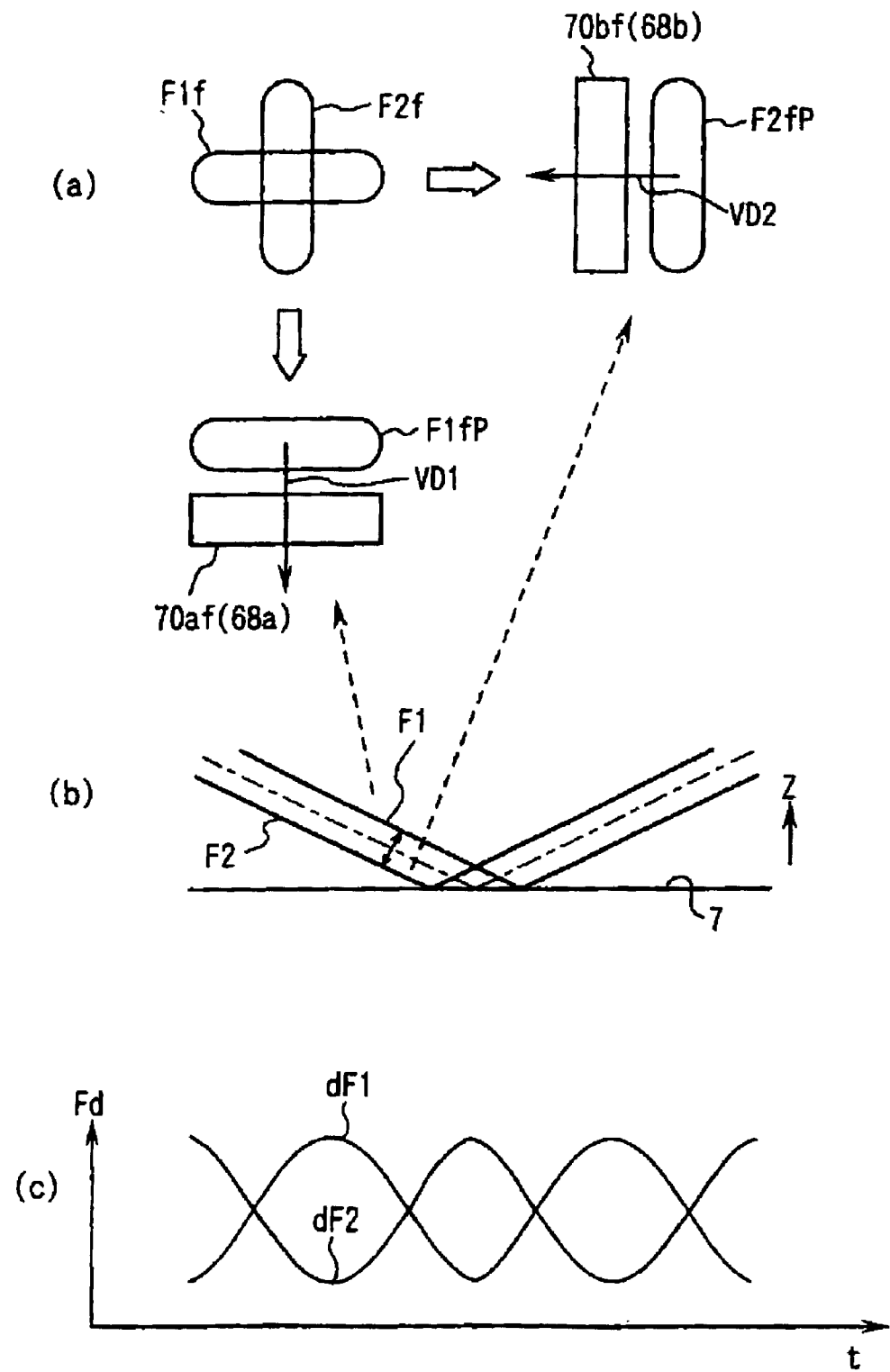
FIG. 6 is a drawing showing the state of vibration of two slit images projected onto the same measurement point from the first and second oblique-incidence AF sensors.
Figure 7:
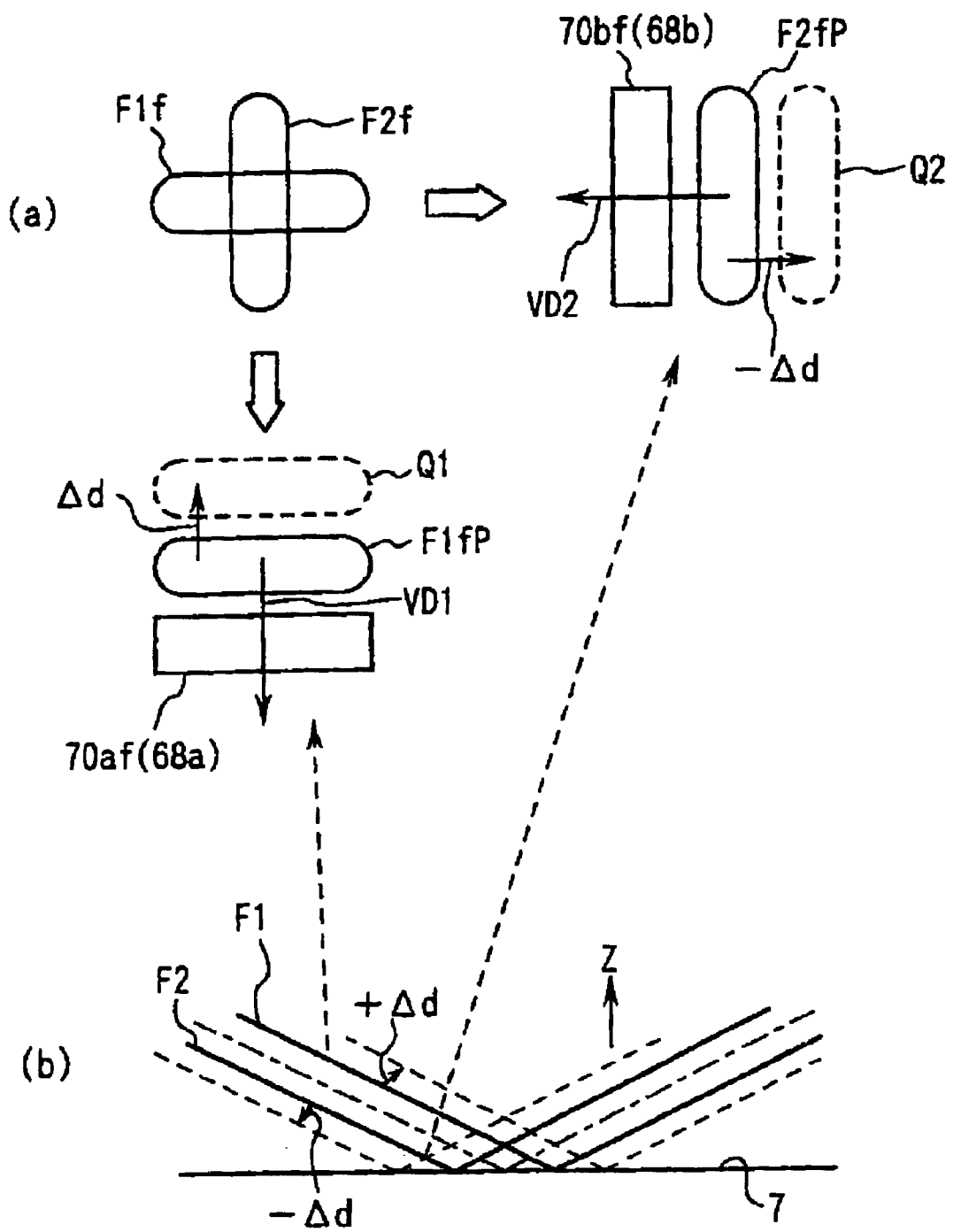
FIG. 7 is a drawing showing the state of motion in opposite directions, due to modification of the optical system or similar, of two slit images projected onto the same measurement point from the first and second oblique-incidence AF sensors.

Drift in measurement values is explained, referring to FIG. 7, for the state of FIG. 6, for the case in which certain optical members in the optical system up to the lens 60a of FIG. 2 and in the optical system up to the lens 60b in FIG. 3 are displaced in the same direction. For example, if thermal deformation or some other factor causes the angle of vibration of the vibrating mirror 57 of FIG. 2 to change by an angle equivalent to a displacement Δd on the wafer (this displacement is as seen from the light-receiving detection system 118a, 118b), the positions of the slit images F1f and F2f at a certain time are moved by Δd and −Δd respectively, and move to the positions Q1 and Q2, indicated by dotted lines. In actuality, the slit images F1f and F2f vibrate in opposite directions on essentially a straight line, as shown in FIG. 5, so that on the wafer 7 it appears that the illumination light F1 and F2 moves in mutually opposing directions by an amount Δd, as shown in FIG. 7(b).

On the other hand, in the state of FIG. 6, in the case it that the focus position in the wafer plane is displaced by an amount ΔZh as shown in FIG. 8(b), the illumination positions of the illumination light F1, F2 are moved by amounts Δh as seen from the light-receiving optical system 118a, 118b, indicated by the positions F1', F2' respectively. If the angle of incidence of the optical axes of the illumination light F1, F2 on the wafer plane is θ, then the following relation obtains.

$$\Delta h = 2 \cdot \Delta Zh \cdot \sin \theta \tag{1}$$

Figure 8:
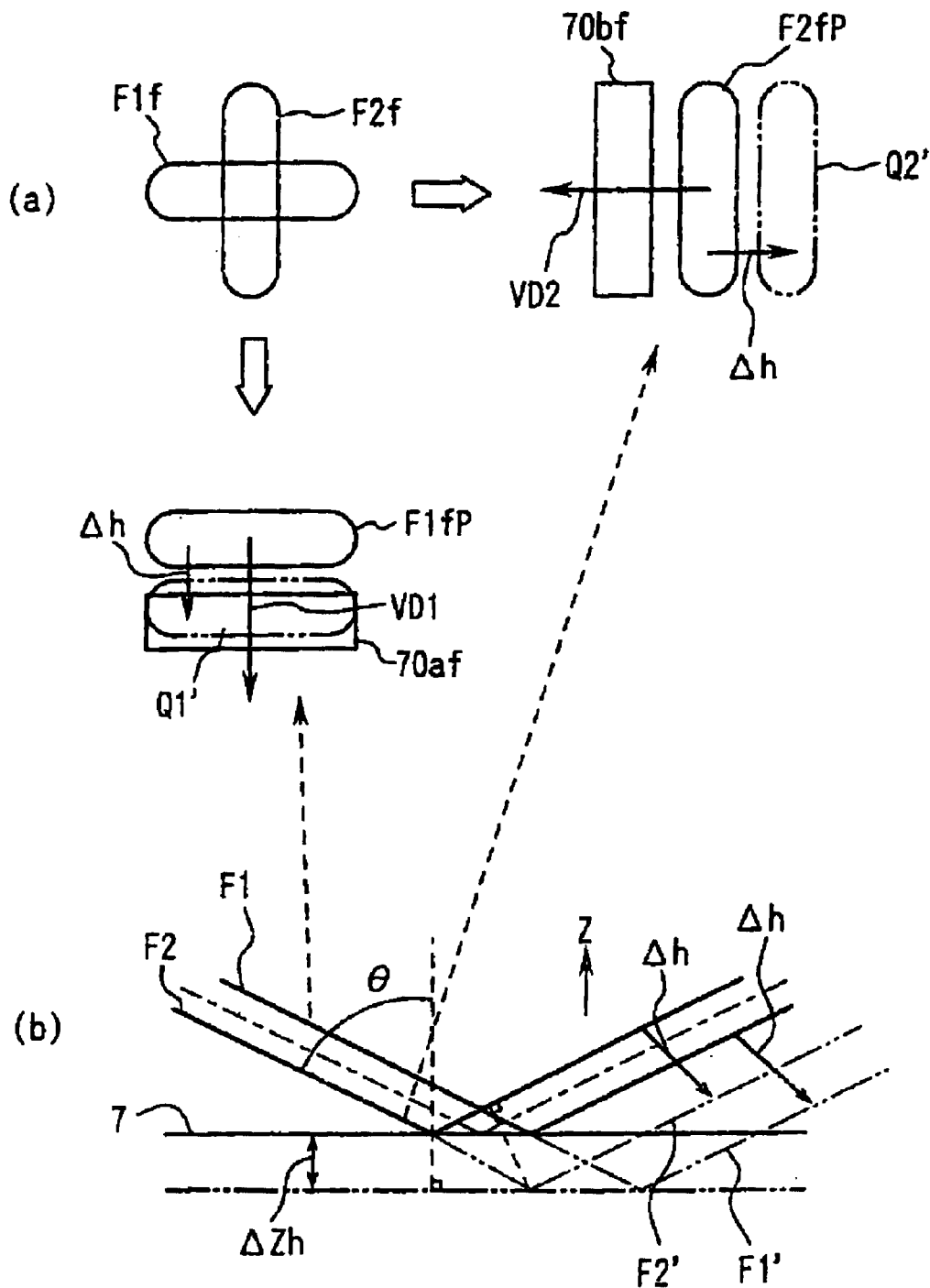
FIG. 8 is a drawing showing the state of motion in the same direction, due to variation in the focus position of the surface for detection, of two slit images projected onto the same measurement point from the first and second oblique-incidence AF sensors.

As shown in FIG. 8(a), the positions of the slit images F1f and F2f move an amount Δh in the same direction, to the positions Q1' and Q2' indicated by the dotted lines. In actuality, a value obtained by multiplying the displacement (here represented by x) on the wafer surface of the slit images as seen from the light-receiving detection system 118a, 118b by a coefficient k (=1/(2·sin θ)) becomes the measurement value for the focus position on the wafer surface; but for simplicity, in the following the displacement on the wafer surface is taken to be the, measurement value of the focus position. Hence combining the states of FIG. 7 and FIG. 8, if Δh is the displacement due to the change in the actual focus positions on the wafer 7, and if Δd is the displacement due to the change in angle of the vibrating mirror 57, then the measurement value Δfd1 of the focus position for the slit image F1f changes by (Δh+Δd), and the measurement value Δfd2 of the focus position for the slit image F2f changes by (Δh−Δd). That is, in the state of FIG. 6, if it is assumed that adjustments are made such that Δfd1=Δfd2, then the average value of both measurement points <Δf>, and the average value δf of the difference between the two measurement values, are as follows.

$$<\Delta f>=(\Delta fd1+\Delta fd2)/2=\{(\Delta h+\Delta d)+(\Delta h-\Delta d)\}/2=\Delta h \quad (2)$$

$$\delta f=(\Delta fd1-\Delta fd2)/2=\{(\Delta h+\Delta d)-(\Delta h-\Delta d)\}/2=\Delta d \quad (3)$$

In other words, the average value <Δf> of the focus positions Δfd1, Δfd2 measured using the two illumination light beams F1, F2 (the slit images F1f, F2f) projected onto the same measurement point represents the actual amount of change in the focus positions on the surface of the wafer 7, and the average value δf of the difference between the focus positions Δfd1, Δfd2 represents the drift Δd in the measurement values arising from irregular displacements or similar in the optical members of either of the first or second oblique-incidence AF sensors. Hence by using the two illumination light beams F1, F2 illuminating the same measurement point, drift in the measurement values arising from optical members of the oblique-incidence AF sensors 117, 118, and the change in the actual wafer focus position, can easily and accurately be separated.

In this example, as shown in FIG. 2 and FIG. 3, a second inverting optical system is employed, consisting of the two-face reflecting member 66a of the first AF sensor and the mirror 66b of the second AF sensor. By this means, even in cases when for example displacement occurs due to thermal deformation in part of the lens 67a and harbing 51a or in the lens 67b and harbing 51b, and is accompanied by drift Δd occurs in the measurement value of the focus position, by determining the average value <Δf> and the average δf of the difference in the measurement values for the illumination light F1, F2 based on the above eqs.(2) and (3), the drift alone can be accurately separated.

Figure 9:
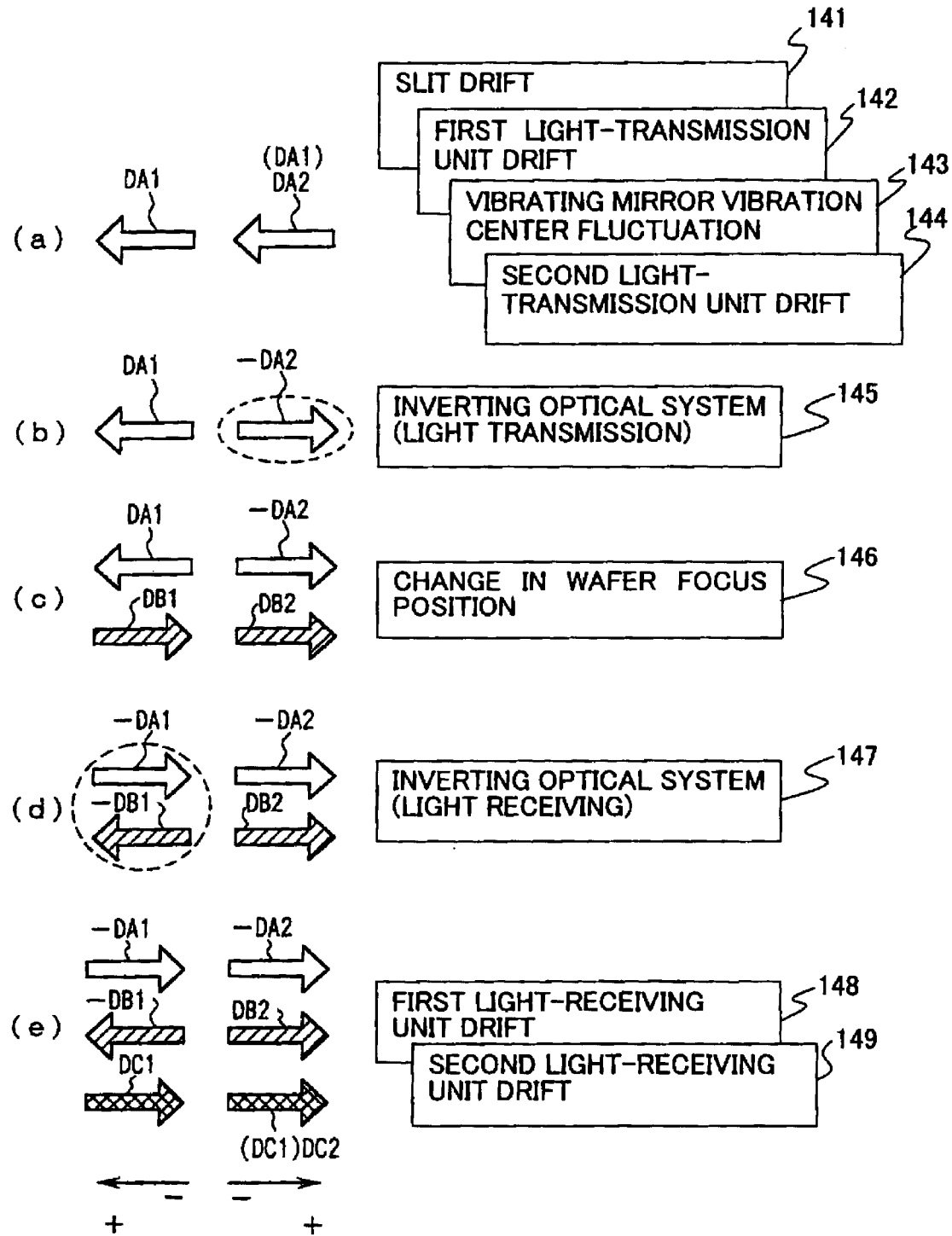
FIG. 9 is a drawing used to explain the action of the first and second inverting optical systems positioned within the first and second oblique-incidence AF sensors.

The above principle of the method for separating drift in measurement values is here summarized, referring to FIG. 9. In FIG. 9(a), if, among the first or second oblique-incidence AF sensors 117, 118, there occurs drift in the illumination slits 54a, 54b (block 141); fluctuations in the vibration center of the vibrating mirror 57 (block 143); drift in the optical members of the first light-transmission system 117a (block 142); or drift in the optical members of the second light-transmission system (block 144); then if the above first inverting optical system is absent, then the illumination light F1 of the first AF sensor of FIG. 2 and the illumination light F2 of the second AF sensor of FIG. 3 move in the same direction on the wafer, indicated by the arrows DA1 and DA2 in the figure.

The following FIG. 9(b) shows that the illumination light F1 and F2 vibrate in the opposite directions as indicated by the arrows DA1 and −DA2, as a result of placing in the light-transmission system a first inverting optical system (the mirror 61a and two-face reflecting member 61b) (block 145). FIG. 9(c) shows that, by changing the wafer focus position (block 146), the illumination light F1 and F2 move in the same direction, as indicated by the arrows DB1 and DB2. FIG. 9(d) shows that, by placing in the light-receiving system a second inverting optical system (the two-face reflecting member 66a and mirror 66b) (block 147), the direction of motion of the illumination light F1 due to drift, and the direction of motion due to changes in the focus position are reversed, as indicated by the arrows −DA1 and −DB1. And FIG. 9(e) shows that, when drift occurs in the optical members of the first light-receiving system 118a (block 148) and when drift occurs in the second light-receiving system 118b (block 149), the images of the illumination light F1 and F2 move in the same direction, as indicated by the arrows DC1 and DC2.

In FIG. 9(e), if the left direction of the illumination light F1 is the + direction, and the right direction of the illumination light F2 is the + direction, then overall the vibration directions of the images of the illumination light F1 and F2 are the same for changes in the wafer focus position, and are reversed for drift in optical members. Hence by substituting the measurement values Δfd1 and Δfd2 for focus positions measured using illumination light F1 and F2 respectively into eqs.(2) and (3), changes in the actual focus position and drift can be accurately separated.

As explained above, projection of the slit image F1f of the first AF sensor and of the slit image F2f of the second AF sensor, and measurement of the respective focus positions, can be performed even during exposure of the wafer 7. However, in order to perform more stable measurements, for example the reference mark member 8 can be moved to the exposure area of the projection optical system of FIG. 1 while the wafer is changed, and the slit images F1f, F2f projected simultaneously onto the surface of the reference mark member 8 and the respective focus positions measured.

It is desirable that the drift Δdd and Δdi also be separated for the measurement values at other common measurement points in FIG. 4(c), that is, at the measurement points at which the slit images F1d, F2d are projected, and at the measurement points at which the slit images F1i, F2i are projected. By for example averaging these drifts Δd, Δdd, Δdi (or by interpolating), the measurement point drift Δd' at each of the measurement points on which the slit images F1a to F1k and slit images F2a to F2k are projected can be determined. Where the measurement point drift thus determined is concerned, by for example performing offset correction in the control device 110 of FIG. 1 in which the value Δd' is subtracted from each measurement point of the first AF sensor and the value Δd' is added to each measurement point of the second AF sensor, all the measurement values for the first and second AF sensors have the drift Δd' removed. Apart from this, the angles of the harbing 51a for optical axis adjustment of FIG. 2 and of the harbing of FIG. 3 may be changed, so that the drift Δd' of the measurement values cancels. Subsequently, the effect of this drift Δd' is removed, and so the first and second oblique-incidence AF sensors can be used to focus the image plane on the wafer surface with higher precision.

At this time, the first and second oblique-incidence AF sensors can be used without interrupting, the exposure process, so that when determining the drift Δd' there is almost no reduction in the throughput of the exposure process.

Based on the above eq.(2), at the common measurement points on which are projected the slit images F1d, F1f, F1i and the slit images F2d, F2f, F2i as in FIG. 4(c), the average value of measurement values of the first and second oblique-incidence AP sensors may be taken as the focus position. The drift of the measurement values of the AF sensors is removed from these measurement values, and so the wafer focus position can be detected with high precision, without correcting for drift at these common measurement points.

In this example, the first inverting optical system 61a, 61b and the second inverting optical system 66a, 66b are positioned midway between the respective light-transmission systems 117a, 117b and the light-receiving detection systems 118a, 118b; but it is desirable that these inverting optical systems be positioned as close to the wafer 7 as possible. By positioning the inverting optical systems as close to the wafer 7 as possible, the drift in measurement values originating in displacement of a greater number of optical members can be detected.

Figure 10:
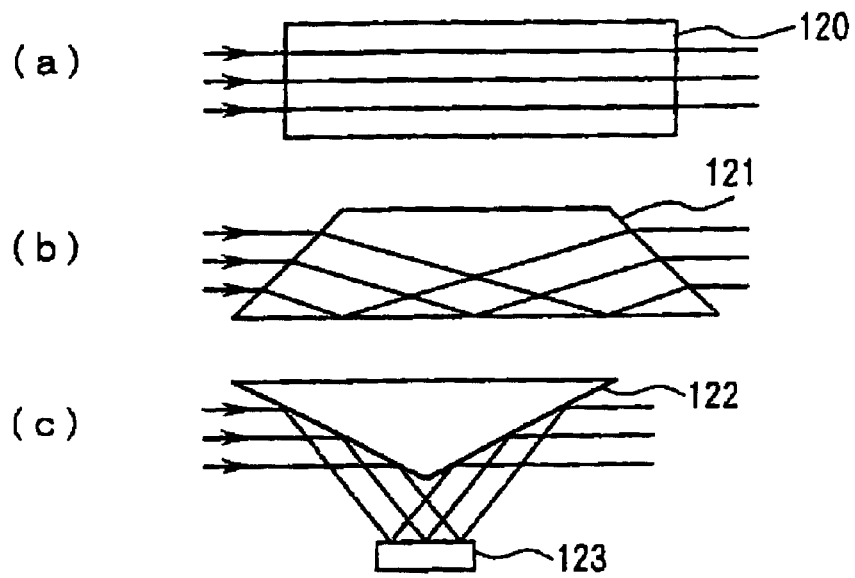
FIG. 10 is a drawing showing other examples of combinations of inverting optical systems.
Figure 11:
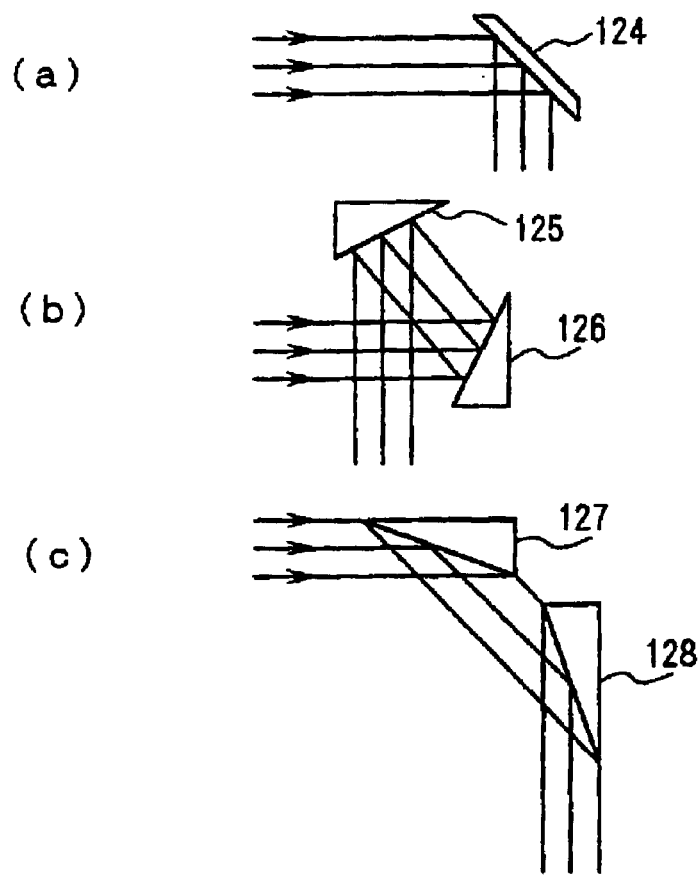
FIG. 11 is a drawing showing still other examples of combinations of inverting optical systems.

In the above aspect, as inverting optical systems, for example the mirror 61a of FIG. 2 (single-face reflecting member) and the two-face reflecting member 61b of FIG. 3 are combined; but in addition, combinations such as those of FIG. 10 or FIG. 11 may be used. That is, as an inverting optical system, a rod-shaped optical member 120 as shown in FIG. 10(a), neither concave nor convex, and a single-face reflecting member 121 with one face trapezoidal and causing a single reflection as in FIG. 10(b), or a combination of two optical members 122, 123 as in FIG. 10(c), as well as a combination with a three-face reflecting member causing three reflections, may be used. In addition, as inverting optical systems, the mirror 124 (single-face reflecting member) shown in FIG. 11(a) may be combined with a two-face reflecting member which combines the two optical members 125, 126 in FIG. 11(b) to cause two reflections, or with a two-face reflecting member which combines the two optical members 127, 128 as in FIG. 11(c) to cause two reflections.

As one of the optical members of such an inverting optical system, if the mirror 129 of FIG. 12(a) (single-face reflecting member), two-face reflecting member 130 of FIG. 12(b), or three-face reflecting member of FIG. 12(c) or other optical member performing an odd number of reflections is used, an optical member performing an even number of reflections may be used as the other optical member.

The operation when performing calibration of the measurement values of two oblique-incidence AF sensors during interval baseline checks in the above-described projection exposure apparatus of FIG. 1 is explained below, referring to the flow chart of FIG. 13 and to FIG. 14.

Figure 13:
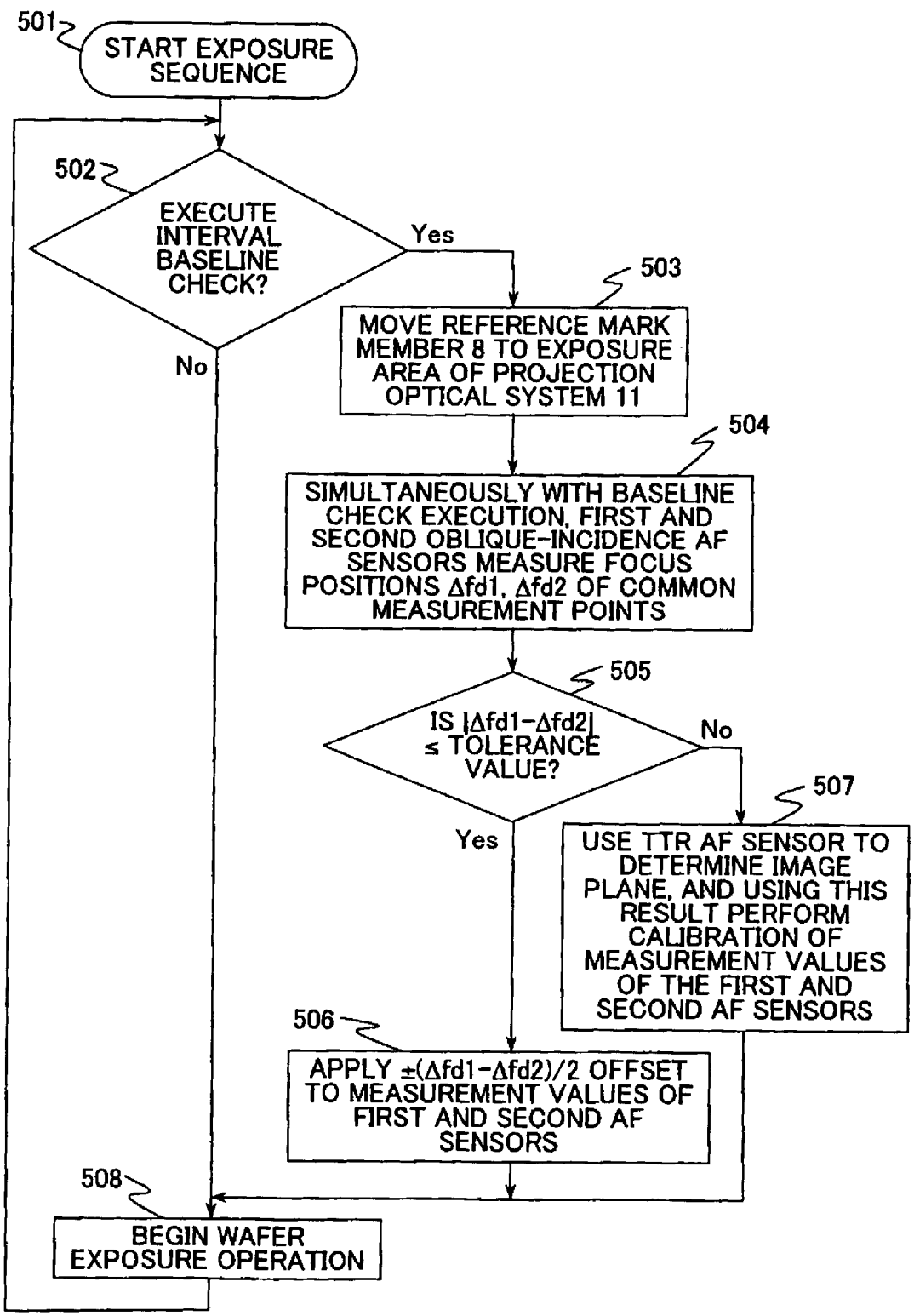
FIG. 13 is a flow chart showing one example of operation, in this aspect, for the case of performing calibration of an oblique-incidence AF sensor, when performing an interval baseline check.

First, in step 501 of FIG. 13, after the sequence for exposure of a plurality of wafers to a reticle pattern has been started, in step 502 a decision is made as to whether to perform an interval baseline check; when this is to be performed, execution proceeds to step 503, and the surface of the reference mark member 8 is moved to the exposure area of the projection optical system 11 as shown in FIG. 1. At this time, the XY stage 2 is positioned such that the centers of the reference marks 8b, 8e in FIG. 15(b) essentially coincide with the centers of the alignment marks 43A, 43B respectively of the reticle 12 in FIG. 1. In this state, in step 504, the RA microscope including the image-capture element 15, and the wafer alignment sensor 160, are used to execute measurement of the baseline amount of the wafer alignment sensor 160 (baseline check).

In this example, in parallel with this baseline check operation, at a common prescribed measurement point in FIG. 4(c) on the surface of the reference mark member 8, for example the illumination point of the central slit image F1f, the focus position $\Delta fd1$ is measured via the first oblique-incidence AF sensor 117a, 118a of FIG. 2; simultaneously, at the illumination point of the slit image F2f which is a common measurement point, the focus position $\Delta fd2$ is measured via the second oblique-incidence AF sensor of FIG. 3. In the following step 505, the control device 100 of FIG. 1 calculates twice the value of eq.(3), that is, the quantity $2\cdot\delta f=(\Delta fd1-\Delta fd2)$, which is twice the drift of the measurement values, and determines whether the absolute value of the result is less than a tolerance value. The tolerance value is set at a prescribed value, for example, smaller than the width of the focal depth of the projection optical system 11. If the absolute value of $2\cdot\delta f$ is greater than this tolerance value, execution is transferred to step 507, and the control device 110 uses a TTR AF sensor 8–10, 17 to determine the image plane of the projection optical system 11 as described above, and in the state in which the surface of the reference mark member 8 is aligned with the image plane, focus positions are measured at each of the measurement points of the first and second oblique-incidence AF sensors 117, 118, and calibration is performed such that the measurement values are each zero. Then, execution proceeds to step 508, and while performing exposure of one wafer, the first or second oblique-incidence AF sensor is used to perform focusing by the auto-focus method.

On the other hand, if in step 505 the absolute value of $2\cdot\delta f$ is lower than the tolerance value, then execution proceeds to step 506, and by applying offsets of $\pm\delta f$, that is, $\pm(\Delta fd1-\Delta fd2)/2$ to the measurement values of the first and the second oblique-incidence AF sensors respectively, calibration of these AF sensors is performed. Thereafter, operation proceeds to step 508. After completion of exposure of one wafer, a decision is made in step 502 as to whether to perform an interval baseline check; this interval baseline check is performed upon exposure of a prescribed number of wafers (for example, one wafer, two wafers, or some other number).

In this example, if for example performing an interval baseline check for every wafer, if for example Zf1 and Zf2 are the measurement differences in the focus positions on the wafer surface measured using the first and second oblique-incidence AF sensors for a single measurement point in FIG. 4(c) (for example, the illumination point of the slit images F1f, F2f), then the measurement difference Zf1 (or Zf2) changes as indicated by the curve 133A in FIG. 14(c). That is, the horizontal axis in FIG. 14(c) is the elapsed time t, and C1, C3 and so on represent the time at which exposure of the first wafer, the third wafer, and so on is ended. In FIG. 14(c), $\Delta Z$ is for example twice the value of the tolerance in step 505 of FIG. 13, and indicates that after completion of exposure of the first, the third, and the eighth wafer, the absolute value of the difference in the measurement values of the two AF sensors exceeds the tolerance value, and that the TTR AF sensor is used to execute calibration.

On the other hand, the curve 132 in FIG. 14(a) represents one example of the measurement error Zf1 (or Zf2) of an oblique-incidence AF sensor when performing calibration using a TTR AF sensor after the end of exposure of the xth (where x is for example one lot) wafer Cx. The curve 133 in FIG. 14(b) represents one example of the in measurement error Zf1 (or Zf2) of an oblique-incidence AF sensor when performing calibration using a TTR AF sensor upon exposure of each wafer. Whereas in the case of FIG. 14(a), there is the possibility that the measurement error of the focus position may exceed the focal depth, in the case of FIG. 14(b) the measurement error is small, but throughput is greatly reduced. However, in the case of FIG. 14(c) of this example, the frequency with which the TTR AF sensor is used is low, and so throughput is not greatly reduced, while the curve 133A is essentially equal to the curve 133. Thus measurement error is kept small, and highly precise focusing is always obtained.

Figure 18:
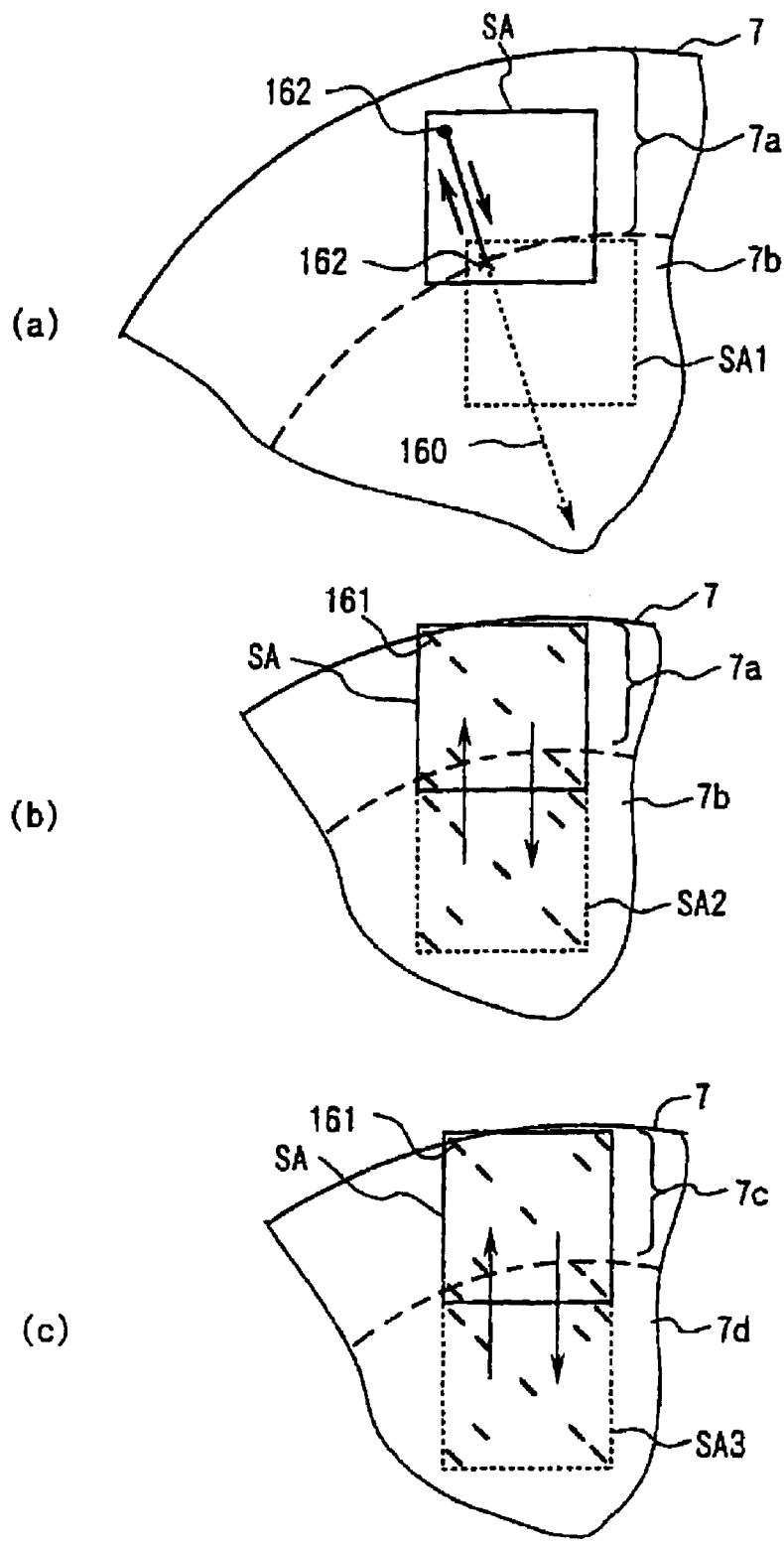
FIG. 18 is a drawing showing other examples of the focusing action of the aspect.

Next, another example of the focusing operation of the projection exposure apparatus of this example is explained, referring to FIG. 18. FIG. 18(a) through (c) show the rim part of a wafer 7 for exposure; in FIG. 18(a) and (b), the areas 7b enclosed by dotted lines toward the center of the wafer 7 are areas in which the wafer surface is essentially flat and focus positions can be measured with high precision by oblique-incidence AF sensors 117, 118, and in which focusing by the auto-focus method (including auto-leveling) based on this is possible. On the other hand, the ring-shaped areas 7a in the rim part are areas in which, for example, variations in the wafer thickness are comparatively large, so that wafer focus positions may fall outside the measurement range of the oblique-incidence AF sensors 117, fin 118, and it is difficult to perform focusing using the auto-focus method.

At this time, when exposure is performed in a shot area SA which extends into the areas 7a and 7b as shown in FIG. 18(a), and the shot area SA is moved into the exposure area of the projection optical system, suppose that of the plurality of measurement points for the focus position by the oblique-incidence AF sensors, the measurement point 162 farthest from the wafer center is in the area 7a. In this case, the wafer 7 is moved along the straight line 160 toward the wafer center such that the measurement point 162 is in the area 7b capable of auto-focus, so that the exposure area of a virtual projection optical system is over the rectangular area SA1 inscribing the outline of the area 7b, and oblique-incidence AF sensors are used to focus the image plane on the surface of the wafer 7 by the auto-focus method. Thereafter, the Z-tilt stage 3 of FIG. 1 is locked, and exposure is performed after returning the wafer 7 to its original position. By this means, focusing precision is improved in a shot area SA partially extending into the area 7a.

For a shot area which for example extends into the area 7a, where overall auto-focus operation is difficult, focusing is performed based on data for focus positions measured in a shot area at least part of which extends into the area 7b, and which was exposed immediately before. However, when the shot area to be exposed first is within the area 7a, as with the shot area SA, measurement points for the focus position are moved into the area 7b and focus position measurements are performed. By this means, comparatively high focusing precision is obtained without greatly lowering throughput.

In cases where a shot area SA at least part of which extends into area 7a is exposed, as shown in FIG. 18(b), as another method, a substitute shot area SA2 for performing focus position measurements using oblique-incidence AF sensors is found within the area 7b, and after moving this substitute shot area SA2 to the exposure area and performing focusing by the auto-focus method, the Z-leveling stage 3 may be locked, the shot area SA moved to the exposure area, and exposure performed. This substitute shot area SA2 is automatically selected as a shot area which is as close as possible to the shot area SA and is within the area 7b. In FIG. 18(b) and (c), the measurement point 161 is an example of placement of a measurement point for focus position measurement by oblique-incidence AF sensors.

Similarly, as shown in FIG. 18(c), for a shot area SA at least part of which extends into the area 7c in the rim part of the wafer 7 for which auto-leveling operation is difficult, a substitute leveling shot area SA3 within the area 7d for which auto-leveling operation is possible is found, this substitute leveling shot area SA3 is moved to the exposure area, and after aligning the angle of inclination with the image plane by the auto-leveling method, the angle of inclination of the Z-leveling stage 3 may be locked and the shot area SA moved to the exposure area, and exposure performed. In the auto-leveling method, control need not be performed in the scanning direction (in this example, the X direction), and control may be performed only in the non-scanning direction (in this example, the Y direction) intersecting the scanning direction. Hence in FIG. 18(c), the inclination angle of the Z-leveling stage 3 need be locked only in the non-scanning direction.

In the above aspect, the focus position of the wafer 7 is measured by oblique-incidence AF sensors 117, 118 for two axes; but separate two-axis oblique-incidence AF sensors may be used to measure the focus position of the reticle 12 of FIG. 1, and based on this measurement result, the Z-leveling stage 3 driven such that the wafer surface coincides with the fluctuating image plane. Or, an oblique-incidence AF sensor may be provided on the side of the reticle 12, and the position of the pattern surface (lower surface) of the reticle 12 with respect to the optical-axis direction (Z direction) of the projection optical system 11, and the angle of inclination (and if necessary, steps in the pattern surface) detected. At this time, the two-axis AF sensor shown in FIG. 2 and FIG. 3 may be used as the oblique-incidence AF sensor. A stage for focusing may also be provided on the side of the reticle stage 50 to control the focus position and inclination of the reticle 12, and the stage driven based on the measurement values of the AF sensor on the side of the reticle 12; or, instead of providing a stage for focusing on the reticle stage 50, the Z-leveling stage 3 may be driven based on both the measurement values of the AF sensor of the reticle 12, and the measurement values of the two-axis AF sensor.

The first and second AF sensors may share at least one component element, such as for example the light source, or may have completely separate configurations. The number of measurement points and their layout positions for the first and second AF sensors may be the same, or may be entirely different; it is only necessary that at least one measurement point be substantially set in the same position.

In the above aspect, an optical type projection exposure apparatus is used. Of course this invention can also be applied in the case of an EUV exposure apparatus which uses as exposure light soft X-rays or other extreme ultraviolet (EUV) light, or in the case of a charged-particle exposure apparatus which uses an electron beam, ion beam or other charged particle beam as the exposure beam, where an auto-focus method is used to control the focus position of the substrate for exposure.

Next, a second preferred aspect of this invention is explained, referring to FIG. 19 through FIG. 22. This example applies the present invention to a step-and-scan type projection exposure apparatus as a scanning exposure type apparatus.

Figure 19:
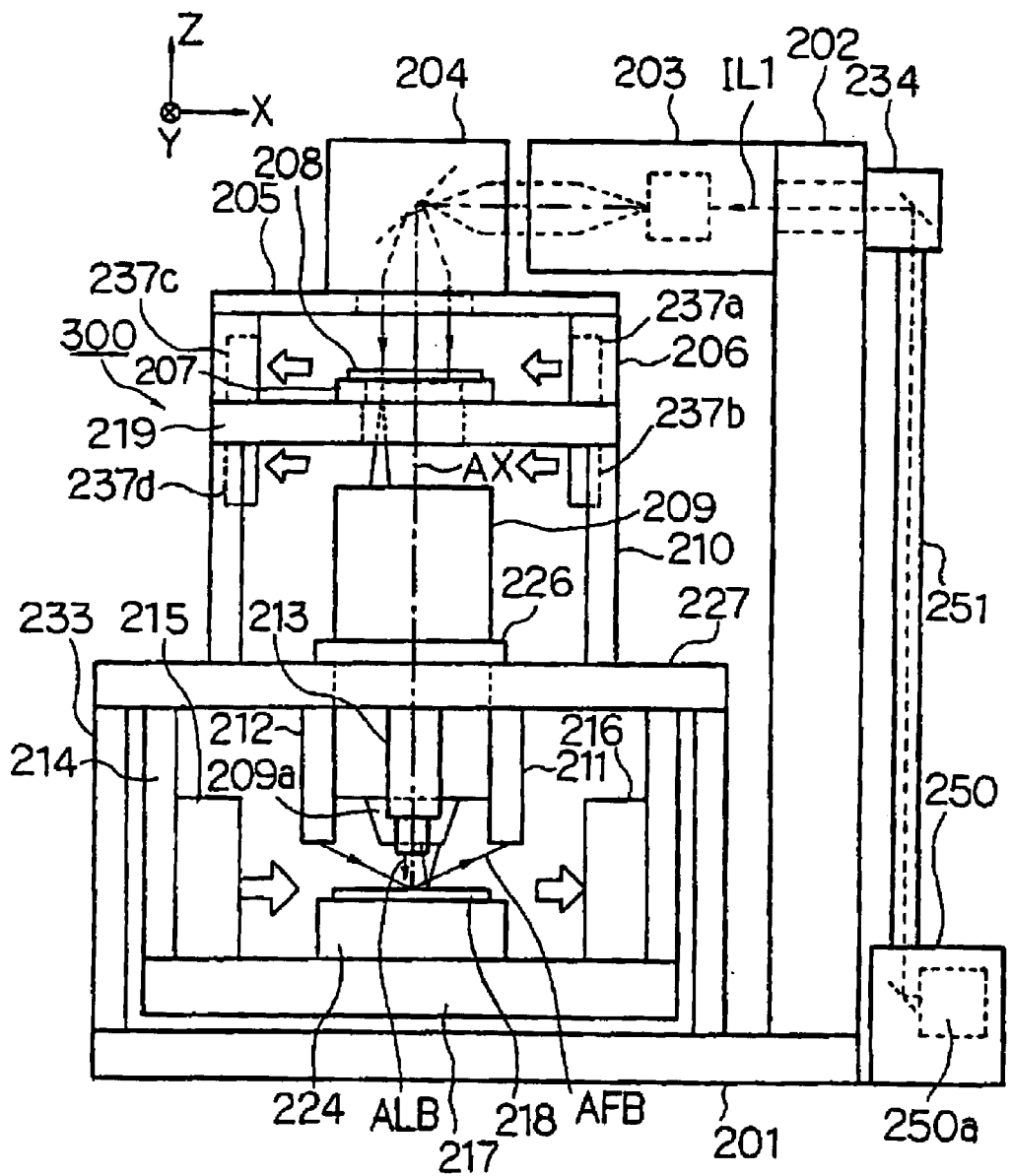
FIG. 19 is a schematic view showing one example of a projection exposure apparatus of an aspect of this invention.

FIG. 19 shows the projection exposure apparatus of this example. In FIG. 19, a base member 201 consisting of a thick sheet-shape foundation is installed on the floor in a prescribed cleanroom; to an edge of this base member 201 is fixed a long thin support 202, and an aperture is provided at the top end of the support 202; on a side of the support 202 are fixed a first illumination system unit 203 and an optical axis adjustment mechanism 234, so as to surround the aperture. On the right side of the support 202 is positioned an exposure light source 250 including an excimer laser light source 250a; illumination light (exposure light) IL1 for exposure, emitted from the exposure light source 250, passes through the relay optical system in the light-transmission system 251 and through the optical axis adjustment mechanism 234, and is guided to the illumination unit 203. For convenience in explanation, in FIG. 19 the support 202 and exposure light source 250 are positioned adjacently; but in actuality the exposure light source 250 is housed ina room separately from the room in which is housed the exposure main unit on the base member 201. The exposure light source 250 may for example be installed in a mechanical room below the floor on which the exposure main unit is installed.

As the excimer laser light source 250a, a KrF excimer laser light source, ArF excimer laser light source, or $F_2$ laser light source or similar can be used. However, this invention can also be applied to cases in which a YAG laser high-harmonic generation device, solid state laser light source, or mercury lamp or similar is used as the exposure light source 250. The individual members on the base member 201 are housed in a chamber, not shown, and an optical axis adjustment mechanism 234 is installed so as to protrude from the right-hand face of the chamber.

In FIG. 19, exposure light IL1 emitted from the first illumination system unit 203 illuminates the long thin illumination area IF (FIG. 20) on the pattern formation face of the reticle 208 via the second illumination system unit 204, with a uniform brightness distribution. The image of the pattern in this illumination area IF is reduced by a projection magnification β (where β is for example ¼, ⅕, and so on) via the projection optical system 209, and is projected onto the exposure area IFW (FIG. 21) on the surface of the wafer 218 covered with photoresist. The wafer 218 is a disc-shaped substrate of silicon or some other semiconductor, or of SOI (silicon-on-insulator) or similar. In the following explanation, the Z-axis is taken parallel to the optical axis AX of the projection optical system 209, and within the plane perpendicular to the Z-axis (in this example, the horizontal plane), the X-axis is taken parallel to the plane of the paper in FIG. 19, and the Y-axis is taken perpendicular to the plane of the paper in FIG. 19. The exposure area IFW in this example is a long thin rectangle, and the scanning direction of the reticle 208 and wafer 218 during scanning exposure is the Y direction.

First, a plate-shape support member 227 is mounted on anti-vibration tables in for example three or four places on the left side of the support 202 on the base member 201. The projection optical system 209 is installed, via a flange 226, in the aperture at the center of the support member 227. The anti-vibration table 233 is an active-type anti-vibration table, comprising air pads and electromagnetic actuators for vibration; by for example mounting a plurality of acceleration sensors on the support member 227, and driving the electromagnetic actuators in response to detection values of these acceleration sensors, vibrations transmitted through the base member 201 to the support member 227, and then to the exposure main unit, as well as vibrations generated as a result of stage driving or other phenomena in the exposure main unit, can be rapidly attenuated.

On the bottom face of the support member 227 is hung a plate-shaped wafer base 217 via for example four first columns 214, so as to enclose the lower part of the projection optical system 209. In a state with no vibrations, the upper face of the wafer base 217 is parallel to the horizontal plane (XY plane), and on the wafer base 217 is mounted, via an air bearing, a water stage 224, freely movable in the X and Y directions. On the wafer stage is held by suction the wafer 218 via a wafer holder, not shown. The wafer stage 224 is driven in the X and Y directions on the wafer base 217 by for example a linear motor. However, this linear motor consists of a mover fixed to the wafer stage 224 and a stator fixed to a support member (not shown) fixed to the base member 201, in a configuration in which almost no load is born by the wafer base 217. Instead of hanging the wafer base 217 from the support member 227 via the first columns 214, the wafer base 217 may be placed on the base member 201 via an active-type anti-vibration table provided separately from the anti-vibration table 233. In addition, a plurality of wafer stages 224 may be provided, in order to increase the number of wafers exposed in unit time and improve throughput.

In the wafer stage 224 is incorporated a Z-tilt mechanism (including the Z-leveling stage 3 of FIG. 1) to control the focus position (Z-direction position) and inclination angle of the wafer 218. Two perpendicularly intersecting sides of the wafer stage 224 are finished to mirror surfaces 224x, 224y (FIG. 21), and a measurement beam from a laser interferometer irradiates these mirror surfaces as perpendicularly intersecting movable mirrors to measure the position and rotation angle of the wafer stage 224 in the X and Y directions; based on this measured value, a stage control system, not shown, controls the position and velocity of the wafer stage 224.

In FIG. 19, adjacent to the side of the projection optical system 209 on the bottom face of the support member 227 are installed a pair of optical-type oblique-incidence auto-focus sensors (hereafter "AF sensors 211, 212") consisting of a light-transmission system 212 and light-receiving system 211, and an off-axis type alignment sensor 213, for example of the image-processing type. The light-transmission system 212 projects slit images onto a plurality of measurement points in the exposure area and nearby areas on the wafer 218 using a detection light AFB, and the light-receiving system 211 receives the light reflected from this plurality of measurement points, refocuses these slit images, and generates a focus signal which indicates the amount of defocusing from the image plane of the measurement points corresponding to the lateral shift of the refocused slit images. A stage control system, not shown, focuses the image plane of the projection optical system 209 in the exposure area on the wafer 218 even during exposure, by driving the Z-tilt mechanism within the wafer stage 224, using an auto-focus method based on the focus signal and an auto-leveling method.

The alignment sensor 213 illuminates the alignment mark (wafer mark) on the wafer 218 with illumination light ALB, and the image signals obtained by capturing the image of this mark are supplied to an alignment signal processing system, not shown. The alignment signal processing system performs position detection of the alignment mark based on these image signals, and from the position detection results uses, for example, the enhanced diagonal alignment (EGA) method to calculate array coordinates for each shot area on the wafer 218. The baseline amount, which is the interval between the detection center of the alignment sensor 213 and the center of the pattern image of the reticle 208 (exposure center), is determined in advance; based on the array coordinates for each shot area, corrected by this baseline amount, the wafer stage 224 is driven, to perform high-precision alignment.

A plate-shaped reticle base 219 is installed on the upper face of the support member 227, via for example four second columns 210 positioned to surround the projection optical system 209. In a state free of vibrations, the upper face of the reticle base 219 is also parallel with the horizontal plane, and on its upper face is placed via an air bearing a reticle stage 207, free to slide in the X and Y directions, and freely rotatable within a prescribed range. On top of the reticle stage 207 is held by suction the reticle 208. The reticle stage 207 is driven in the Y direction by a linear motor, with a stroke which is longer than the pattern area of the reticle 208. In the X direction or the rotating direction, the reticle stage is driven by actuators using linear motors, voice-coil motors or similar, so as to correct synchronization errors with the wafer 218. Here also, the linear motor consists of a mover fixed to the reticle stage 207, and a stator fixed to a support member (not shown) fixed to the base member 201, and configured such that almost no load is born by the reticle base 219.

The reticle stage 207 may consist of a coarse stage, driven at constant velocity in the Y direction (the scanning direction), and a fine stage, which, while holding the reticle 208, is driven in minute movements in the X direction, Y direction, and rotation direction with respect to the coarse stage. In order to shorten the time to change reticles during multiple exposure of a wafer and improve throughput, a plurality of reticle stages 207 may be provided; or, the reticle stage 207 may hold a plurality of reticles in the scanning direction.

Movable mirrors (not shown) are fixed to two sides, perpendicularly intersecting, of the reticle stage 207, and a measurement beam from a laser interferometer, not shown, is incident on these movable mirrors to measure the positions in the X and Y directions and the rotation angle of the reticle stage 207. Based on the measurement values, a stage control system, not shown, controls the position and velocity of the reticle stage 207.

On the reticle base 219 is installed a plate-shaped support member 205, via for example four third columns 206 installed so as to enclose the reticle stage 207; and a second illumination system unit 204 is placed so as to cover the aperture at the center of the support member 205. In this example, the exposure main unit 300 comprises the wafer base 217, wafer stage 224, first columns 214, support member 227, projection optical system 209, second columns 210, reticle base 219, reticle stage 207, third columns 206, and support member 205. By using the columns 214, 210, 206, the exposure main unit 300 has a multi-level construction. This exposure main unit 300 has no large driving mechanisms which become sources of vibrations, and is configured as an extremely stable stationary unit. Because the entirety of the exposure main unit 300 is fixed to the support member 227, when the exposure main unit 300 vibrates in the Z direction, the projection optical system 209, pattern formation face of the reticle 208, and wafer surface simultaneously vibrate by the same amount in the Z direction, so that the conjugate relation between the reticle and wafer is not disrupted.

During exposure, after moving the wafer stage 224 in step movements to move the shot area for exposure on the wafer 218 in front of the exposure area of the projection optical system, step-and-scan operations are repeated in which the wafer 218 is scanning in the −Y direction (or in the +Y direction) with velocity β•VR (where β is the projection magnification) via the wafer stage 224, in sync with scanning at velocity VR in the +Y direction (or the −Y direction) of the reticle 208 via the reticle stage 207, and the pattern image of the reticle 208 is scan-exposed in each shot area on the wafer 218. By means of scanning exposure, exposure can be performed in broader shot areas than the exposure areas of the projection optical system 209.

Next, the temperature control mechanism of the projection exposure apparatus of this example is explained in detail. The exposure main unit 300 of FIG. 19, the illumination system unit 204 of FIG. 2, the first illumination system unit 203 and support 202 are housed in a chamber, not shown; in this chamber, dry air or other gas, controlled to a prescribed target temperature and with chemical matter causing dust and clouding removed by a HEPA (high-efficiency particulate air filter) filter and chemical filter or similar, is supplied continuously by the down-flow method from blower outlets, for example in the ceiling, of an air-conditioning device for overall air conditioning. The supplied gas is returned to the air-conditioning device via, for example, exhaust outlets, not shown, positioned in the base member 201.

In order to compensate for the obstruction of this gas by the support members 205, 227 and the reticle base 219 and similar, a partial air-conditioning device 215, 216 in consisting of a blower mechanism 215 and exhaust mechanism 216 is positioned on the side of the wafer stage 224, and on the side of the reticle stage 207 also, a partial air-conditioning mechanism 237 consisting of blower mechanisms 237a, 237b and exhaust mechanisms 237c, 237d is positioned. The optical paths within the light source 250, light-transmission system 251, optical axis adjustment mechanism 234, and illumination system unit 203, 204 are sealed and supplied with gas which is transmissive to the exposure light IL1, and purging is performed so that this gas is maintained at the prescribed concentration.

FIG. 20(a) is a cross-sectional view showing the optical members, mainly in FIG. 19, from the optical axis adjustment mechanism 234 to the reticle 208. In FIG. 20(a), the exposure light IL1 from the exposure light source 250 of FIG. 19 passes through the relay optical system in the light-transmission system 251 and is incident on the optical axis adjustment mechanism 234. The optical axis adjustment mechanism 234 consists of a mirror 234b with variable inclination angle which bends the exposure light IL1 into the cover member 234a fixed to the support 202 and controls the angle within a prescribed range, and optical path-shifting members 234d, 234f, consisting of parallel glass plates with variable angle of inclination, which shift the optical path of the exposure light IL1 in a direction perpendicular to the optical path. The optical path within the cover member 234a is essentially completely sealed by an incident-plane window member 234e and by an emission-plane window member 234f; the interior is filled with gas which is transmissive to the exposure light IL1.

When the exposure light IL1 is KrF excimer laser light (wavelength 248 nm), transmissive gases include, for example, dry air with ozone removed. When the exposure light IL1 is ArF excimer laser light (wavelength 193 nm) or $F_2$ laser light (wavelength 157 nm), the transmissive gas may be for example nitrogen gas ($N_2$) or helium gas (He); when the wavelength of the exposure light IL1 is shorter than 150 nm, the transmissive gas is helium gas. In particular, helium gas is chemically stable and has a thermal conductivity approximately six times that of nitrogen gas, and the change in refractive index upon change of gas pressure is approximately ⅛ that of nitrogen gas, and thus offers the advantages of high cooling effectiveness and stability of optical characteristics in an optical system. Within the cover member 234a is positioned a gas concentration sensor (not shown) which seals the interior; when the concentration detected by this concentration sensor declines, the gas is supplied to purge the interior of the cover member 234a via a pipe, not shown.

Exposure light IL1 which has passed through the optical axis adjustment mechanism 234 passes through the aperture 202a of the support 202, and is incident on the first illumination system unit 203. The first illumination system unit 203 comprises, in order from the incident plane side on the inside of the cylindrical cover member 203a, an attenuator unit 238 comprising a variable ND filter which attenuates the quantity of light; a uniform-brightness optical system 239, including a relay lens and optical integrator (at least one among a fly-eye lens, internal-reflection type integrator, or DOE); an illumination aperture stop switching unit 240 capable of switching the aperture stop of the illumination system between a ring-shaped aperture, variable-illumination aperture, aperture with variable coherence factor (σ value), or similar; relay optical system 241; and variable reticle blind mechanism 242. This variable reticle blind mechanism 242 is placed at a position slightly defocused from the conjugate plane with respect to the pattern formation plane of the reticle 208; at the start and end of scanning exposure, by closing the illumination area IF on the reticle 208, the transfer of unnecessary patterns onto the wafer is prevented. The attenuator 238, illumination aperture switch unit 240, and variable reticle blind mechanism 242 are respectively linked to a light quantity variation driving unit 235, illumination aperture driving unit 236, and variable blind driving unit 247; these driving units 235, 236, 247 are supported by a support 202 via a frame, not shown. Between these driving units 235, 236, 247 and the support member, not shown, which supports the attenuator 238, is maintained a gap enabling the flow of gas.

The incidence face and emission face of the cover member 203a are each sealed by a window member, and the optical path of exposure light IL1 within the cover member 203a is also essentially completely sealed; this interior is also filled with gas which is transmissive for the exposure light IL1 (as described above, dry air with the ozone removed, nitrogen gas, helium gas, or similar). A concentration sensor 203b for the sealed gas is positioned within the cover member 203a; and this interior is connected, via a pipe 282 positioned along the support 202 and comprising valves 283A, 283B, to a gas tank 281 storing the gas, and for example in a different room. In this example, when the concentration of the gas detected by the concentration sensor 203b declines, by opening the valves 283A, 283B and supplying gas such that the leaked amount of gas is compensated, the optical path within the first illumination system unit 203 can be kept constantly filled with gas, without wasting gas.

On the other hand, the second illumination system unit 204 comprises, in order from the incidence face within the cylindrical cover member 204a, a fixed reticle blind 243 (fixed aperture stop); relay optical system 244; mirror 245 for optical path bending; and condenser lens system 246, with no driving mechanism present. The cover member 204a is fixed to the support member 205 of the exposure main unit 300 in FIG. 19. Because there are no driving mechanisms in the second illumination system unit 204, no vibrations or other adverse effects are applied to the exposure main unit 300. The incidence face on the side of the second illumination system unit 204 is sealed by a fixed reticle blind 243 which also serves as a window member; the emission face in the bottom face of the second illumination system unit 204 is sealed by a window member 204b, and the optical path of exposure light IL1 within the cover member 204a is also essentially completely sealed, and the interior filled with gas which is transmissive to the exposure light IL1. A concentration sensor 204c for the gas is positioned within the cover member 204a, and the interior is connected to a gas tank 281 by means of a pipe 284, positioned along the anti-vibration table 233 and columns 210, 206 of FIG. 19, and comprising valves 285A, 285B. The pipe 284 is supported near the center of gravity of the exposure main unit 300 (the position at which the rotational moment during vibrations is smallest), and configured such that this pipe 284 does not exert adverse effects on anti-vibration control.

In the second illumination system unit 204, when the concentration detected by this concentration sensor 204c declines, by opening the valves 285A, 285B and supplying gas so as to compensate for the amount of leaked gas, the optical path within can be continuously filled with transmissive gas. Hence because the brightness of the exposure light IL1 is always kept high, the time of exposure of the wafer can be made short, and the throughput of the exposure process is improved.

In FIG. 20(a), the partial air-conditioning mechanism 237, consisting of the blower mechanisms 237a, 237b on the side of the reticle stage 207 in FIG. 19 and the exhaust mechanisms 237c, 237d, is represented in a single room, virtually isolated. As shown in FIG. 20(a), gas A1 controlled at a target temperature and with dust and similar removed within the partial air-conditioning mechanism 237 is supplied to the reticle 208, in parallel with the pattern formation face. By this means, through the second illumination system unit 204 and the support member 205 of FIG. 19, worsening of air flow near the reticle 208 is eliminated, and the temperature of the reticle 208 is precisely maintained at the target temperature. Hence the magnification error of the image of the pattern of the reticle 208 on the wafer 218 is extremely small. And because fluctuations in the optical path of the measurement beam of the laser interferometer used with the reticle stage 207 are reduced, the precision of measurement of the position of the reticle stage 207 is improved.

The air A1 is for example dry air with ozone and chemical matter causing clouding removed; but if the wavelength of the exposure light IL1 is shorter than approximately 200 nm, because even dry air contains oxygen, absorbance is increased. However, because the optical path in air A1 is short, the amount of absorption of exposure light IL1 is low enough to pose almost no problem. Conversely, if nitrogen gas, helium gas or similar is supplied in place of air A1, because these gases, which are expensive compared with air, are used in large quantities, operating costs will be increased.

However, in order to raise the transmissivity with respect to the exposure light IL1, it is desirable that a highly transmissive gas such as nitrogen gas be used within the partial air-conditioning mechanism 237 as well. When the wavelength of the exposure light IL1 is near 150 nm, as in the case of $F_2$ laser light, and when the wavelength is shorter than 150 nm, it is desirable that nitrogen gas, helium gas or similar be temperature-controlled and supplied within the partial air-conditioning mechanism 237 also.

The partial air-conditioning mechanism 237 is connected to an air-conditioning device, for example located outside the chamber, by a pipe, not shown; this pipe is also positioned along the columns 210 of the exposure main unit 300 and the anti-vibration table 233, and supported near the center of gravity of the above, configured such that no effects are exerted on anti-vibration control.

In FIG. 20(a), a fixed reticle blind 243 is installed at the incidence plane of the second illumination system unit 204, which plane is at the boundary between the first illumination system unit 203 and the second illumination system unit 204 in this example. FIG. 20(b) shows, for simplicity, the state in which the mirror 245 for bending the optical path in the second illumination system unit 204 in FIG. 20(a) is omitted. In FIG. 20(b), the fixed reticle blind in the incidence plane of the second illumination system unit 204 is, for example, a shield film 243a covering the incidence face of a glass sheet with a slit-shaped aperture formed therein; this aperture and the illumination area IF of the reticle 208 are in a conjugate relation. Exposure light IL1 from the first illumination system unit 203 is incident on the aperture of the second illumination system unit 204 so as to cover it with some added margin. Here, even if for example the first illumination system unit 203 vibrates at a high frequency relative to the partial air-conditioning mechanism 237, as indicated by the two-dot-one-dash lines P1 and P2, the quantity of light incident on the aperture of the second illumination system unit 204 does not change. Hence there is no change either in the shape or position of the illumination area IF of the reticle 208, and a pattern image of the reticle 208 can always be transferred accurately onto the wafer.

Figure 22:
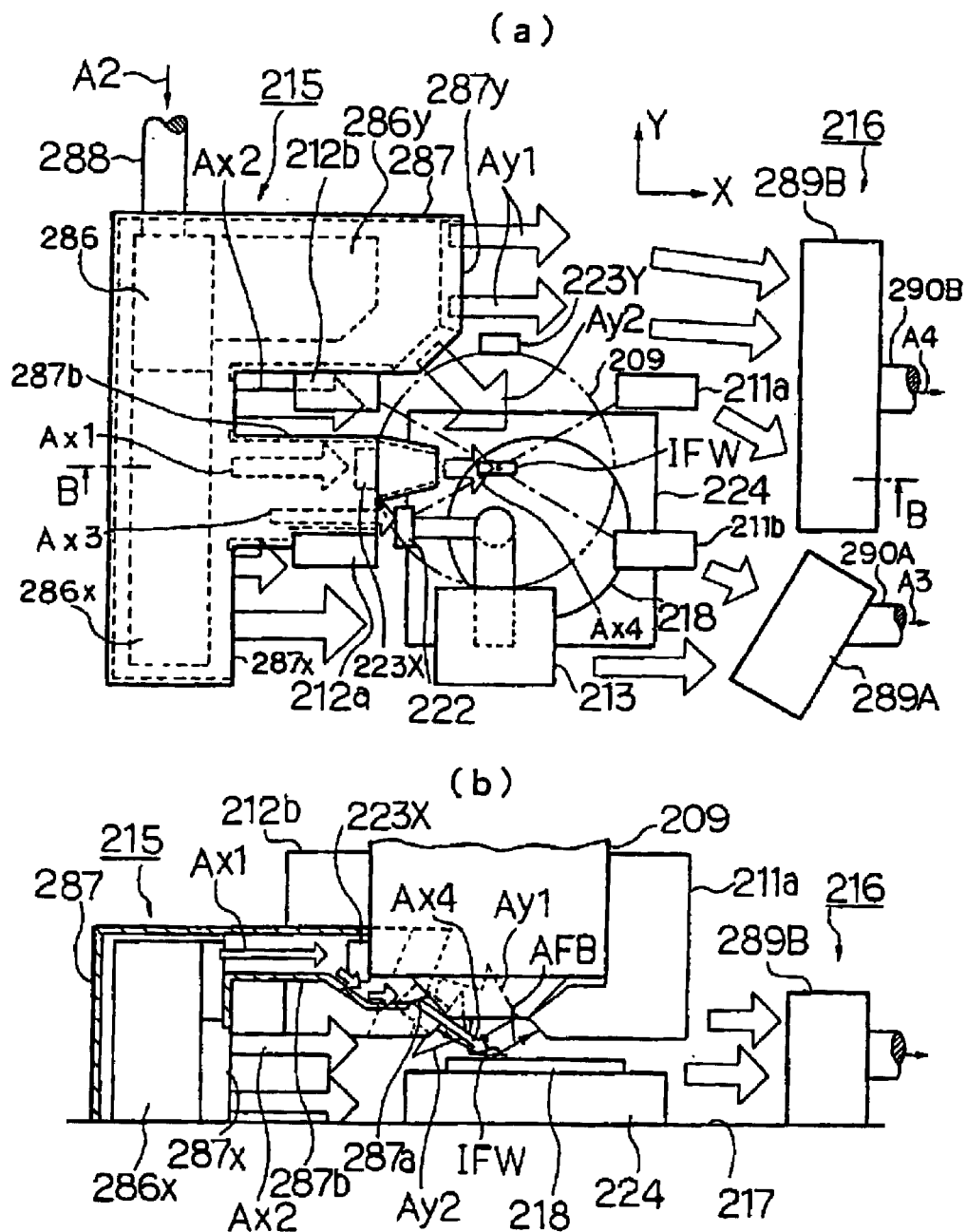
FIG. 22(a) is a plane view showing the partial air-conditioning mechanism on the wafer stage side.
FIG. 22(b) is a drawing showing in cross-section part of the members along line BB in FIG. 22(a)

Next, the air-conditioning mechanism on the side of the wafer stage 224 of FIG. 19 is explained, referring to FIG. 21 and FIG. 22.

FIG. 21(a) is a plane view showing the wafer stage 224 of FIG. 19; FIG. 21(b) is a front view which omits the light-transmission system 212a of FIG. 21(a). As shown in FIG. 21(a), there is an exposure area IFW, long in the X direction, at the center of the projection optical system 209 indicated by the two-dot-one-dash line and including the optical axis AX. In this exposure area IFW, and at the nearby plurality of measurement points, focus positions are measured by the AF sensors 212, 211 of FIG. 19. The AF sensors 212, 211 of FIG. 19 consist, as shown in FIG. 21(a), of a first AF sensor 212a, 211a comprising a light-transmission system 212a and light-receiving system 211a, and a second AF sensor 212b, 211b comprising a light-transmission system 212b and light-receiving system 211b. The light-transmission systems 212a and 212b project slit images by means of detection light AFB onto a plurality of measurement points along the directions D1 and D2, which intersect. The corresponding light-receiving systems 211a, 211b receive the light reflected from the plurality of measurement points and refocus each slit image, to generate focus signals corresponding to the amount of defocusing at each measurement point. That is, the first and second AF sensors are each oblique-incidence multiple-point AF sensors, and from the defocusing amount information at the plurality of measurement points, the average defocusing amount in the exposure area IFW on the wafer 218, and the average inclination angle with respect to the image plane, can be determined.

In this example, the first AF sensor 212a, 211a and the second AF sensor 212b, 211b emit detection light AFB in different directions; as a result, the sensors can be compactly positioned even in a configuration in which two AF sensors are used. Further, part of the measurement points of the first AF sensor and of the second AF sensor are common. By measuring defocusing amounts for common measurement points using the two AF sensors, and for example computing the differences of the measurement points, the drift in the measurement values of the AF sensors can be determined. The AF sensors 211, 212 of FIG. 19 have configurations similar to those of the AF sensors 117, 118 explained in the first aspect, and so a detailed explanation is here omitted.

As indicated in FIG. 21(b), the tip part 209a of the projection optical system 209 opposing the wafer 20B is narrow. The optical system of the tip parts of the AF sensor light-transmission systems 212a, 212b and light-receiving systems 211a, 211b is bent, and is positioned on the side of the tip part 209a of the projection optical system 209. Similarly, the tip part 213a of the optical system of the off-axis type alignment sensor 213 is bent, and is positioned on the side of the tip part 209a. The straight line connecting the center of the tip part 209a (detection center) and the center of the exposure area IFW (optical axis AX) is parallel to the Y-axis (scanning direction). Illumination light is emitted from the tip part 213a toward the mark for detection, and light reflected from the mark for detection is relayed to the image-capture element in the alignment sensor 213 via the tip part 213a.

As shown in FIG. 21(a) and (b), the side face in the −X direction and the side face in the +Y direction of the wafer stage 224 are each finished as mirror surfaces 224x, 224y to serve as movable mirrors; and the reference mirror 223X for the X-axis corresponding to the mirror 224x, and the reference mirror 223Y for the Y-axis corresponding to the mirror 224y, are fixed on the −X-direction side and +Y-direction side faces respectively of the projection optical system 209. Further, a reference mirror 222 having a reflective face substantially perpendicular to the X-axis is fixed via a support rod 221 on the side face on the −X direction side of the tip part 213a. A measurement beam 223XM and reference beam 223XR are made incident from the X-axis laser interferometer 220X on the mirror 224x and reference mirror 223X respectively, at prescribed intervals in the Z direction. The laser interferometer 220X measures the X-coordinate of the wafer stage 224, taking as reference the reference mirror 223X.

A measurement beam 222AM and reference beam 222AR are made incident from the laser interferometer 220A on the mirror 224x and reference mirror 222 respectively, at prescribed intervals in the Z direction. The laser interferometer 220A measures the X-coordinate of the wafer stage 224, taking as reference the reference mirror 222. Similarly, a measurement beam 222YM and reference beam 222YR are made incident from the laser interferometer 220Y on the mirror 224y and reference mirror 223Y respectively, at prescribed intervals in the Z direction. The laser interferometer 220Y measures the Y-coordinate of the wafer stage 224, taking as reference the reference mirror 223Y.

The optical axis of the Y-axis measurement beam 223YM for the wafer stage 224 is positioned on a straight line which passes through the optical axis AX and the detection center of the alignment sensor 213; the optical axis of the X-axis measurement beam 223XM is positioned on a straight line passing through the optical axis AX and parallel to the X-axis. The X-axis measurement beam 222AM is positioned to pass through the detection center of the alignment sensor 213, on a straight line parallel to the X-axis. As a result, by using the measurement values of the laser interferometer 220X during exposure, and using the measurement values of the laser interferometer 220A during alignment; even if rotation of the wafer stage 224 about the Z-axis (yawing) occurs, the X-coordinate of the wafer stage 224 can be measured with high precision while suppressing the occurrence of Abbe errors.

The measurement beam 223YM consists for example of two measurement beams positioned at prescribed intervals in the X direction; from the difference in the Y-coordinates measured by these measurement beams, the rotation angle about the Z-axis (yawing) of the wafer stage 224 is determined.

As indicated in FIG. 21(b), the heights of the measurement beams 223XM and 223AM (similarly for the measurement beam 223YM also) are shifted downward from the surface of the wafer 218, so that if rotation of the wafer stage 218 about the Y-axis (rolling) or rotation of the wafer stage 218 about the X-axis (pitching) occurs, Abbe errors are included in the measurement values for the X-coordinate and Y-coordinate. In order to correct for these Abbe errors, in actuality the measurement beams 223XM, 222AM, 223YM are each separated into two measurement beams, removed in the Z direction; and from the differences in the coordinates measured using these two measurement beams, the amounts of rolling and pitching are measured.

As shown in FIG. 21, AF sensors 212, 211 and an alignment sensor 213 are positioned on the side of the projection optical system 209, and the working distance of the projection optical system 209 is considerably short, so that if blowing temperature-controlled gas from the side only, it is difficult to maintain the temperatures in the in optical paths of the measurement beams and reference beams of the laser interferometers 220X, 220A, 220Y, and the temperature of the exposure area IFW on the wafer 218, within the tolerance range of the target temperatures. Further, if fluctuations in temperature occur in the optical paths of the measurement beams or reference beams, errors may occur in the measurement values. Hence in this example, a partial air-conditioning mechanism is installed on the side of the wafer stage 224 also.

FIG. 22($a$) is a plane view showing the positioning of partial air-conditioning mechanisms 215, 216 in FIG. 21($a$). FIG. 22($b$) is a front view of a cross-section along line BB of part of the members of FIG. 22($a$). In FIG. 22($a$), the blower mechanism 215 and exhaust mechanism 216 are positioned so as to surround the projection optical system 209. The blower mechanism 215 comprises a box-shape guide member 287; pipe 288 which transfers gas A2 which has been temperature-controlled from an outside air-conditioning device, not shown, and which has had dust removed by an HEPA filter and chemical filter; branch unit 286 positioned within the guide member 287; Y-axis blower unit 286$y$; and X-axis blower unit 286$x$. As the temperature-controlled gas A2, in this example dry air with the ozone removed is used; but nitrogen gas, helium gas or similar may also be used.

The branch unit 286 divides the gas A2 supplied via the pipe 288 among the blower units 286$x$ and 286$y$. The Y-axis blower unit 286$y$ is housed within a blower path 287$c$ extending in the direction of the Y-axis reference mirror 223Y within the guide member 287. With respect to the blower path 287$c$, the wafer stage 224 is installed at a height such that even if the wafer stage 224 moves in two dimensions on the wafer base 217 there is no contact, and so the blower outlet 287 y is formed facing downward diagonally. The blower unit 286$y$ blows gas sent from the branch unit 286 diagonally downward via the blower path 287$c$ from the blower outlet 287$y$, as shown by the arrows Ay1 and Ay2. The gas indicated by the arrow Ay1 is supplied to the optical path of the Y-axis reference beam 223YR and measurement beam 223YM in FIG. 21, and the gas indicated by the arrow Ay2 is supplied to the exposure area IFW of the projection optical system 209 on the wafer 218.

An aperture allowing the passage of the measurement beams and reference beams of the X-axis laser interferometers 220X, 220A of FIG. 21 is provided in part of the X-axis blower unit 286$x$. In part of the guide member 287 is provided a cylindrical blower path 287, so as to cover the forward directions of the X-axis reference mirrors 223X and 222; the tip part of the blower path 287$b$ is extended in steplike fashion to the tip side of the projection optical system 209, as shown in FIG. 22($b$), leading to the blower outlet 287$a$. The blower path 287$b$ is also positioned at a height so as not to make contact with the wafer stage 224 even if the wafer stage 224 moves in two dimensions. An X-axis blower outlet 287$x$ is formed on the bottom side of the guide member 287, in the part opposing the side of the wafer stage 224.

The X-axis blower unit 286$x$ of FIG. 22($b$) blows temperature-controlled gas from the blower outlet 287$x$, as indicated by the arrow Ax2, toward the side of the wafer stage 224, which moves in two dimensions on the wafer base 207. This gas is supplied to the optical paths of the measurement beams 223XM, 222AM of FIG. 21. The blower unit 286$x$ also supplies temperature-controlled gas to the optical paths of the reference beams incident on the reference mirrors 223X and 222 within the blower path 287$b$, as indicated by the arrows Ax1 and Ax3. Here the blower path 287$b$ passes along the bottom face of the reference mirror 223X and the side of the tip part of the projection optical system 209 to lead to the blower outlet 287$a$, so that gas passing along the bottom of the reference mirror 223X along the arrow Ax1 is blown out from the blower outlet 287$a$ onto the exposure area IFW, as indicated by the arrow Ax4. By this means, even if the AF sensors 212$a$, 211$a$, 212$b$, 211$b$ and alignment sensor 213 are installed, and even if the working distance of the projection optical system 209 is short, temperature-controlled gas can be blown directly onto the exposure area IFW, and the temperature of the wafer 218 in the exposure area IFW can be precisely controlled at the target temperature. As a result, magnification errors in the pattern transferred onto the wafer are extremely small, control over line widths and other parameters is improved, and in overlap exposure the overlap precision is improved.

The exhaust mechanism 216 is, together with the blower mechanism 215, positioned so as to enclose the projection optical system 209, and opposes the blower mechanism 215. As shown in FIG. 22($a$), the exhaust mechanism is divided into an exhaust unit 289A facing the side of the blower path 287$c$, and an exhaust unit 289B facing the –X direction. Gas passing through the environs of the wafer stage 224 and flowing into the exhaust units 289A, 289B passes through the pipes 290A, 290B and is returned, as gas A3 and A4, to the air-conditioning device, not shown. By using an exhaust mechanism 216 arranged in this way, there is the advantage that turbulence does not occur in gas passing through the environs of the wafer stage 224.

The wafer stage 224 of FIG. 22 moves continuously in the Y direction during scanning exposure, and gas from the blower mechanism 215 is blown in a non-scanning direction (the X direction) essentially perpendicular to the scanning direction, so that almost no fluctuations occur in the gas on the side of the mirror 224$y$ (FIG. 21($a$)) in the Y direction of the wafer stage 224. Hence the Y-coordinate of the wafer stage 224 can be measured with high precision during scanning exposure, and so synchronization errors between the wafer 218 and reticle 208 can be reduced.

In this example, the illumination optical system in FIG. 19 is separated into a first illumination system unit 203 and a second illumination system unit 204, and the second illumination system unit 204 is fixed to the exposure main unit 300, so that even if comparatively high-frequency vibrations occur between the exposure main unit 300 and the support 202, there is no change in the illumination area on the reticle 208, and the pattern image of the reticle 208 can be transferred with high precision onto the wafer 218. However, low-frequency vibrations such as axial shifts with time in the exposure light IL1 (laser beam) emitted from the exposure light source 250 may be corrected using the optical axis adjustment mechanism 234. By this means, the tolerance for vibrations occurring during exposure can be increased. The interior of the projection optical system 209 may also be purged with the gas described above, and the partial air-conditioning mechanism 237 shown in FIG. 20(b) provided on the wafer side also, with the wafer stage 224 positioned therein. The above-described gas may also be only blown between the first illumination system unit 203 and the second illumination system unit 204, between the second illumination system unit 204 and the partial air-conditioning mechanism 237, between the partial air-conditioning mechanism 237 and the projection optical system 209, and between the projection optical system 209 and the wafer stage 224 (or the partial air-conditioning mechanism); or, these spaces may be sealed, and the space purged with the above-described gas.

Figure 23:
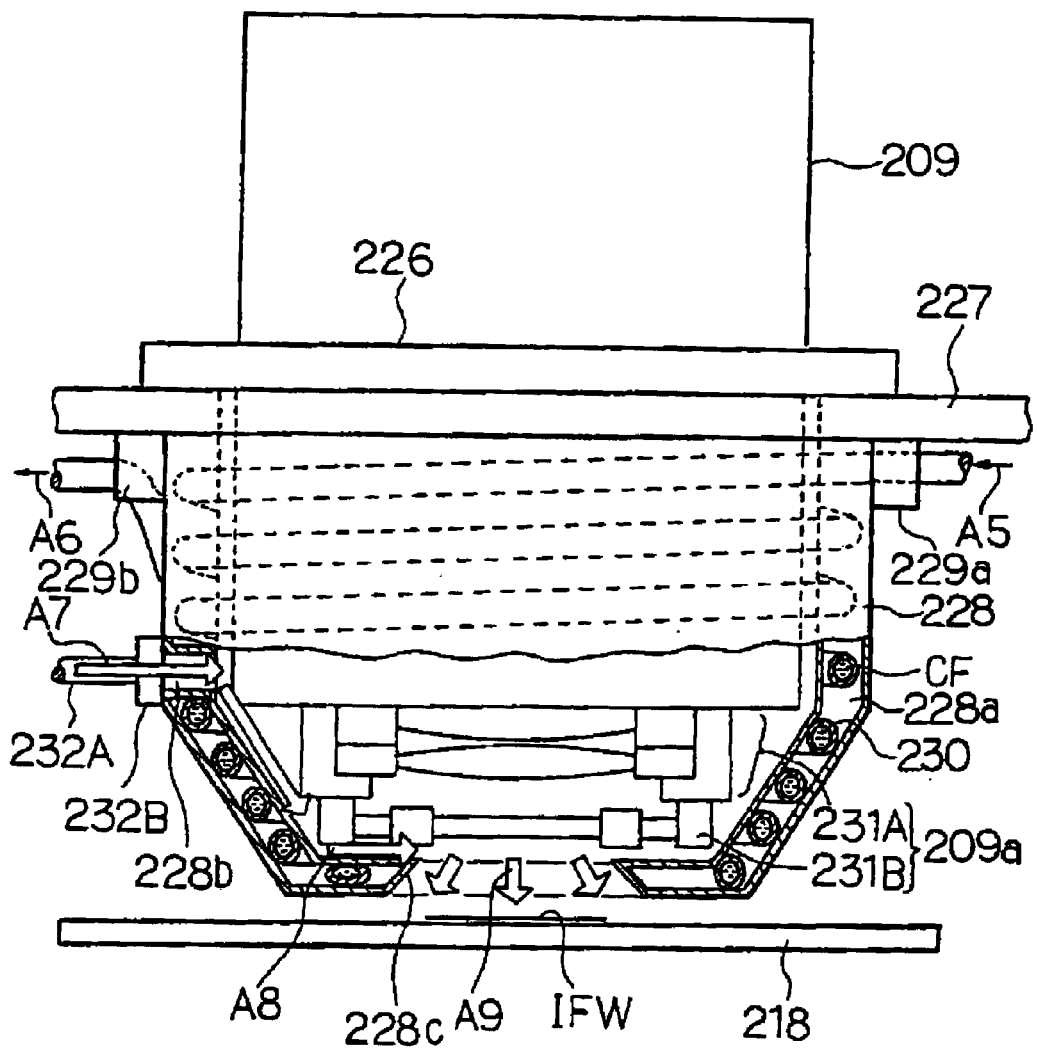
FIG. 23 is a partial cutout front view showing the projection optical system and wafer in another example of an aspect of this invention; and, FIG. 24 is a schematic view showing a conventional projection exposure apparatus comprising an air-conditioning mechanism.
Figure 24:
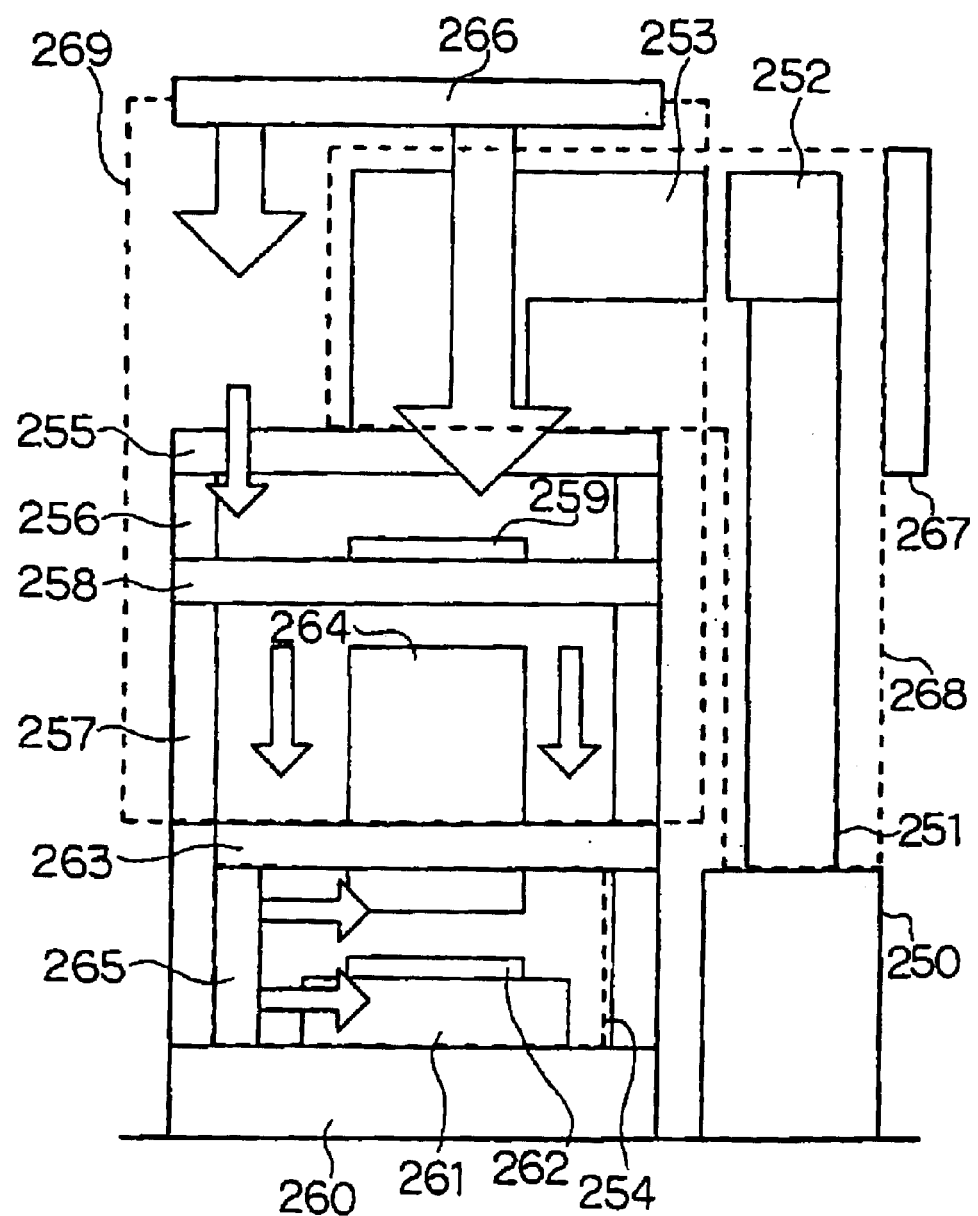

Next, another example of an aspect of this invention is explained, referring to FIG. 23. In this example, the mechanism for blowing temperature-controlled gas onto the exposure area on the wafer is changed from that of the above aspect. In FIG. 23, components corresponding to those in FIG. 19 are assigned the same symbols, and detailed explanations are omitted.

FIG. 23 is a partial cutout view showing the projection optical system 209 and wafer 218 of this example. In FIG. 23, the projection optical system 209 is held within an aperture provided in the support member 227 via a flange 226. A cylindrical retaining member 228 is installed on the bottom face of the support member 227, so as to cover the lower sides and tip part of the projection optical system 209. A gap is provided between this retaining member 228 and the projection optical system 209. In the bottom face of the retaining member 228 is formed an aperture 228c through which exposure light which has passed through the projection optical system 209 passes; exposure light which has passed through the aperture 228c illuminates the exposure area IFW on the wafer 218. The interior of the retaining member 228 is hollowed out through the use of numerous ribs, not shown, and the AF sensors 212, 211 and alignment sensor 213 are installed on the outer face of the retaining member 228. By means of this configuration, no load is born by the mirrors or similar of the projection optical system 209, with the advantage that lens aberrations are not increased.

The tip part 209a of the projection optical system of this example comprises a focusing characteristic correction unit 231B, comprising a lens frame 231A to hold small-diameter lenses, and movable parallel flat plates to correct astigmatism (or coma aberration) or similar when employing modified illumination. A hollow blower guide 232A is connected, via a fastener 232B, to the aperture 228b provided in a side face of the retaining member 228; the blower guide 232A is connected to an air-conditioning device, not shown. Air or other gas subjected to dust removal and temperature control within this air-conditioning device passes through the blower guide 232A, fastener 232B, and the aperture 228b of the retaining member 228, as indicated by the arrow A7, to be supplied to the space between the retaining member 228 and the projection optical system 209. Gas supplied in this way, after flowing in the environs of the tip part 209a as indicated by the arrow A8, passes through the aperture 228c of the retaining member 228, as indicated by the arrow A9, and is blown onto the exposure area IFW on the wafer 218. Gas blown onto the wafer 218 is then returned to the above air-conditioning device via an exhaust mechanism, not shown.

In the interior 228a of the retaining member 228 of this example is coiled a helical-shape transport pipe 230. Temperature-controlled coolant CF, supplied from a liquid supply device, not shown, in the direction of the arrow A5 and passing through a temperature-adjustment unit 229a at the bottom of the support member 227, is supplied to the inlet of this transport pipe 230. As this coolant CF, for example, an inert fluoride liquid can be used; as one example, Fluorinert (a brand name of U.S. 3M Corp.) can be used. Pure water can also be used as the coolant CF.

Coolant CF passing through the interior of the transport pipe 230 and flowing outside the projection optical system 209 passes from the outlet of the transport pipe 230 through a temperature detection unit 229b in the bottom of the support member 227, and is returned to the liquid supply device along the direction indicated by the arrow A6. Because rough temperature control is performed within this liquid supply device, the temperature adjustment unit 229a need only perform fine adjustment of the temperature of the coolant CF, for example so that the temperature detected by the temperature detection unit 229b approaches a target temperature.

As described above, in this example temperature-controlled gas is blown directly onto the exposure area IFW of the wafer 218 after passing through the space between the projection optical system 209 and retaining member 228, so that even if various sensors are installed in the vicinity of the projection optical system 209, and even when the working distance of the projection optical system 209 is short, the temperature of the wafer 218, including the exposure area IFW, can be accurately maintained near the target temperature.

Because temperature-controlled coolant is flowing on the side of the projection optical system 209, there is no rise in the temperature of the projection optical system 209 or wafer 218 even if various sensors, which to some extent are heat sources, are mounted outside the retaining member 228. In addition, flat parallel plates may be provided nearer the wafer 218 than the movable flat parallel plates shown in FIG. 23, and the flat parallel plates exchanged if the decline in transmissivity of illumination light due to adhesion of material caused by resist or other factors exceeds a tolerance value.

In the second aspect (FIG. 19, FIG. 23), the temperature of the gas used in the above-described purging is controlled; the pressure and humidity of the gas may be controlled as well, and the AF sensors 211, 212 may be single-axis instead of two-axis.

Figure 20:
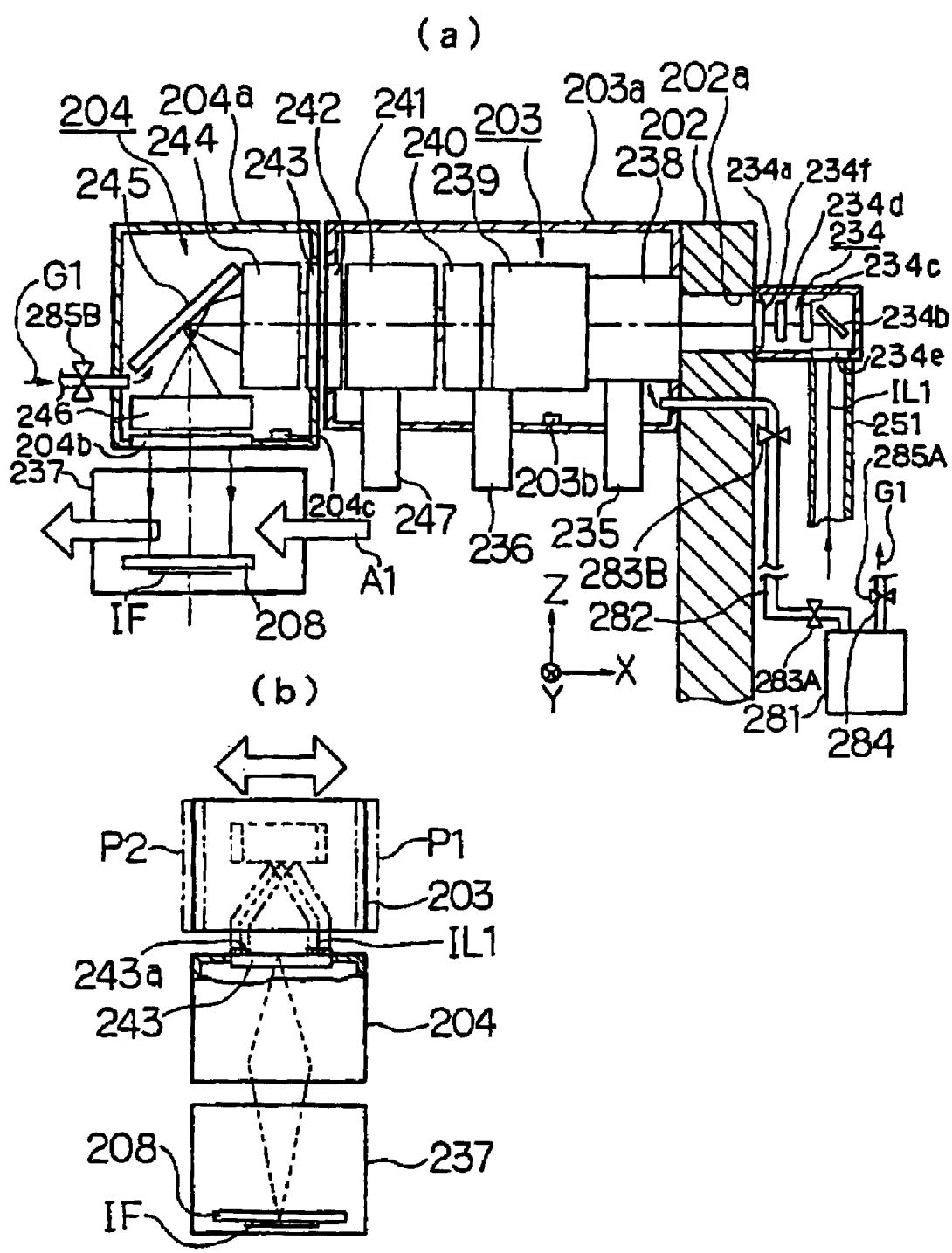
FIG. 20($a$) is a partial cutout schematic view showing the optical system of the projection exposure apparatus of FIG. 19, from the exposure light source to the exposure main unit.

The AF sensors used in the above-described aspects are not limited to synchronous-detection type sensors; for example, an AF beam reflected by the wafer may be guided to a line sensor, and based on the pixels of the sensor, the above-described focus position may be detected. Moreover, the illumination optical systems shown in FIG. 1 and FIG. 20 are no more than examples, and the configuration of this invention is not thereby limited. Also, in FIG. 20 the illumination optical system is divided into a first and a second illumination system unit; but a single illumination system unit may be used, or this may be divided into three or more illumination system units.

Examples of modifications explained in the above first and second aspects may each be adopted in the other aspect.

In the above aspect, this invention is applied to a step-and-scan type projection exposure apparatus; but this invention can also be applied to a batch-exposure type projection exposure apparatus such as steppers, as well as to a proximity exposure apparatus, and also to a step-and-switch type exposure apparatus and similar. This invention can be applied to the exposure apparatus used not only in the manufacture of semiconductor devices, liquid crystal display elements, image-capture elements, thin film magnetic heads and similar, but also of display devices (plasma displays and similar), photomasks (reticles) and other items.

When using excimer laser light or other far-ultraviolet light as the illumination light for exposure, quartz ($SiO_2$) and fluorite ($CaF_2$) or other material that transmits far-ultraviolet light is used as the vitreous material of the projection optical system and other components. Further, the magnification of the projection optical system is not limited to reduction, but may be a 1:1 or enlargement system as well.

The projection optical system may be a refractive system, reflective system, or a catadioptric system combining refractive lenses, concave mirrors and other reflective optical elements. As a catadioptric system, an optical system may be used in which a plurality of refractive optical elements and two reflective optical elements (at least one of which is a concave mirror) are positioned on the optical axis, extending in a straight line without bending.

Single-wavelength laser light in the infrared or visible ranges emitted from a DFB semiconductor laser or fiber laser as the illumination light for exposure may be amplified by a fiber amplifier doped with erbium (Er) (or with both erbium and ytterbium (Yb)), and a nonlinear optical crystal used to convert the wavelength to the ultraviolet for use as higher-frequency light. For example, if the oscillation wavelength of a single-wavelength laser is in the range from 1.544 to 1.553 $\mu$m, then ultraviolet light at a frequency eight times this in the wavelength range 193 to 194 nm, that is, nearly equal to the wavelength of ArF excimer laser light, is obtained; if the oscillation wavelength is in the range 1.57 to 1.58 $\mu$m, then ultraviolet light at a frequency ten times higher, in the wavelength range 157 to 158 nm and nearly equal to the wavelength of an $F_2$ laser, is obtained.

The projection exposure apparatus of the above aspect may be assembled by adjusting the illumination optical systems and projection optical system, and by linking the component elements electrically, mechanically or optically. Here it is desirable that operations be performed in a cleanroom in which the temperature is controlled. Wafers which have been subjected to exposure as described above are further subjected to development, pattern formation, bonding and other processes to manufacture semiconductor elements or other devices.

This invention is not limited to the above aspects, and various configurations which do not deviate from the essence of this invention may be employed. Moreover, all the contents disclosed in the specifications, scope of claims, drawings, and abstracts contained in Japanese Patent Application No.10-327651 filed on Nov. 18, 1998, and in Japanese Patent Application No.10-366513 filed on Dec. 24, 1998, are cited and entirely incorporated herein by reference.

INDUSTRIAL APPLICABILITY

By means of the first exposure method of this invention, by comparing measurement values for measurement points common to a first and a second focus position detection system, drift and other errors in the measurement values of the focus position detection systems can be determined and corrected. Hence there is the advantage that the defocusing amount of the image plane of the projection optical system from the surface of the substrate for exposure can be detected with high precision even during exposure, without greatly lowering throughput.

Further, the image plane of the projection optical system can be aligned with (focused on) the surface of the substrate for exposure without greatly lowering throughput, and the substrate can be exposed to the image of a mask pattern.

When a third focus position detection system is also used to detect the state of focus of the mask image on the substrate by detecting a prescribed mark via the projection optical system, as in the TTR method, the frequency of use of this focus position detection system can be reduced, and focusing precision can be raised. Also, by means of the first exposure apparatus of this invention, the first exposure method of this invention can be used.

In the second exposure method or the second exposure apparatus of this invention, a second illumination system is fixed to the exposure main unit, and the first illumination system is supported independently of the exposure main unit, so that the optical system from the exposure light source to the exposure main unit can be separated midway, and there is also the advantage that the overall airtightness of the optical path of the exposure beam (exposure light) in the optical system can be raised. Hence when purging these first and second illumination systems with transmissive gas, the gas can be used efficiently.

When supplying temperature-controlled gas to the pattern formation face of the mask, substantially in parallel with the mask, the temperature of the mask can be controlled with high precision even if illumination systems, support members, and similar are installed.

The third exposure apparatus of this invention comprises a temperature control device having blower outlets for the optical paths of measurement beams and for the substrate, so that when using an interferometer to measure the position of the substrate stage (wafer stage), there is the advantage that the temperature of the optical path of the interferometer measurement beam, and the temperature of the substrate for exposure, can be controlled near a target temperature with high precision.

In the fourth exposure apparatus of this invention, temperature-controlled gas is supplied to the substrate via the space between the side of the projection optical system and a retaining member, so that there is the advantage that the temperature of the substrate for exposure can be precisely controlled, even when using a projection optical system with a short working distance. By supplying temperature-controlled coolant to the interior of this retaining member, increases in the temperature of the projection optical system and substrate can be prevented, even when heat is generated by various sensors or similar installed on the retaining member.

The first method of device manufacture of this invention has the advantage of enabling the manufacture of devices with high precision using the exposure methods of this invention.

By means of the third exposure method of this invention, errors in substrate position information can be determined with hardly any reduction in throughput, and the surface of the substrate can be precisely aligned with the image plane of the projection optical system, and the substrate exposed to the image of the mask pattern. By means of the fifth exposure apparatus of this invention, the third exposure method of this invention can be used. And by means of the second device manufacturing method of this invention, the fifth exposure apparatus of this invention can be used to manufacture devices with high precision.

What is claimed is:

1. An exposure apparatus, having an exposure light source which generates an exposure beam and an exposure main unit which holds a mask and a substrate, and in which the exposure beam is used to transfer a pattern of the mask onto the substrate, the exposure apparatus comprising:
- a first illumination system, supported independently from the exposure main unit, which transmits the exposure beam from the exposure light source; and
- a second illumination system, fixed to the exposure main unit, which guides the exposure beam emitted from the first illumination system to the exposure main unit,
- wherein a mask blind is disposed in a boundary portion of the first illumination system and the second illumination system.

2. The exposure apparatus according to claim 1, wherein the optical paths of the exposure beam within the first illumination system and the second illumination system are each substantially sealed, and gas transmissive with respect to the exposure beam is independently supplied to the sealed first and second optical paths.

3. The exposure apparatus according to claim 1, wherein a plane of incidence of the exposure beam emitted from the first illumination system on the second illumination system is conjugate with respect to a pattern formation face of the mask, and a field stop is positioned in the plane of incidence.

4. A method for manufacturing an exposure apparatus, comprising the steps of:
- providing an exposure light source which generates an exposure beam;
- providing an exposure main unit which holds a mask and a substrate;
- providing a first illumination system, supported independently from the exposure main unit, which transmits the exposure beam from the exposure light source;
- providing a second illumination system, fixed to the exposure main unit, which guides the exposure beam emitted from the first illumination system to the exposure main unit; and
- providing a mask blind at a boundary portion of the first and second illumination systems.

5. A device manufacture method comprising a process to transfer the pattern of a mask onto a substrate by using the exposure apparatus of claim 1.

6. The exposure apparatus according to claim 1, wherein the first illumination system comprises an optical member having a driving mechanism.

7. The exposure apparatus according to claim 6, wherein the second illumination system comprises an optical member not having a driving mechanism.

8. The exposure apparatus according to claim 6, wherein the driving mechanism is provided to enable variation of an illumination shape or an illumination intensity of the exposure beam illuminating the mask.

9. The exposure apparatus according to claim 6, wherein the optical member having the driving mechanism includes a movable blind enabling changes to the illumination range of the mask by the exposure beam.

10. The exposure apparatus according to claim 9, wherein the mask blind has a fixed blind to fix the illumination range of the mask by the exposure beam, and the fixed blind is provided in the first illumination system.

11. The exposure apparatus according to claim 6, wherein the optical member having a driving mechanism includes an attenuator which attenuates the exposure beam.

12. The exposure apparatus according to claim 1, wherein the exposure main unit has a first support member to support a projection system which projects an image of the pattern of the mask onto the substrate, and the second illumination system is fixed to the first support member, and the first illumination system is supported by a second support member independent of the first support member.

13. The exposure apparatus according to claim 12, wherein the exposure light source is positioned independently of the first support member and of the second support member.

14. The exposure apparatus according to claim 12, wherein the first support member and the second support member are each positioned on a base, and the exposure light source is positioned independently of the base.

15. The method according to claim 4, wherein the first illumination system comprises an optical member having a driving mechanism which is a source of vibrations, and the second illumination system comprises an optical member not having a driving mechanism which is a source of vibrations.

16. An exposure apparatus, having an exposure light source which generates an exposure beam and a first support member which supports a projection system which projects an image of a pattern of a mask onto a substrate, and in which the exposure beam is used to transfer the pattern of the mask onto the substrate;

the exposure apparatus comprising:
- an illumination system which guides the exposure beam from the exposure light source to the mask and which has a plurality of movable optical members each having a driving mechanism; and
- a second support member which supports all of the movable optical members of the illumination system, independently of the first support member so as not to become a source of vibrations for the first support member.

17. The exposure apparatus according to claim 16, wherein
- the illumination system has a first illumination system which includes the optical member having the driving mechanism and a second illumination system which does not include any optical members having driving mechanisms, and
- the second illumination system is fixed to the first support member.

18. The exposure apparatus according to claim 16, wherein the driving mechanism is provided to enable variation of one of an illumination shape and an illumination intensity of the exposure beam illuminating the mask.

19. The exposure apparatus according to claim 16, wherein the first support member and the second support member are positioned on a base.

20. The exposure apparatus according to claim 16, wherein the exposure light source is positioned independently of the first support member and of the second support member.

21. An exposure apparatus which transfer a pattern of a mask onto a substrate, using an exposure beam generated by an exposure light source, the apparatus comprising:
- a first illumination system, supported independently from an exposure main unit which holds the mask and the substrate, and which transmits the exposure beam from the exposure light source;
- a second illumination system which is fixed to the exposure main unit, and which guides the exposure beam emitted from the first illumination system to the exposure main unit;
- a movable mask blind which is disposed in an emitting plane of the first illumination system, and which enables changes to an illumination range of the mask by the exposure beam; and a fixed blind which is disposed in an incidence plane of the second illumination system, and which fixes the illumination range of the mask by the exposure beam.

22. The exposure apparatus according to claim 21, further comprising a supply device which supplies gas, transmissive with respect to the exposure beam, to a sealed optical path of the first and second illumination systems.

23. The exposure apparatus according to claim 21, further comprising a first support member which supports 9 projection system which projects the image of the pattern of the mask onto the substrate; and wherein the first illumination system is supported by a second support member independent from the first support member, and the second illumination system is fixed to the first support member.

24. The exposure apparatus according to claim 23, wherein the first support member and the second support member are positioned on a base.

25. The exposure apparatus according to claim 23, wherein the exposure light source is positioned independently of the first support member and the second support member.

26. An exposure method in which an image of a pattern of a mask is transferred onto a substrate via a projection optical system supported by a first supporting member, using the exposure beam which is generated from an exposure light source, the exposure method comprising the steps of:

guiding the exposure beam from the exposure light source to the mask via an illumination system which has a plurality of movable optical elements each having a driving mechanism which is a source of vibrations;

supporting all of the movable optical elements of the illumination system independently from the first support member; and driving the driving mechanism without transmitting the vibrations to the first support member.

27. The exposure method according to claim 26, wherein the driving mechanism is provided to drive the optical elements to change the illumination conditions of the mask by the exposure beam.

28. The exposure method according to claim 26, wherein an optical path within the illumination system containing the optical elements having the driving mechanism which is a source of vibration is substantially sealed, and a gas which is transmissive with respect to the exposure beam is supplied to the illumination system.

29. A device manufacturing method comprising a process in which the pattern of a mask is transferred to a substrate, using the exposure apparatus of claim 16.

30. A device manufacturing method comprising a process in which the pattern of a mask is transferred to a substrate using the exposure method of claim 26.

* * * * *